(12) United States Patent
Hyodo et al.

(10) Patent No.: US 10,726,911 B2
(45) Date of Patent: Jul. 28, 2020

(54) MEMORY SYSTEM

(71) Applicant: Toshiba Memory Corporation, Minato-ku (JP)

(72) Inventors: Kuminori Hyodo, Kawasaki (JP); Kenji Sakurada, Yamato (JP); Masanobu Shirakawa, Chigasaki (JP); Hideki Yamada, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 94 days.

(21) Appl. No.: 16/120,827

(22) Filed: Sep. 4, 2018

(65) Prior Publication Data

US 2019/0295634 A1    Sep. 26, 2019

(30) Foreign Application Priority Data

Mar. 22, 2018  (JP) ................................ 2018-053846

(51) Int. Cl.
  *G11C 11/56*    (2006.01)
  *G11C 16/04*    (2006.01)
  (Continued)

(52) U.S. Cl.
  CPC ...... *G11C 11/5628* (2013.01); *G06F 12/0246* (2013.01); *G11C 11/5642* (2013.01); *G11C 11/5671* (2013.01); *G11C 16/0483* (2013.01); *G11C 16/10* (2013.01); *G11C 16/26* (2013.01); *G11C 16/3459* (2013.01); *G06F 2212/2022* (2013.01); *G11C 16/08* (2013.01); *H01L 27/1157* (2013.01); *H01L 27/11519* (2013.01);
  (Continued)

(58) Field of Classification Search
  CPC ............ G11C 11/5628; G11C 11/5642; G11C 11/5671; G11C 16/0483; G11C 16/10; G06F 12/00; G06F 13/00
  USPC ........................................ 711/100, 154, 200
  See application file for complete search history.

(56) References Cited

U.S. PATENT DOCUMENTS

2010/0149870 A1    6/2010  Shirota
2012/0039132 A1*   2/2012  Min .................... G11C 13/0004
                                                365/189.04

(Continued)

FOREIGN PATENT DOCUMENTS

JP            3898349       3/2007
JP         2010-134992      6/2010
                (Continued)

*Primary Examiner* — Tuan V Thai
(74) *Attorney, Agent, or Firm* — Oblon, McClelland, Maier & Neustadt, L.L.P.

(57) ABSTRACT

A memory system according to an embodiment includes a semiconductor memory and a memory controller. The semiconductor memory includes memory cells and a sequencer. Each of the memory cells stores first data when it has a first threshold voltage, and stores second data when it has a second threshold voltage. The sequencer performs a first write operation for write data. In the first write operation, the sequencer executes a program loop repeatedly and terminates the first write operation, when the verify operation for the first data has passed and the verify operation for the second data has not passed. The sequencer performs a second write operation for the write data based on a first command from the memory controller after the first write operation is terminated.

18 Claims, 42 Drawing Sheets

(51) Int. Cl.
  *G11C 16/10*    (2006.01)
  *G11C 16/34*    (2006.01)
  *G06F 12/02*    (2006.01)
  *G11C 16/26*    (2006.01)
  *H01L 27/11519* (2017.01)
  *H01L 27/11565* (2017.01)
  *H01L 27/11524* (2017.01)
  *H01L 27/1157*  (2017.01)
  *G11C 16/08*    (2006.01)

(52) U.S. Cl.
  CPC ... *H01L 27/11524* (2013.01); *H01L 27/11565* (2013.01)

(56) References Cited

U.S. PATENT DOCUMENTS

| | | | |
|---|---|---|---|
| 2016/0078949 A1 | 3/2016 | Abe et al. | |
| 2017/0160952 A1* | 6/2017 | Nakanishi | G06F 3/0679 |
| 2017/0243609 A1* | 8/2017 | Zhu | G11B 5/59627 |
| 2019/0073294 A1* | 3/2019 | Kim | G11C 16/0483 |
| 2019/0088313 A1* | 3/2019 | Kondo | G11C 16/34 |

FOREIGN PATENT DOCUMENTS

| | | |
|---|---|---|
| JP | 5467938 | 4/2014 |
| JP | 2016-062624 | 4/2016 |

\* cited by examiner

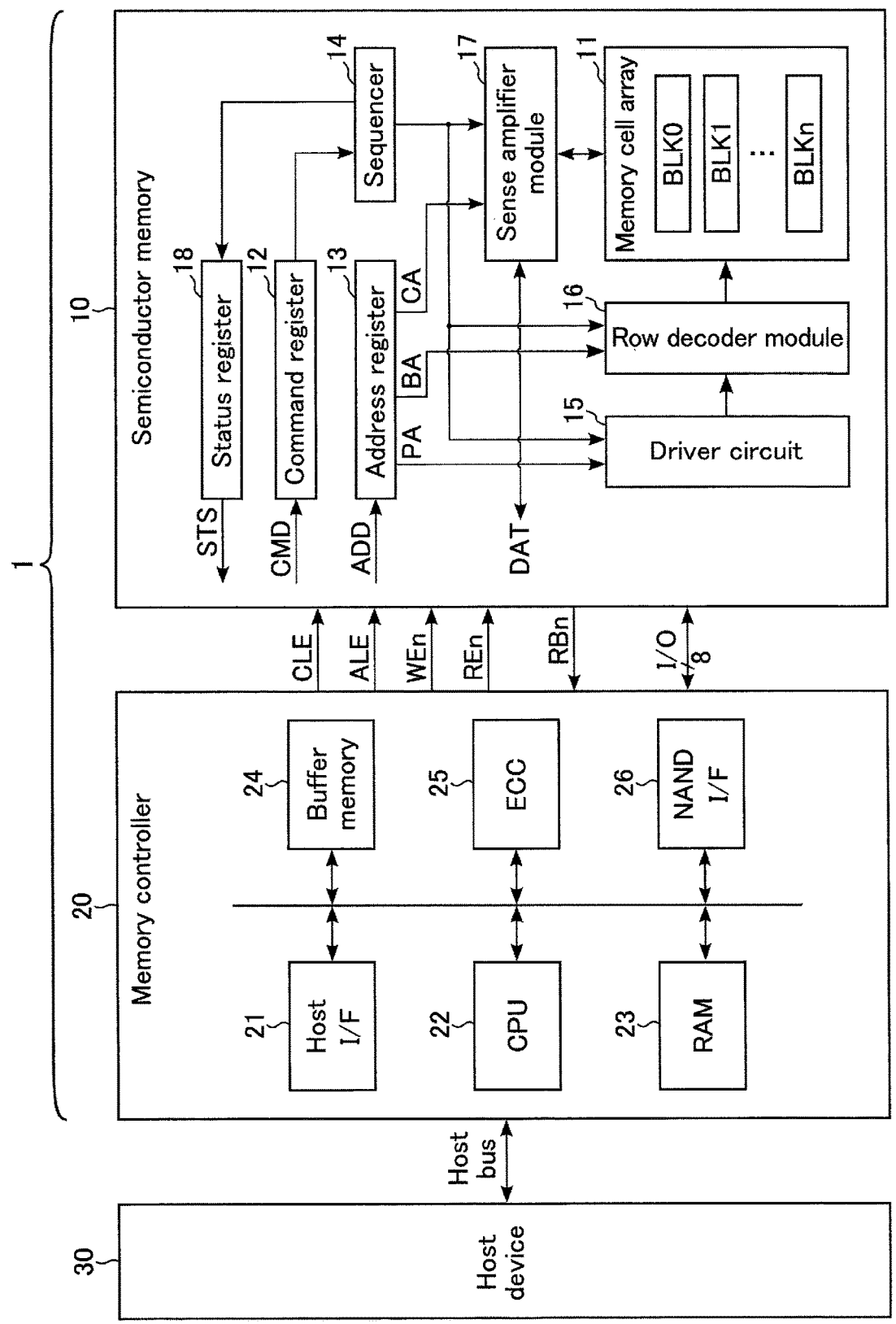
F I G. 1

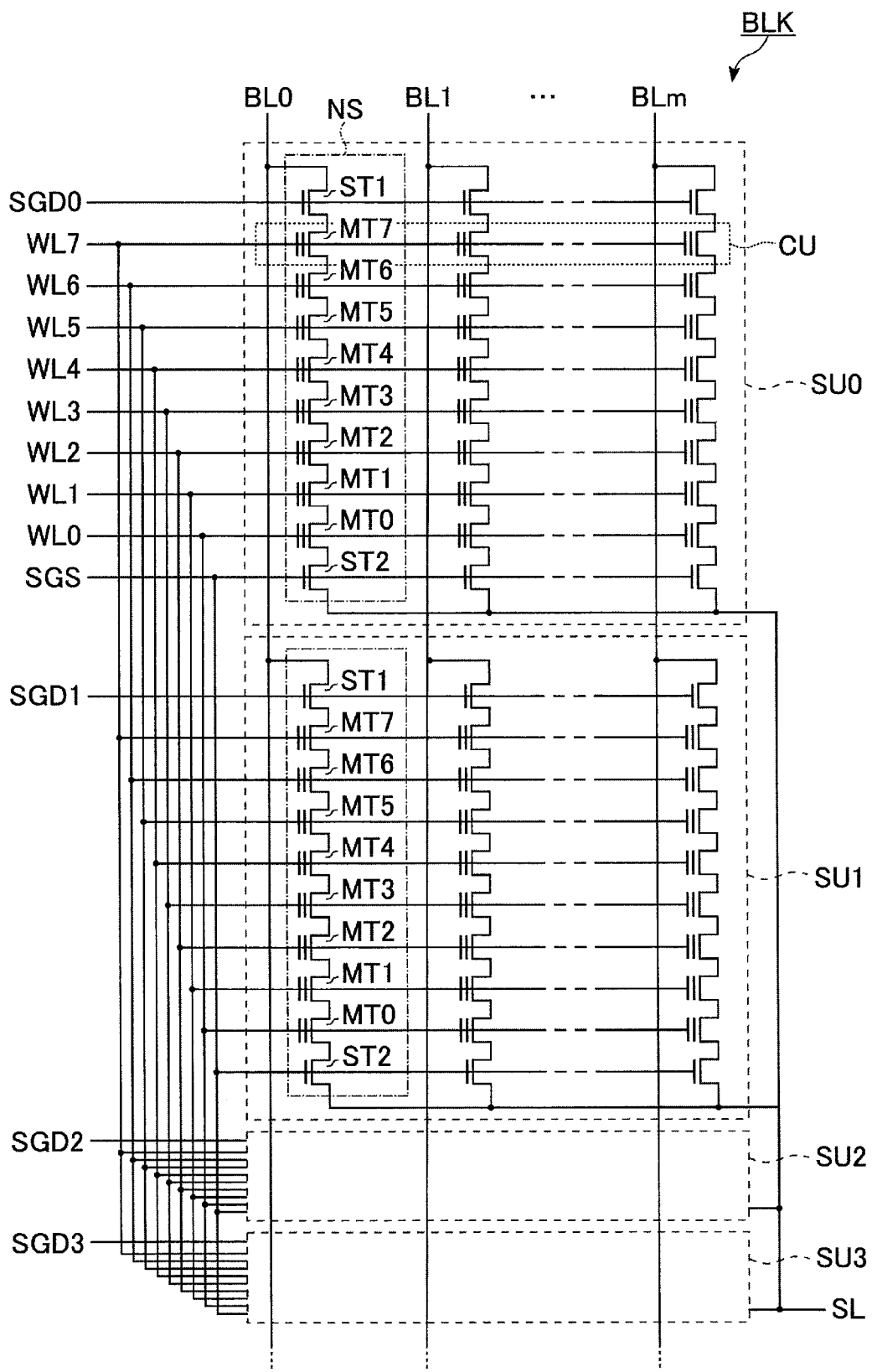
F I G. 2

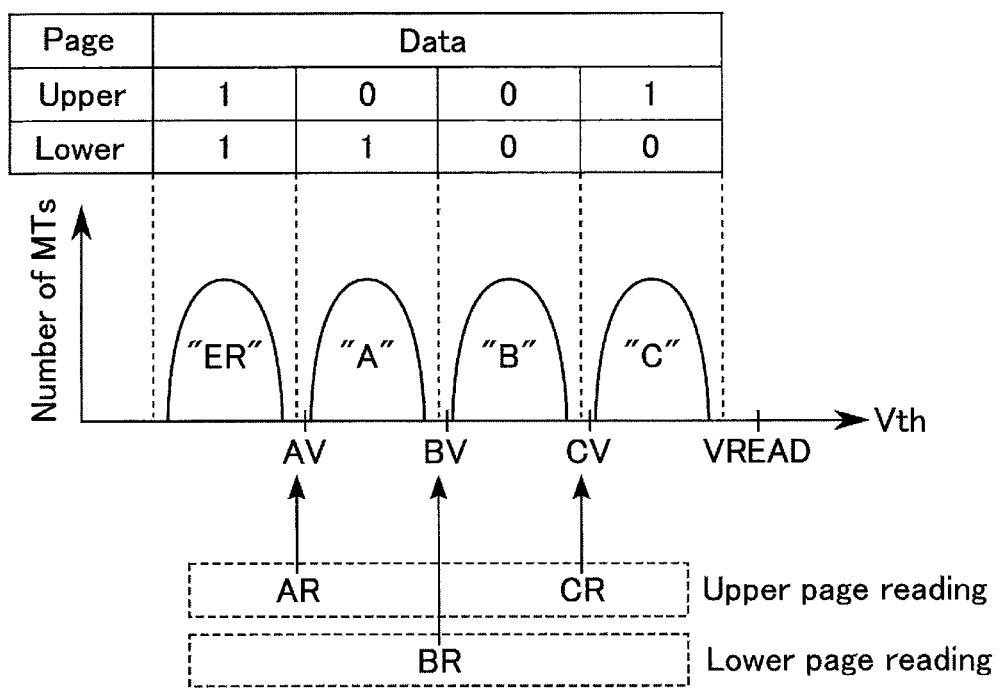
F I G. 3

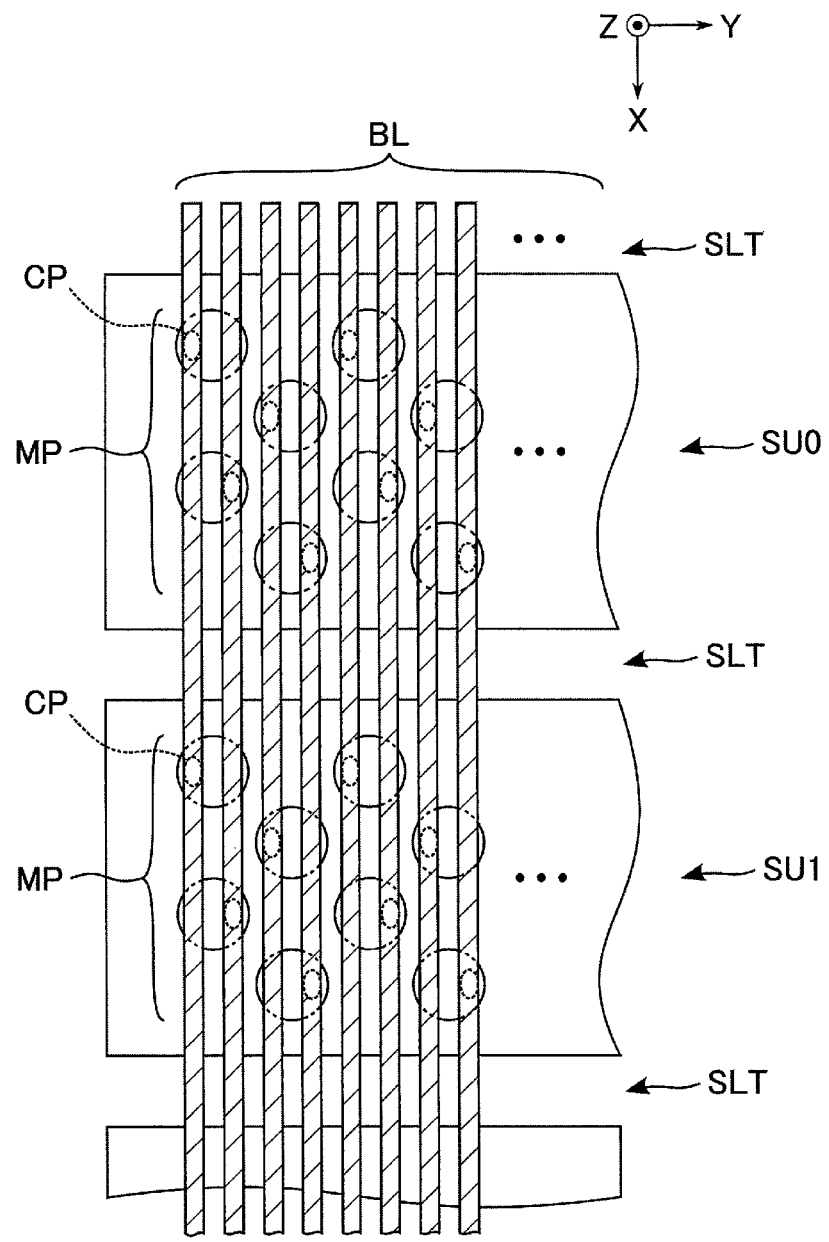
F I G. 4

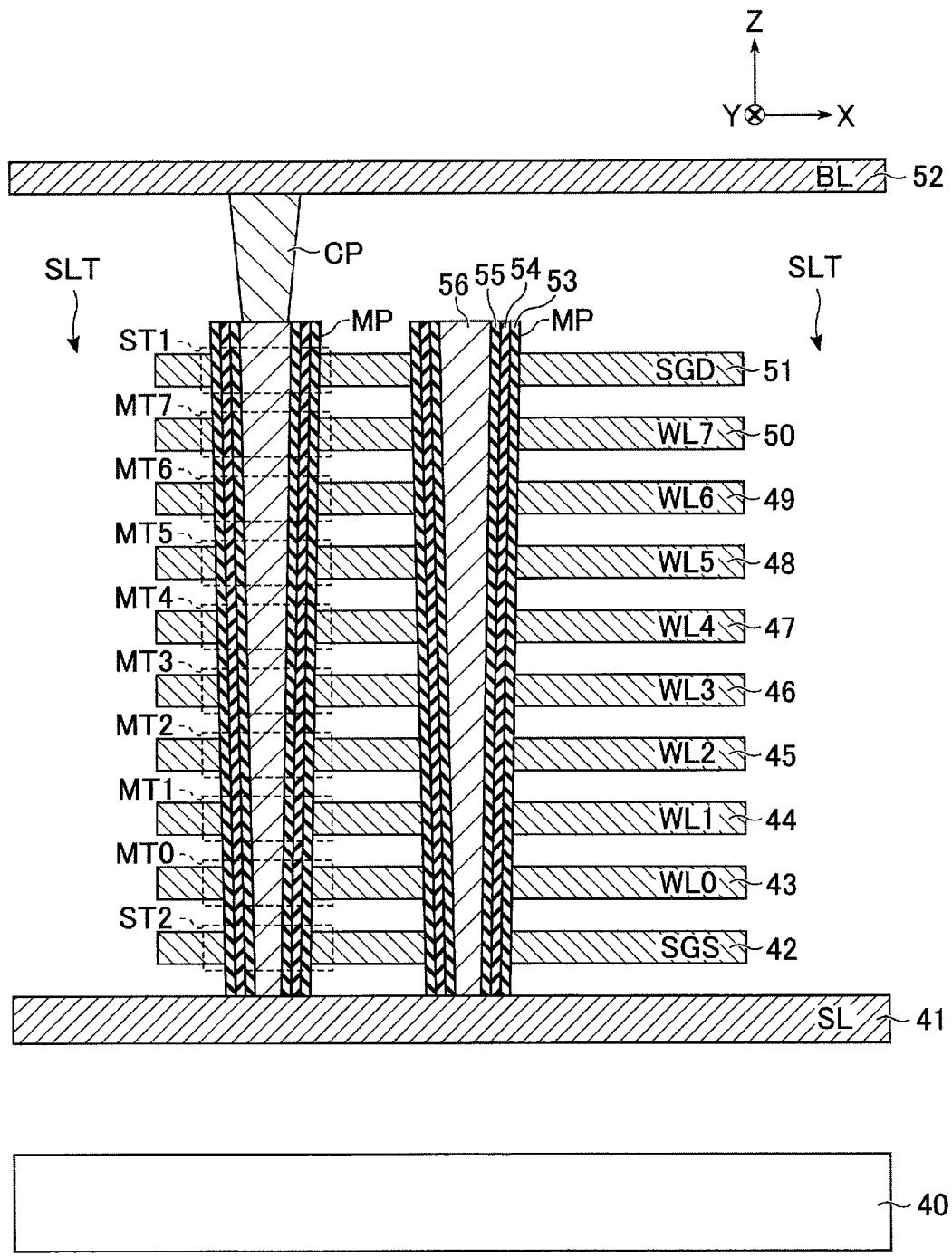
F I G. 5

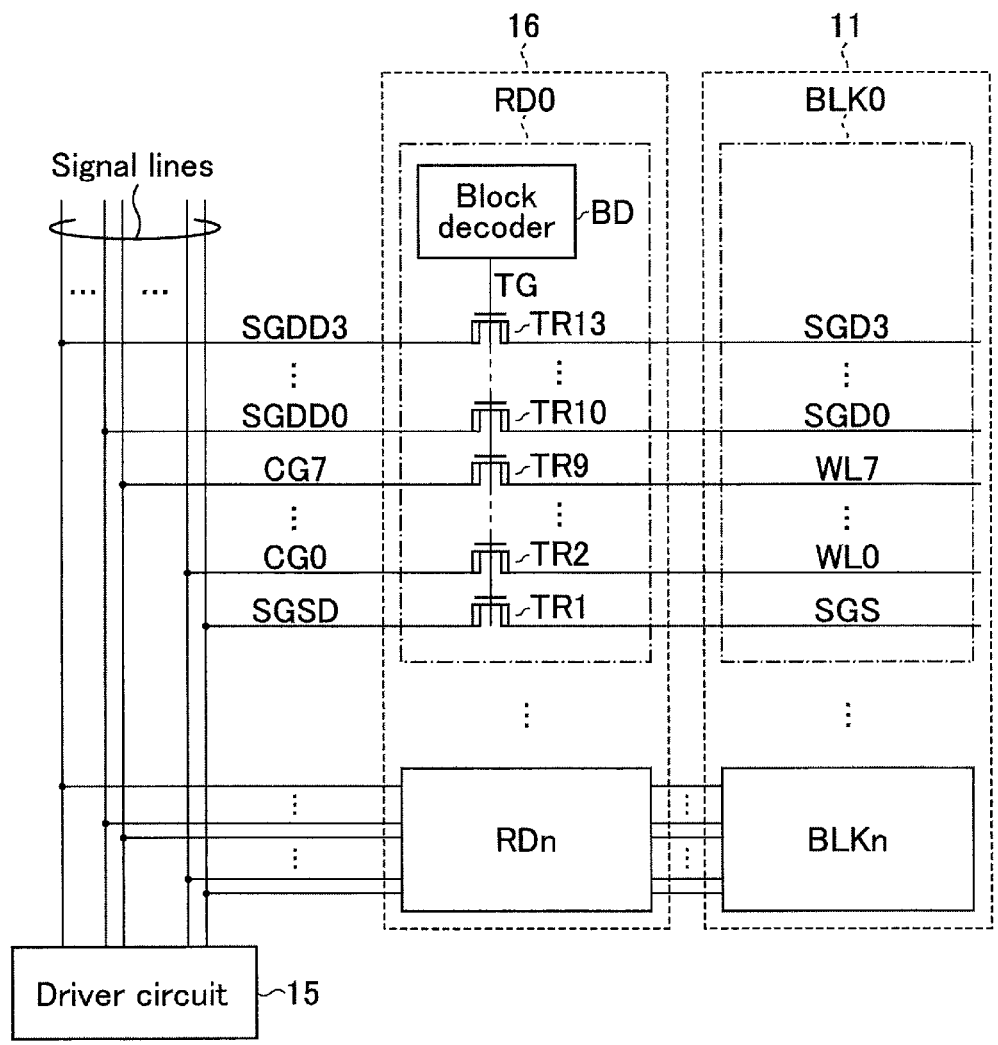
F I G. 7

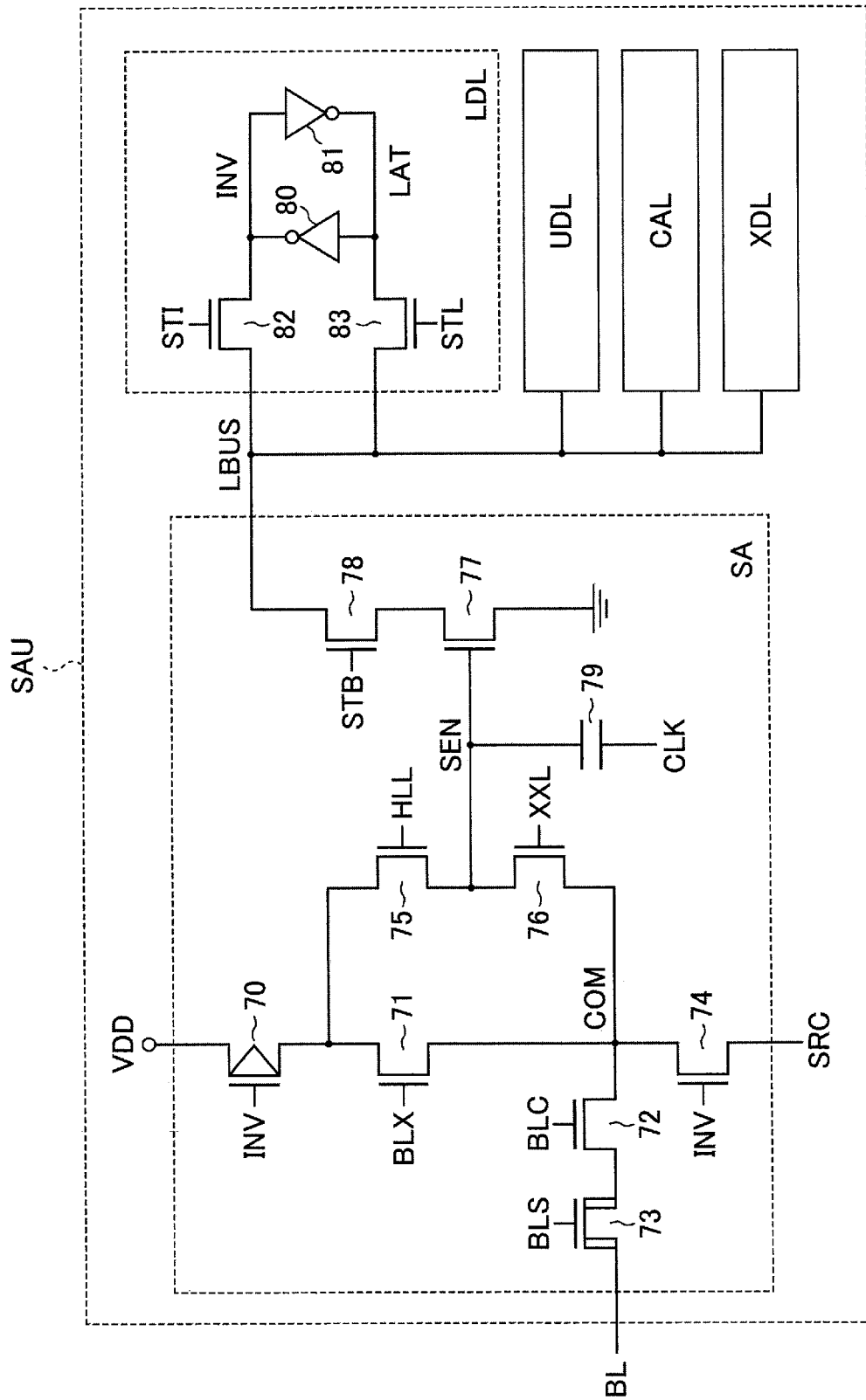
F I G. 9

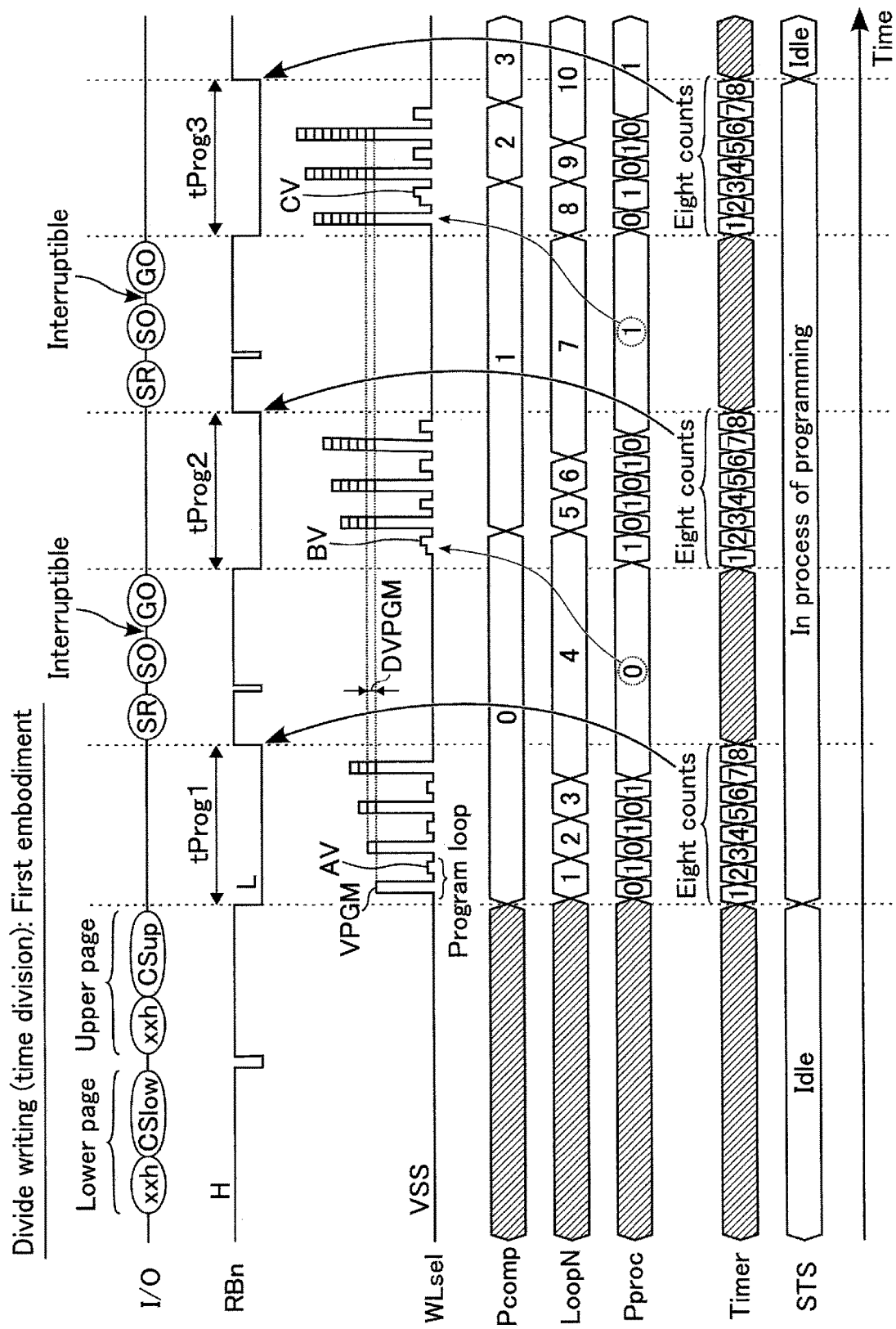
F I G. 17

| D0 Loop number count | | | | | | | | Loop number |
|---|---|---|---|---|---|---|---|---|
| [7] | [6] | [5] | [4] | [3] | [2] | [1] | [0] | |
| 0 | 0 | 0 | 0 | 0 | 0 | 0 | 0 | 0 |
| 0 | 0 | 0 | 0 | 0 | 0 | 0 | 1 | 1 |
| 0 | 0 | 0 | 0 | 0 | 0 | 1 | 0 | 2 |
| 0 | 0 | 0 | 0 | 0 | 0 | 1 | 1 | 3 |
| 0 | 0 | 0 | 0 | 0 | 1 | 0 | 0 | 4 |
| ⋮ | | | | | | | | ⋮ |
| 1 | 1 | 1 | 1 | 1 | 1 | 1 | 0 | 254 |
| 1 | 1 | 1 | 1 | 1 | 1 | 1 | 1 | 255 |

FIG. 20

| D1: Write completion flag | | | |
|---|---|---|---|
| [7]-[3] | [2] | [1] | [0] |
| Unused | "C"-level write completion flag | "B"-level write completion flag | "A"-level write completion flag |

"0": In process of writing
"1": Completion of writing

FIG. 21

| D2: Operation distinction parameter | |
|---|---|
| [7]-[1] | [0] |
| Unused | Operation at the end of divide writing |

"0": Program operation
"1": Verify operation

FIG. 22

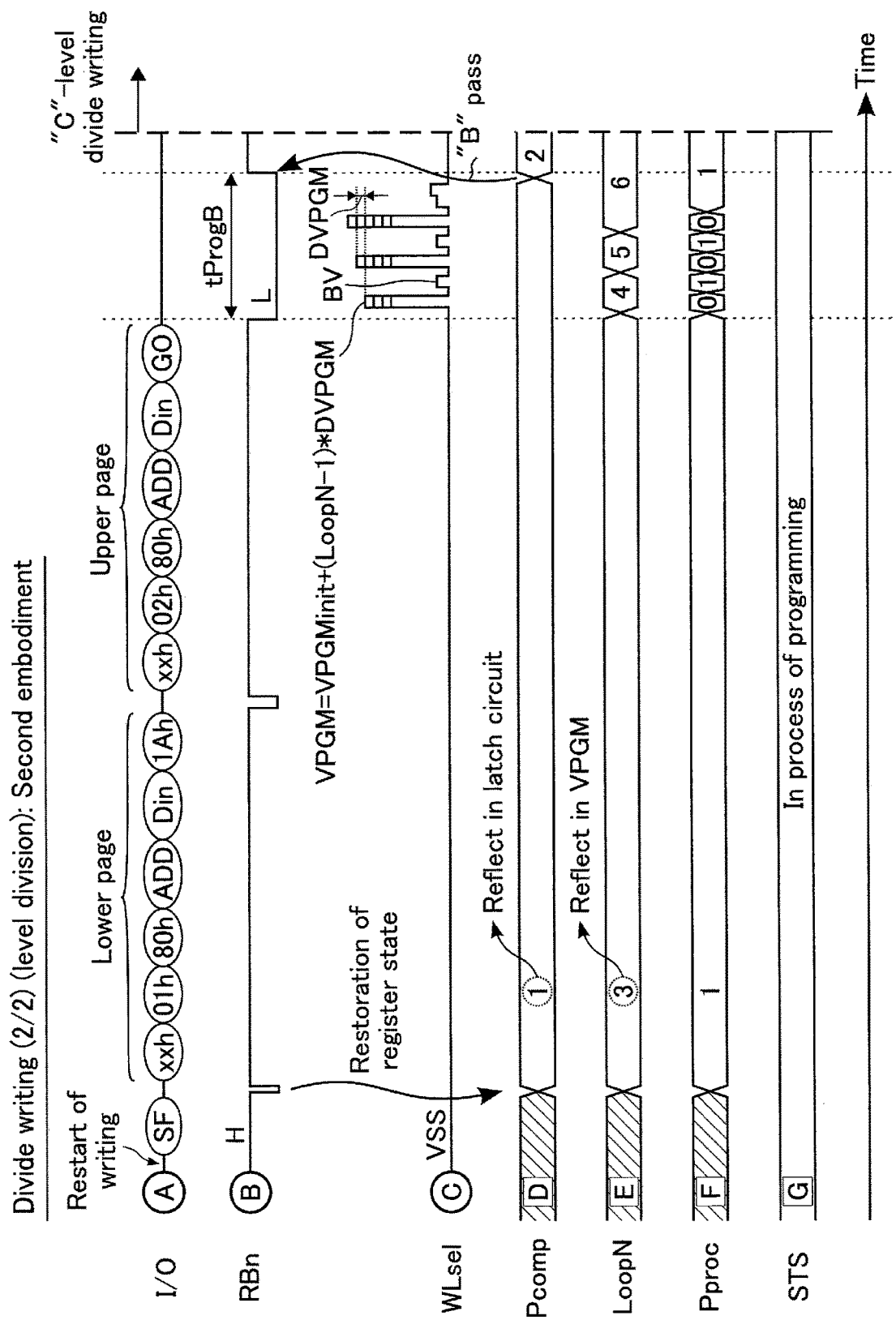
F I G. 25

Restoration of information in latch circuit based upon Pcomp (1) Pcomp:"0"

| Latch circuit | Write data | | | |
|---|---|---|---|---|
| | ER | A | B | C |
| LDL | 1 | 0 | 0 | 1 |
| UDL | 1 | 1 | 0 | 0 |

(2) Pcomp:"1"

| Latch circuit | Write data | | | |
|---|---|---|---|---|
| | ER | A | B | C |
| LDL | 1 | 0→1 | 0 | 1 |
| UDL | 1 | 1 | 0 | 0 |

(3) Pcomp:"2"

| Latch circuit | Write data | | | |
|---|---|---|---|---|
| | ER | A | B | C |
| LDL | 1 | 0→1 | 0→1 | 1 |
| UDL | 1 | 1 | 0→1 | 0 |

FIG. 26

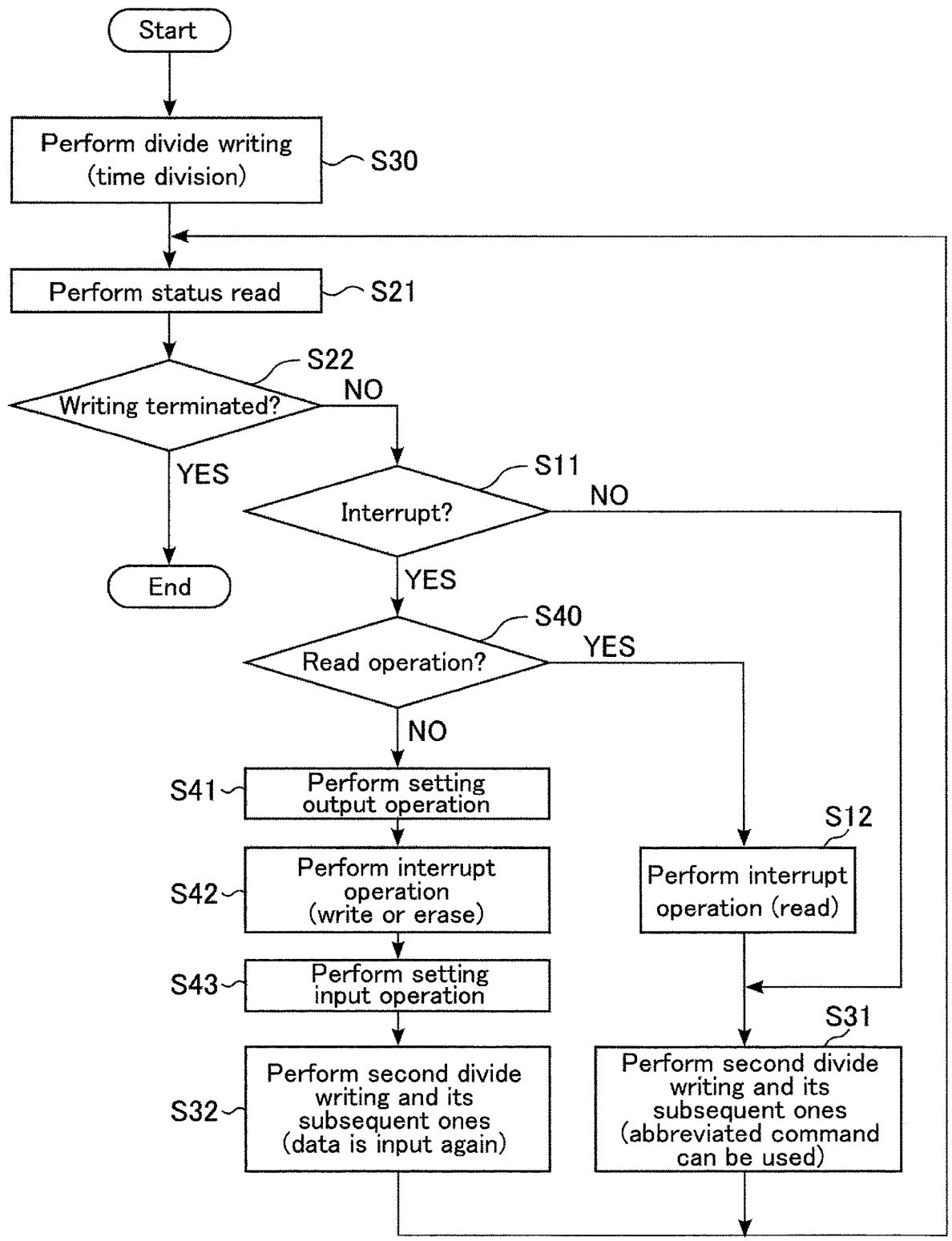
F I G. 28

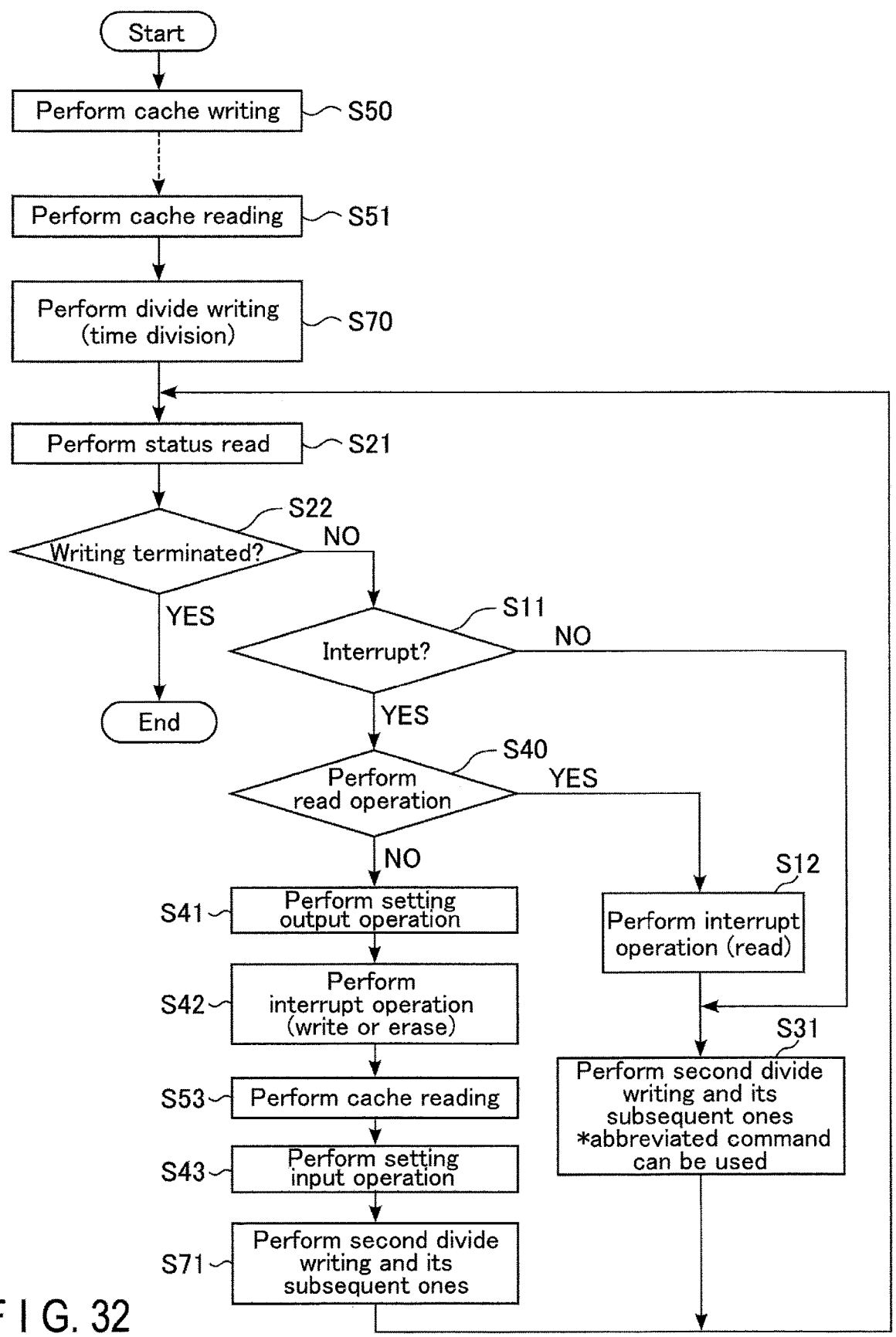
F I G. 32

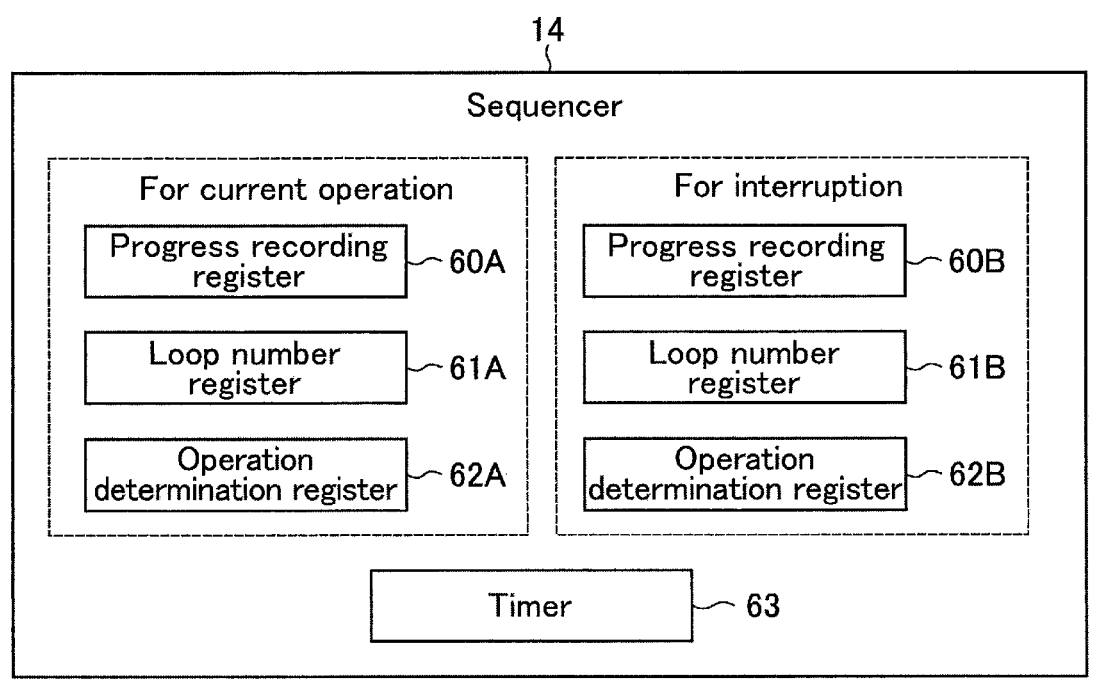
F I G. 33

Divide writing: foreground
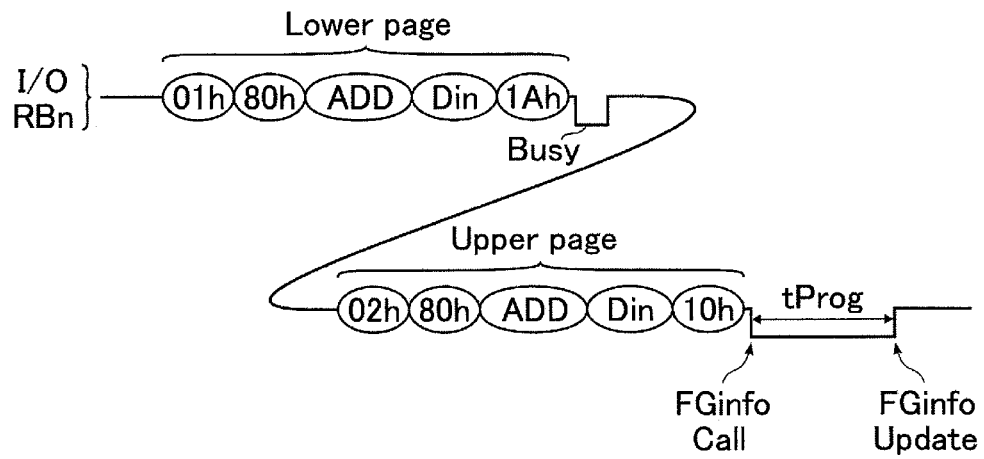
F I G. 35
Divide writing: background
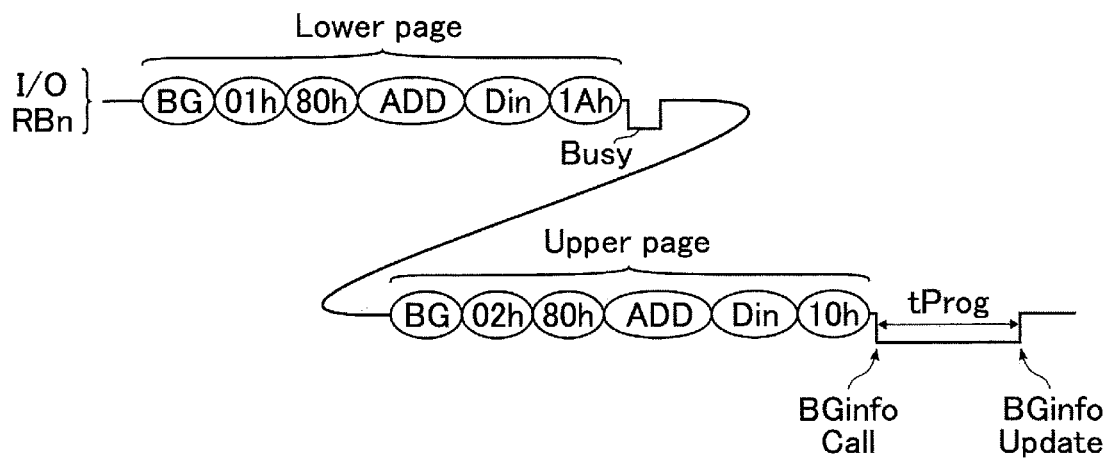
F I G. 36

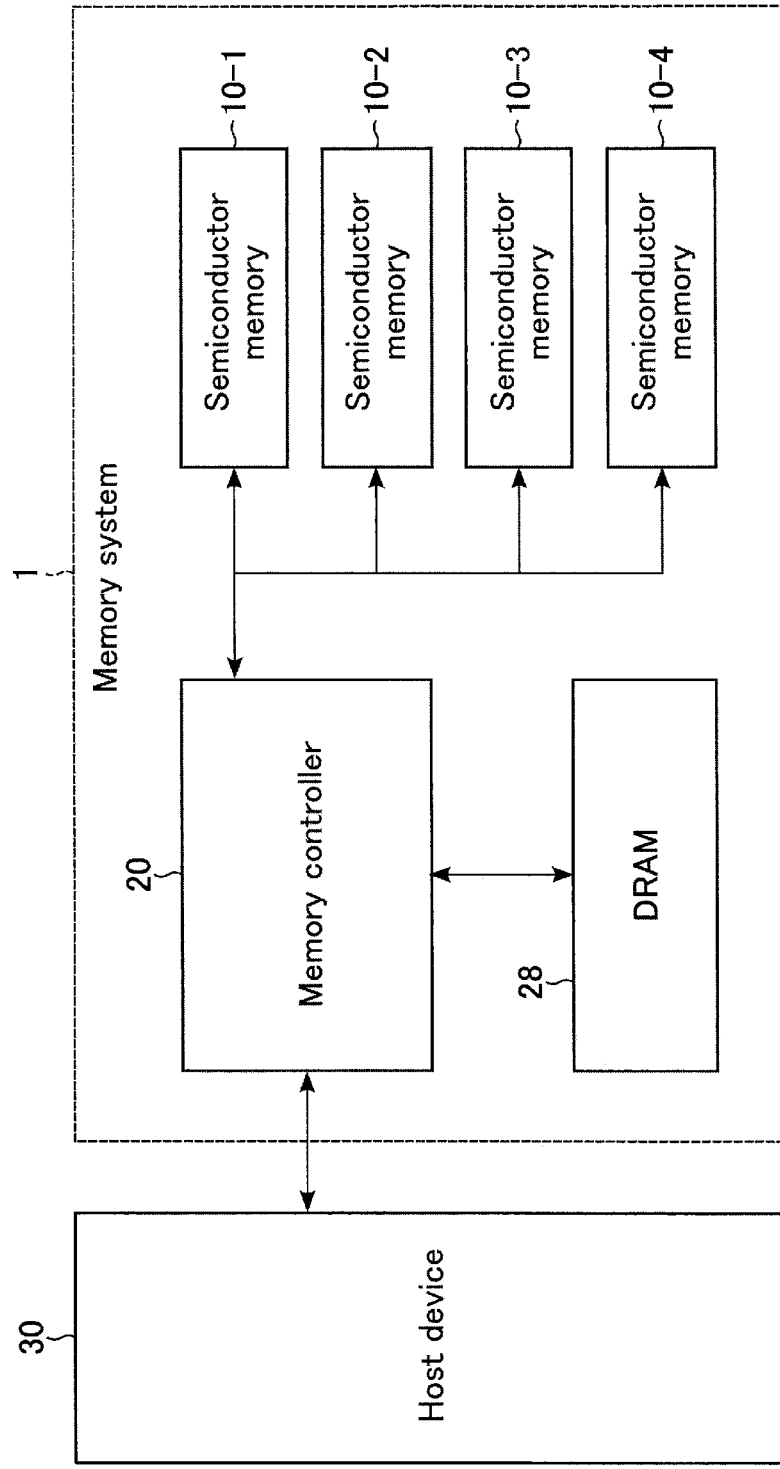
F I G. 38

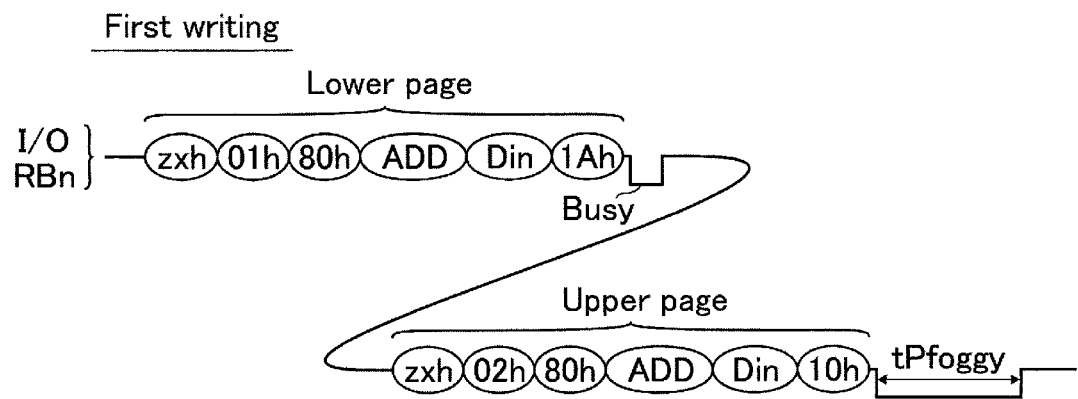
F I G. 40
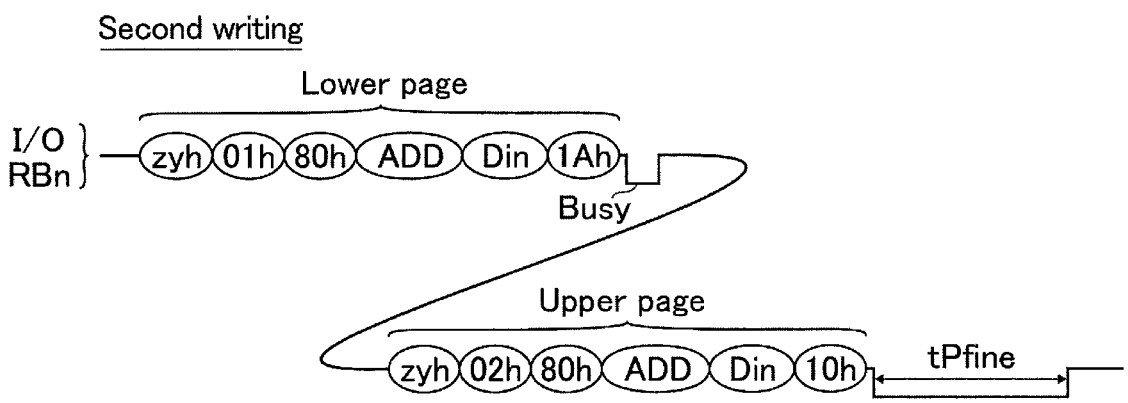
F I G. 41

Writing sequence

| Chip number | WL0 | | WL1 | | WL2 | | ... |
|---|---|---|---|---|---|---|---|
| | Foggy | Fine | Foggy | Fine | Foggy | Fine | ... |
| 10-1 | 1 | 9 | 5 | 17 | 13 | ... | ... |
| 10-2 | 2 | 10 | 6 | 18 | 14 | ... | ... |
| 10-3 | 3 | 11 | 7 | 19 | 15 | ... | ... |
| 10-4 | 4 | 12 | 8 | 20 | 16 | ... | ... |

FIG. 42

| Write operation | Writing time |
|---|---|
| First writing | 3ms |
| Second writing | 5ms |

⇩ Divide writing is applied to second writing

| Write operation | Writing time |
|---|---|
| First writing | 3ms |
| Second writing | 3ms + 3ms |

FIG. 43

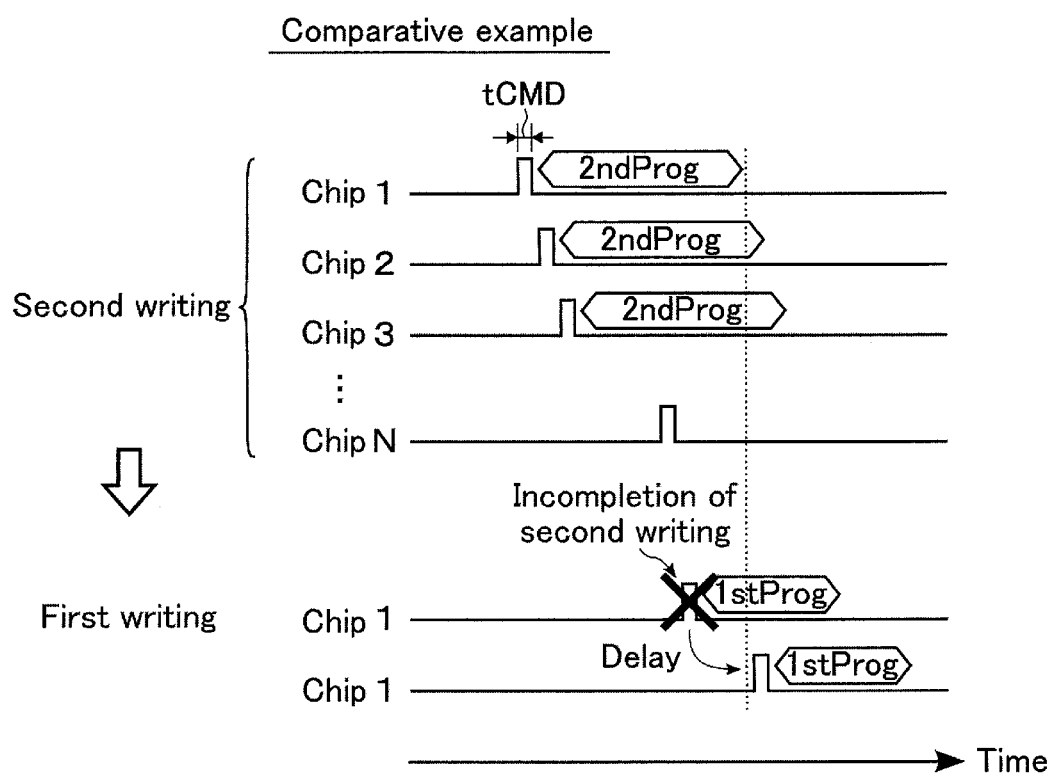
F I G. 44

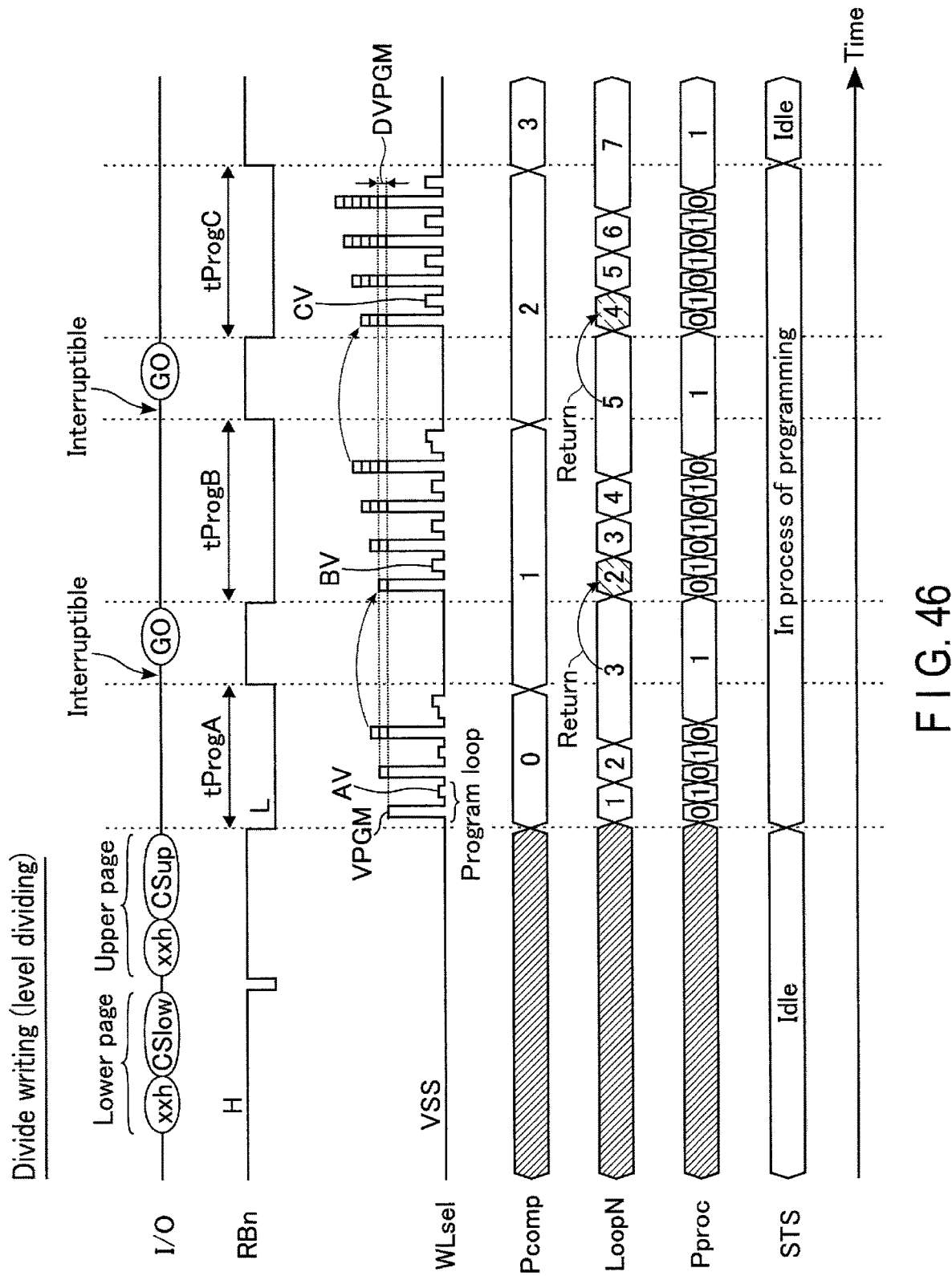
F I G. 46

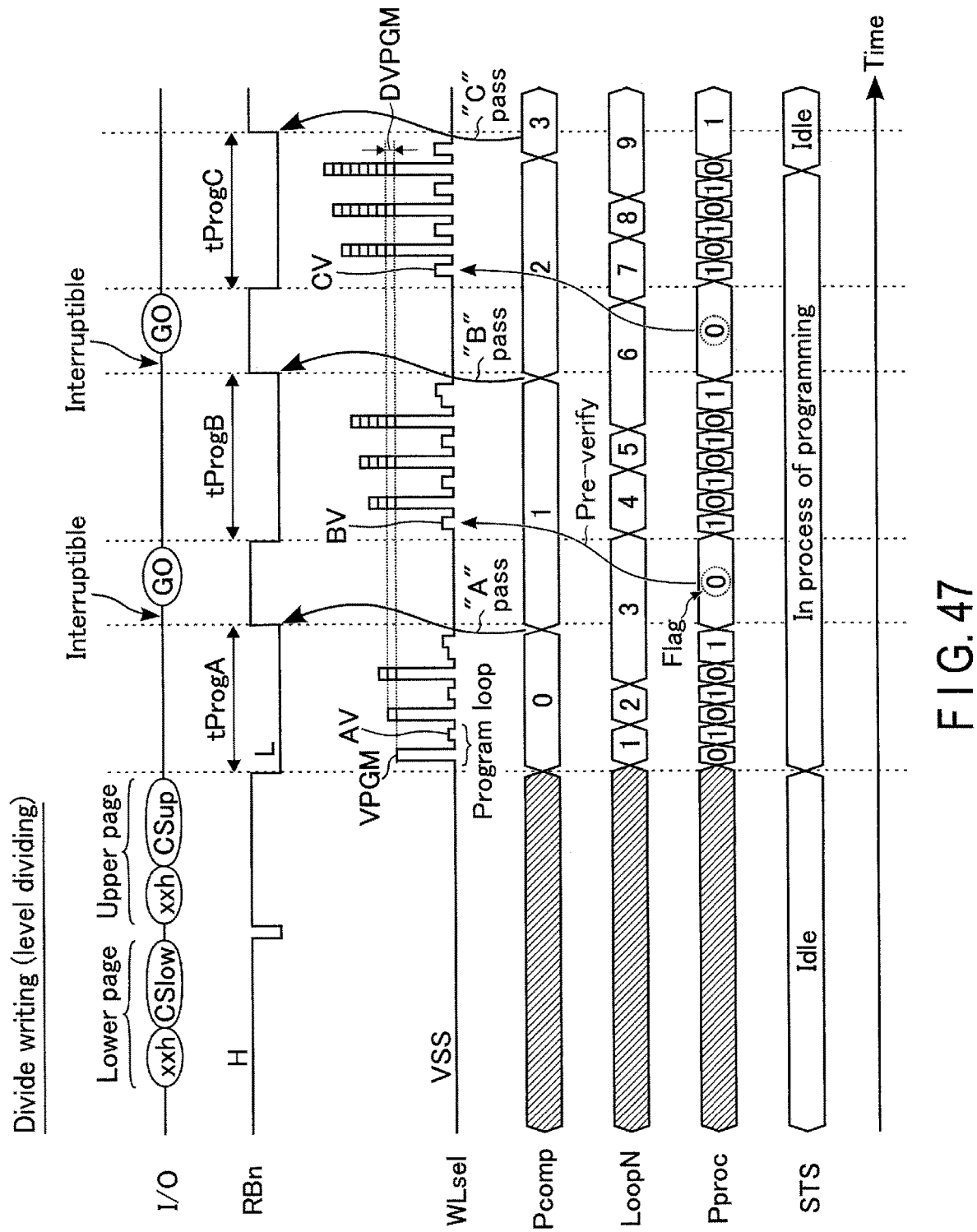
F I G. 47

MEMORY SYSTEM

CROSS-REFERENCE TO RELATED APPLICATION

This application is based upon and claims the benefit of priority from Japanese Patent Application No. 2018-053846, filed Mar. 22, 2018, the entire contents of which are incorporated herein by reference.

FIELD

Embodiments described herein relate generally to a memory system.

BACKGROUND

NAND flash memories capable of storing data nonvolatilely are known.

BRIEF DESCRIPTION OF THE DRAWINGS

FIG. 1 is a block diagram showing an example of a configuration of a memory system according to a first embodiment.

FIG. 2 is a circuit diagram showing an example of a circuit configuration of a memory cell array of a semiconductor memory in the memory system according to the first embodiment.

FIG. 3 is a threshold distribution chart showing an example of a threshold voltage of a memory cell transistor in the memory system according to the first embodiment.

FIG. 4 is a plan view showing an example of a planar layout of the memory cell array of the semiconductor memory in the memory system according to the first embodiment.

FIG. 5 is a cross-sectional view showing an example of a cross-sectional structure of the memory cell array of the semiconductor memory in the memory system according to the first embodiment.

FIG. 7 is a circuit diagram showing an example of a circuit configuration of a row decoder module of the semiconductor memory in the memory system according to the first embodiment.

FIG. 9 is a circuit diagram showing an example of a more detailed circuit configuration of the sense amplifier module of the semiconductor memory in the memory system according to the first embodiment.

FIG. 17 is a timing chart showing an example of divide writing based on processing time in the memory system according to the first embodiment.

FIG. 20 is a table showing an example of setting information on the program loop number of a semiconductor memory in the memory system according to the second embodiment.

FIG. 21 is a table showing an example of setting information on a write completion flag of the semiconductor memory in the memory system according to the second embodiment.

FIG. 22 is a table showing an example of setting information on an operation distinction parameter of the semiconductor memory in the memory system according to the second embodiment.

FIG. 25 is a timing chart showing the example of divide writing based on a threshold level in the memory system according to the second embodiment.

FIG. 26 is a table showing an example of an information restoration method in a latch circuit in divide writing of the memory system according to the second embodiment.

FIG. 28 is a flowchart showing an example of divide writing based on processing time in the memory system according to the second embodiment.

FIG. 32 is a flowchart showing an example of divide writing based on processing time in the memory system according to the third embodiment.

FIG. 33 is a block diagram showing an example of a configuration of a sequencer of a semiconductor memory in a memory system according to a fourth embodiment.

FIG. 35 is a chart showing an example of a command sequence for foreground divide writing in the memory system according to the fourth embodiment.

FIG. 36 is a chart showing an example of a command sequence for background divide writing in the memory system according to the fourth embodiment.

FIG. 38 is a block diagram showing an example of a configuration of a memory system according to a fifth embodiment.

FIG. 40 is a chart showing an example of a command sequence of first writing in the memory system according to the fifth embodiment.

FIG. 41 is a chart showing an example of a command sequence of second writing in the memory system according to the fifth embodiment.

FIG. 42 is a table showing an example of the writing sequence of first writing and second writing in a write operation of the memory system according to the fifth embodiment.

FIG. 43 is a table showing an example of processing time of each of first writing and second writing in a write operation of the memory system according to the fifth embodiment.

FIG. 44 is a timing chart showing an example of a command issuance sequence and processing time of a write operation in a comparative example of the memory system according to the fifth embodiment.

FIG. 46 is a timing chart showing another example of divide writing based on a threshold level in the modification to the first embodiment.

FIG. 47 is a timing chart showing still another example of divide writing based on a threshold level in the modification to the first embodiment.

DETAILED DESCRIPTION

Figure 6:
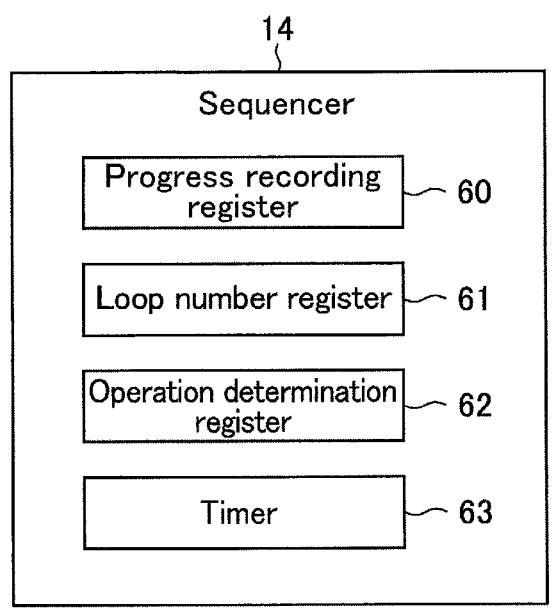
FIG. 6 is a block diagram showing an example of a configuration of a sequencer of the semiconductor memory in the memory system according to the first embodiment.

A memory system according to an embodiment includes a semiconductor memory and a memory controller. The memory controller is configured to control the semiconductor memory. The semiconductor memory includes a plurality of memory cells, a word line and a sequencer. The memory cells each stores data of a plurality of bits based on a plurality of threshold voltages including a first threshold voltage for first data as the data of a plurality of bits, and a second threshold voltage that is higher than the first threshold voltage for second data as the data of a plurality of bits. The word line is connected to the memory cells. The sequencer is configured to execute a program loop that includes a program operation and a verify operation in a write operation. The memory controller transmits a write command and write data to the semiconductor memory, and the sequencer performs a first write operation for the write data on a word line selected based on the write command. In the first write operation, the sequencer executes the program loop repeatedly and terminates the first write operation, when the verify operation for the first data has passed and the verify operation for the second data has not passed. The memory controller transmits a first command to the semiconductor memory after the first write operation is terminated and the sequencer performs a second write operation for the write data based on the first command.

The embodiments will be described below with reference to the accompanying drawings. In the embodiments, a device and a method for embodying the technical concept of the invention are exemplified. The drawings are schematic, and the relationship between a thickness and a planar dimension, the ratio between thicknesses of the respective layers, or the like are different from those in actual cases. In the following descriptions, the elements having substantially the same function and configuration are denoted by the same numeral or sign. The number subsequent to a letter or letters in a reference sign is used to distinguish elements having the same configuration and referred to by reference signs including the same letter or letters. If the elements denoted by the reference signs including the same letter or letters need not be distinguished from each other, they include only the same letter or letters and not a number subsequent thereto.

[1] FIRST EMBODIMENT

A memory system 1 according to a first embodiment will be described below.

[1-1] Configuration

[1-1-1] Overall Configuration of Memory System 1

FIG. 1 shows an example of a configuration of the memory system 1 according to the first embodiment. As shown in FIG. 1, the memory system 1 includes a semiconductor memory 10 and a memory controller 20. Hereinafter, an example of a configuration of each of the semiconductor memory 10 and memory controller 20 will be described in detail.

(Configuration of Semiconductor Memory 10)

The semiconductor memory 10 is, for example, a NAND flash memory capable of storing data nonvolatilely. As shown in FIG. 1, the semiconductor memory 10 includes a memory cell array 11, a command register 12, an address register 13, a sequencer 14, a driver circuit 15, a row decoder module 16, a sense amplifier module 17, a status register 18 and the like.

The memory cell array 11 includes a plurality of blocks BLK0 to BLKn (n is an integer of one or more) and a plurality of bit lines and a plurality of word lines. Each block BLK is a set of nonvolatile memory cells, which is used as, for example, a data erase unit. Each of the memory cells is associated with a corresponding one of the bit lines and a corresponding one of the word lines.

The command register 12 holds a command CMD that the semiconductor memory 10 has received from the memory controller 20. The command CMD includes instructions that cause, e.g. the sequencer 14 to perform a read operation, a write operation, an erase operation and the like.

The address register 13 holds address information ADD that the semiconductor memory 10 has received from the memory controller 20. The address information ADD includes a block address BA, a page address PA, a column address CA and the like.

The block address BA is used to select, e.g. a block BLK including memory cells that are to perform various operations. The page address PA is used to select, e.g. a word line associated with memory cells that are to perform various operations. The column address CA is used to select, e.g. a bit line that is to perform various operations.

The sequencer 14 controls the whole operation of the semiconductor memory 10 based on the command CMD held in the command register 12. For example, the sequencer 14 controls the driver circuit 15, row decoder module 16 and sense amplifier module 17 to perform a write operation for data DAT received from the memory controller 20 and a read operation of data DAT stored in the memory cell array 11.

The driver circuit 15 generates a desired voltage under the control of the sequencer 14. Then, the driver circuit 15 applies a voltage, which is to be applied to a selected word line and a non-selected word line, to a corresponding signal line based on, e.g. the page address PA held in the address register 13.

The row decoder module 16 selects one block BLK based on, e.g. the block address BA held in the address register 13. Then, the row decoder module 16 transfers a voltage, which has been applied to a signal line corresponding to each of the selected and non-selected word lines by the driver circuit 15, to each of the selected and non-selected word lines.

The sense amplifier module 17 applies a desired voltage to each of the bit lines in accordance with the write data received from the memory controller 20. The sense amplifier module 17 also determines the data stored in the memory cell based on the voltage of a bit line and transmits the determined read data DAT to the memory controller 20.

The status register 18 holds status information STS. The status information STS represents an operating status of the semiconductor memory 10 and is changed by, e.g. the sequencer 14. The status register 18 also transmits the status information STS to the memory controller 20 under the control of the sequencer 14.

(Configuration of Memory Controller 20)

The memory controller 20 is, for example, a system on chip (SoC). In response to an instruction from a host device 30, the memory controller 20 instructs the semiconductor memory 10 to perform a read operation, a write operation, an erase operation and the like.

As shown in FIG. 1, the memory controller 20 includes a host interface circuit 21, a central processing unit (CPU) 22, a random-access memory (RAM) 23, a buffer memory 24, an error correction code (ECC) circuit 25 and a NAND interface circuit 26.

The host interface circuit 21 is connected to the external host device 30 via a host bus to control the transfer of data, commands and addresses between the memory controller 20 and the host device 30. For example, the host interface circuit 21 supports communication interface standards such as serial advanced technology attachment (SATA), serial attached SCSI (SAS) and PCI express (PCIe) (registered trademark).

The CPU 22 controls the whole operation of the memory controller 20. For example, the CPU 22 issues a write command in response to a write instruction received from the host device 30. The CPU 22 also performs various processes to manage memory space of the semiconductor memory 10, such as wear leveling.

The RAM 23 is a volatile memory such as a static random-access memory (SRAM). The RAM 23 is used as a work area of the CPU 22. For example, the RAM 23 holds firmware, various management tables, etc. to manage the semiconductor memory 10.

The buffer memory 24 is a volatile memory such as a dynamic random-access memory (DRAM). The buffer memory 24 temporarily holds read data that the memory controller 20 has received from the semiconductor memory 10, write data that it has received from the host device 30, and the like.

The ECC circuit 25 performs a data error correction process. Specifically, during the write operation, the ECC circuit 25 generates parity based on the write data received from the host device 30 and gives the generated parity to the write data. During the read operation, the ECC circuit 25 generates a syndrome based on the read data received from the semiconductor memory 10 and detects and corrects an error of the read data based on the generated syndrome.

The NAND interface circuit 26 controls the transfer of data, commands and addresses between the memory controller 20 and the semiconductor memory 10 and supports NAND interface standards. For example, to perform communications between the semiconductor memory 10 and the memory controller 20, a command latch enable signal CLE, an address latch enable signal ALE, a write enable signal WEn, a read enable signal REn, a ready busy signal RBn and an input/output signal I/O are used.

The command latch enable signal CLE is a signal indicating that the input/output signal I/O received by the semiconductor memory 10 is a command CMD. The address latch enable signal ALE is a signal indicating that the signal I/O received by the semiconductor memory 10 is address information ADD.

The write enable signal Wen is a signal to instruct the semiconductor memory 10 to input the input/output signal I/O. The read enable signal Ren is a signal to instruct the semiconductor memory 10 to output the input/output signal I/O.

The ready busy signal RBn is a signal to notify the memory controller 20 whether the semiconductor memory 10 is in ready state where it receives an instruction from the memory controller 20 or in busy state where it receives no instruction. The input/output signal I/O is, for example, an 8-bit signal and can include the command CMD, address information ADD, data DAT and the like.

One semiconductor device may be configured by the combination of the foregoing semiconductor memory 10 and memory controller 20. Such a semiconductor device includes a memory card such as an SD™ card, a solid-state drive (SSD), and the like.

The functions of the foregoing memory controller 20 may be fulfilled by a dedicated hardware circuit. Or the functions may be done by the CPU 22 that is performing firmware.

[1-1-2] Configuration of Memory Cell Array 11

(Circuit Configuration of Memory Cell Array 11)

FIG. 2 shows an example of a circuit configuration of the memory cell array 11 in the first embodiment, in which one of the blocks BLK included in the memory cell array 11 is extracted.

As shown in FIG. 2, the block BLK includes, e.g. four string units SU0 to SU3. Each string unit SU includes a plurality of NAND strings NS that are associated with their respective bit lines BL0 to BLm (m is an integer of one or more). For example, each NAND string NS includes eight memory cell transistors MT0 to MT7 and select transistors ST1 and ST2.

Each memory cell transistor MT includes a control gate and a charge storage layer and holds data nonvolatilely. The select transistors ST1 and ST2 are each used to select a string unit SU when each operation is performed.

The memory cell transistors MT0 to MT7 included in each NAND string NS are connected in series between the select transistors ST1 and ST2. The control gates of the memory cell transistors MT0 to MT7 in the same block BLK are connected to their respective word lines WL0 to WL7.

The gates of select transistors ST1 included in each of the string units SU0 to SU3 in the same block BLK are connected to their corresponding one of select gate lines SGD0 to SGD3. The drains of select transistors ST1 in the same column in each block BLK are connected in common to their corresponding bit line BL.

The gates of select transistors ST2 in the same block BLK are connected in common to a select gate line SGS. The sources of select transistors ST2 in each block BLK are connected in common to a source line SL extending over the blocks BLK.

In the following descriptions, a plurality of memory cell transistors MT connected to a common word line WL in each string unit SU will be referred to as a cell unit CU. In accordance with the number of bits of data to be stored in each memory cell transistor MT included in the cell unit CU, the amount of data to be stored varies.

For example, when each memory cell transistor MT stores one-bit data, one cell unit CU can store one-page data. When each memory cell transistor MT stores two-bit data, one cell unit CU can store two-page data.

In this specification, therefore, "one-page data" is defined by the total amount of data to be stored in one cell unit CU when each memory cell transistor MT included in the cell unit CU stores one-bit data.

(Threshold Distribution of Memory Cell Transistor MT and Allocation of Data)

FIG. 3 shows an example of threshold distribution of each memory cell transistor MT, allocation of data, a read voltage and a verify voltage when one cell unit CU stores two-page data, or when the memory cell transistor MT stores two-bit data. In the graph of FIG. 3, the vertical axis represents the number of memory cell transistors MT and the horizontal axis represents a threshold voltage Vth of the memory cell transistors MT.

When each of the memory cell transistors MT stores two-bit data, the threshold distribution of the memory cell transistors MT is classified into four as shown in FIG. 3. These threshold distributions are referred to as, e.g. an "ER" level, an "A" level, a "B" level and a "C" level in increasing order of threshold voltage. For example, the following two-bit data is allocated to each of the threshold distributions.

"ER" level: "11 (upper bit/lower bit)" data
"A" level: "01" data
"B" level: "00" data
"C" level: "10" data A read voltage, which is used in the read operation, is set between adjacent threshold distributions. For example, a read voltage AR is set between the "ER" and "A" levels, a read voltage BR is set between the "A" and "B" levels and a read voltage CR is set between the "B" and "C" levels.

Specifically, the read voltage AR is set between the maximum threshold voltage at the "ER" level and the minimum threshold voltage at the "A" level. When the read voltage AR is applied to the gate of a memory cell transistor MT, the memory cell transistor MT is turned on when the threshold voltages are distributed at the "ER" level and turned off when they are distributed at the "A" level or higher.

The read voltage BR is set between the maximum threshold voltage at the "A" level and the minimum threshold voltage at the "B" level. When the read voltage BR is applied to the gate of a memory cell transistor MT, the memory cell transistor MT is turned on when the threshold voltages are distributed at the "A" level or lower and turned off when they are distributed at the "B" level or higher.

The read voltage CR is set between the maximum threshold voltage at the "B" level and the minimum threshold voltage at the "C" level. When the read voltage CR is applied to the gate of a memory cell transistor MT, the memory cell transistor MT is turned on when the threshold voltages are distributed at the "B" level or lower and turned off when they are distributed at the "C" level.

A read pass voltage VREAD is set higher than that of the highest-level threshold distribution. Specifically, the read pass voltage VREAD is set higher than the maximum threshold voltage at the "C" level. When the read pass voltage VREAD is applied to the gate of a memory cell transistor MT, the memory cell transistor MT is turned on irrespective of data to be stored.

A verify voltage, which is used in the write operation, is set between adjacent threshold distributions. For example, verify voltages AV, BV and CV are configured to correspond to the "A" level, "B" level and "C" level, respectively.

Specifically, the verify voltage AV is set between the maximum threshold voltage at the "ER" level and the minimum threshold voltage at the "A" level and close to the "A" level.

The verify voltage By is set between the maximum threshold voltage at the "A" level and the minimum threshold voltage at the "B" level and close to the "B" level.

The verify voltage CV is set between the maximum threshold voltage at the "B" level and the minimum threshold voltage at the "C" level and close to the "C" level.

Thus, the verify voltages AV, By and CV are set higher than the read voltages AR, BR and CR, respectively.

In the write operation, when the semiconductor memory 10 detects that the threshold voltage of a memory cell transistor MT in which data is stored has exceeded a verify voltage corresponding to the data, it completes the program of the memory cell transistor MT.

When the above-described data allocation is applied, one-page data of lower bits (lower page data) is determined by the result of read operation using the read voltage BR. One-page data of upper bits (upper page data) is determined by the result of read operation using each of the read voltages AR and CR.

As described above, the data allocation shown in FIG. 3 is referred to as, for example, "1-2 code" because the lower page data and the upper page data are each determined by one or two read operations. In the first embodiment, an example where the "1-2 code" is applied to the data allocation of the memory cell transistor MT will be described.

(Planar Layout of Memory Cell Array 11)

FIG. 4 shows an example of a planar layout of the memory cell array 11 in the first embodiment, in which a structure corresponding to two string units SU0 and SU1 is extracted.

In the drawings referred to below, the X direction corresponds to a direction in which the bit lines BL extend, the Y direction corresponds to a direction in which the word lines WL extend and the Z direction corresponds to a direction perpendicular to the surface of a semiconductor substrate.

The string units SU are provided to extend in the Y direction and arranged in the X direction as shown in FIG. 4. Each of the string units SU includes a plurality of memory pillars MP.

The memory pillars MP are arranged, e.g. in a staggered fashion in each of the string units. For example, at least one bit line BL is provided to overlap each of the memory pillars MP. In each of the string units, each of the memory pillars MP is connected to a single bit line BL via a contact plug CP.

The memory cell array 11 also includes, for example, a plurality of slits SLT. The slits SLT are, for example, provided to extend in the Y direction and arranged in the X direction. For example, an insulator is embedded in each of the slits SLT. Between adjacent slits SLT, for example, one string unit SU is provided. Note that a plurality of string units SU may be provided between adjacent slits SLT.

(Cross-Sectional Structure of Memory Cell Array 11)

FIG. 5 shows an example of a cross-sectional structure of the memory cell array 11 in the first embodiment. Note that an interlayer insulation film is omitted from FIG. 5.

As shown in FIG. 5, the memory cell array 11 includes a semiconductor substrate 40, conductors 41 to 52, memory pillars MP and a contact plug CP.

The conductor 41 is provided above the semiconductor substrate 40 with an interlayer insulation film therebetween. The conductor 41 is shaped like a plate that is parallel to the XY plane and functions as, e.g. a source line SL. Above the conductor 41, a plurality of slits SLT are arranged in the X direction and in parallel to the YZ plane. A structure above the conductor 41 and between adjacent slits SLT corresponds to, e.g. a single string unit SU.

Specifically, the conductors 42 to 51 are provided, e.g. in order from the semiconductor substrate 40 above the conductor 41 and between adjacent slits SLT. Conductors adjacent in the Z direction are stacked one on another with an interlayer insulation film therebetween. The conductors 42 to 51 are shaped like a plate that is parallel to the XY plane. For example, the conductor 42 corresponds to the select gate line SGS, the conductors 43 to 50 correspond to the word lines WL0 to WL7, respectively, and the conductor 51 corresponds to a selected gate line GSD.

Each of the memory pillars MP functions as, e.g. one NAND string NS. Each of the memory pillars MP is provided to pass through the conductors 42-51 and reaches the top surface of the conductor 41 from that of the conductor 51.

Each memory pillar MP includes, e.g. a block insulation film 53, an insulation film 54, a tunnel oxide film 55 and a semiconductor material 56. The block insulation film 53 is shaped like a cylinder to extend in the Z direction. In other words, the block insulation film 53 is formed on the inner wall of a memory hole extending in the Z direction. The insulation film 54 is formed on the inner wall of the block insulation film 53. The insulation film 54 functions as a charge storage layer of the memory cell transistors MT. The tunnel oxide film 55 is formed on the inner wall of the insulation film 54. The semiconductor material 56 is provided on the inner wall of the tunnel oxide film 55. The semiconductor material 56 includes conductive materials and functions as a current path of the NAND strings NS. Additional material may be formed on the inner wall of the semiconductor material 56.

An intersection of the memory pillar MP and the conductor 42 functions as the select transistor ST2. The intersections of the memory pillar MP and the conductors 43 to 50 function as their respective memory cell transistors MT0 to MT7. The intersection of the memory pillar MP and the conductor 51 functions as the select transistor ST1.

The conductor 52 is provided above the top surfaces of the memory pillars MP with an interlayer insulation film therebetween. The conductor 52 is formed linearly to extend in the X direction and corresponds to the bit lines BL. A plurality of conductors 52 are arranged in the Y direction (not shown). Each of the conductors 52 is electrically connected to a corresponding memory pillar MP for each string unit SU.

Specifically, in each string unit SU, for example, a conductive contact plug CP is provided on the semiconductor material 56 in each memory pillar MP, and one conductor 52 is provided on the contact plug CP. The invention is not limited to this arrangement, but the memory pillar MP and the conductor 52 may be connected via a plurality of contact plugs, interconnect or the like.

The configuration of the memory cell array 11 is not limited to the above. For example, the number of string units SU included in each block BLK may be set optionally. The number of memory cell transistors MT included in each NAND string NS may be set optionally, as may be the number of select transistors ST1 and ST2 included therein.

Furthermore, the number of word lines WL and the number of select gate lines SGD and SGS are varied with the number of memory cell transistors MT and the number of select transistors ST1 and ST2. A plurality of conductors 42, which are provided in their respective layers, may be allocated to the select gate lines SGS and a plurality of conductors 51, which are provided in their respective layers, may be allocated to the select gate lines SGD.

[1-1-3] Configuration of Sequencer 14

FIG. 6 shows an example of a configuration of the sequencer 14 of the semiconductor memory 10 in the first embodiment. As shown in FIG. 6, the sequencer 14 includes, for example, a progress recording register 60, a loop number register 61, an operation determination register 62 and a timer 63.

The progress recording register 60, loop number register 61, operation determination register 62 and timer 63 are used in the write operation described later.

For example, in the write operation, the progress recording register 60 holds a numerical value indicating a threshold value (e.g. "A" level, "B" level or "C" level) at which data has passed in verification. The loop number register 61 holds a numerical value indicating the number of times a program loop (described later), is executed. The operation determination register 62 holds a numerical value indicating whether the last-performed operation is a program operation or a verify operation (described later). The timer 63 measures time elapsed from when the sequencer 14 starts the write operation. A method of using each of these registers will be described in detail later.

[1-1-4] Configuration of Row Decoder Module 16

FIG. 7 shows an example of a circuit configuration of the row decoder module 16 of the semiconductor memory 10 in the first embodiment. As shown in FIG. 7, the row decoder module 16 includes row decoders RD0 to RDn.

The row decoders RD0 to RDn are associated with the blocks BLK0 to BLKn, respectively. In other words, one row decoder RD is associated with a corresponding one block BLK. In FIG. 7, the circuit configuration of only the row decoder RD0 is shown in detail, and the circuit configurations of the other row decoders are not shown. Focusing attention on the row decoder RD0, a circuit configuration of the row decoder RD will be described in detail below.

The row decoder RD includes a block decoder BD and high-voltage n-channel MOS transistors TR1 to TR13. The block decoder BD decodes a block address BA and applies a given voltage to a transfer gate line TG based on a result of the decoding. The transfer gate line TG is connected to the gates of the transistors TR1 to TR13. The transistors TR1 to TR13 are connected between various types of signal lines extending from the driver circuit 15 and various types of interconnect of the associated block BLK.

Specifically, one end of the transistor TR1 is connected to a signal line SGSD and the other end thereof is connected to the select gate line SGS. One end of each of the transistors TR2 to TR9 is connected to its corresponding one of signal lines CG0 to CG7, and the other end thereof is connected to its corresponding one end of each of the word lines WL0 to WL7. One end of each of the transistors TRl0 to TR13 is connected to its corresponding one of signal lines SGDD0 to SGDD3, and the other end thereof is connected to its corresponding one of select gate lines SGD0 to SGD3.

The foregoing configuration allows the row decoder module 16 to select a block BLK to perform various operations. Specifically, in each operation, the block decoders BD corresponding to selected and non-selected blocks BLK apply "H" and "L" level voltages to the transfer gate line TG. When the "H" and "L" level voltages are applied to the gate of the n-channel MOS transistor, the transistor is turned on and turned off.

For example, when the block BLK0 is selected, the transistors TR1 to TR13 included in the row decoder RD0 are turned on and the transistors TR1 to TR13 included in the other row decoders RD are turned off.

In this case, a current path is formed between the interconnects provided in the block BLK0 and their corresponding signal lines, and a current path between the interconnects provided in the other blocks BLK and their corresponding signal lines is interrupted. Consequently, the voltages applied to the signal lines by the driver circuit 15 are applied to the interconnects provided in the selected block BLK0 via the row decoder RD0.

[1-1-5] Configuration of Sense Amplifier Module 17

Figure 8:
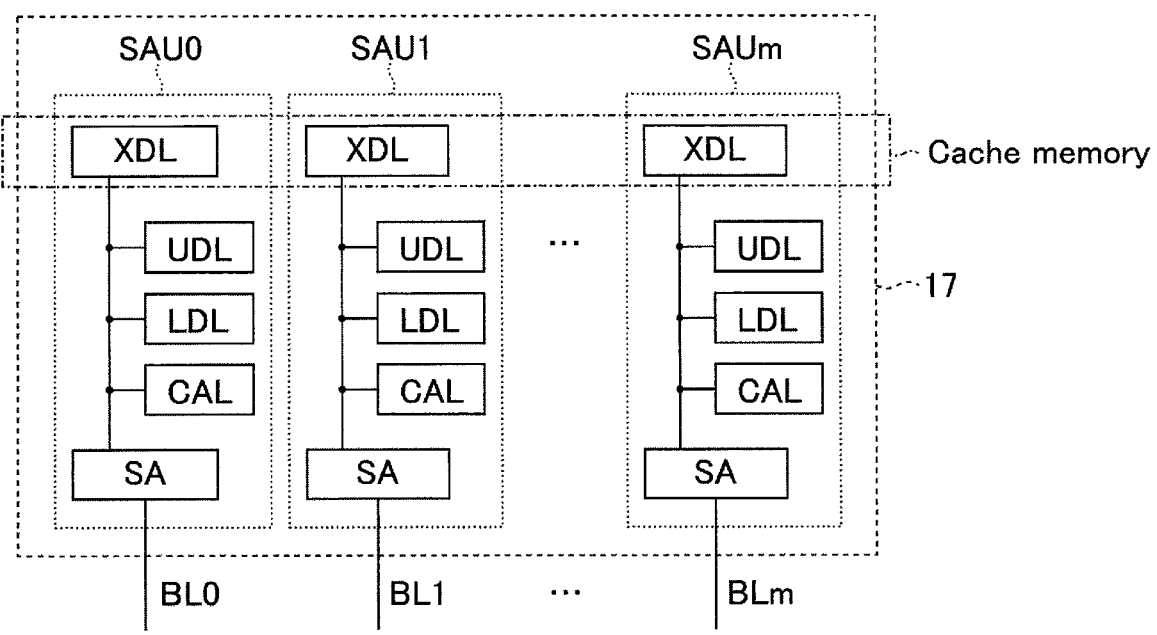
FIG. 8 is a circuit diagram showing an example of a circuit configuration of a sense amplifier module of the semiconductor memory in the memory system according to the first embodiment.

FIG. 8 shows an example of a circuit configuration of the sense amplifier module 17 in the first embodiment. As shown in FIG. 8, the sense amplifier module 17 includes, for example, sense amplifier units SAU0 to SAUm.

The sense amplifier units SAU0 to SAUm are associated with the bit lines BL0 to BLm, respectively. Each of the sense amplifier units includes, for example, a sense amplifier SA, latch circuits LDL, UDL and XDL and a calculator CAL.

The sense amplifier SA, latch circuits LDL, UDL and XDL and calculator CAL are so connected that they can transmit data to each other and receive data from each other.

For example, in the read operation, the sense amplifier SA senses data read in a corresponding bit line BL and determines whether the read data is "0" or "1." Each of the latch circuits LDL, UDL and XDL temporarily holds read data, write data and the like.

Furthermore, the latch circuit XDL is connected to an input/output circuit (not shown) and used for input/output of data between the sense amplifier unit SAU and the input/output circuit. The latch circuit XDL thus functions as a cache memory of the semiconductor memory 10. When the latch circuits LDL and UDL are in use, if the latch circuit XDL is not used, the semiconductor memory 10 can be brought into a ready state.

The calculator CAL performs various operations, such as OR operation, AND operation and XOR operation, for data held in each of the latch circuits LDL, UDL and XDL.

FIG. 9 shows a detailed circuit configuration of one sense amplifier unit SAU. As shown in FIG. 9, the sense amplifier SA includes, for example, a p-channel MOS transistor 70, n-channel MOS transistors 71-78 and a capacitor 79. The latch circuit LDL includes, for example, inverters 80 and 81 and n-channel MOS transistors 82 and 83. Since the circuit configuration of each of the latch circuits UDL and XDL is similar to that of, e.g. the latch circuit LDL, its descriptions will be omitted.

One end of the transistor 70 is connected to a power line and the gate thereof is connected to a node INV. For example, a voltage VDD, which is a power supply voltage of the semiconductor memory 10, is applied to a power line connected to one end of the transistor 70.

One end of the transistor 71 is connected to the other end of the transistor 70. The other end of the transistor 71 is connected to a node COM. The gate of the transistor 71 is supplied with a control signal BLX.

One end of the transistor 72 is connected to the node COM. The gate of the transistor 72 is supplied with a control signal BLC.

The transistor 73 is, for example, a high-voltage n-channel MOS transistor. One end of the transistor 73 is connected to the other end of the transistor 72. The other end of the transistor 73 is connected to a corresponding bit line BL. The gate of the transistor 73 is supplied with a control signal BLS.

One end of the transistor 74 is connected to the node COM and the other end thereof is connected to a node SRC. The gate of the transistor 74 is connected to a node INV. For example, a voltage VSS, which is a ground voltage of the semiconductor memory 10, is applied to the node SRC.

One end of the transistor 75 is connected to the other end of the transistor 70. The other end of the transistor 75 is connected to a node SEN. The gate of the transistor 75 is supplied with a control signal HLL.

One end of the transistor 76 is connected to the node SEN. The other end of the transistor 76 is connected to the node COM.

The gate of the transistor 76 is supplied with a control signal XXL. One end of the transistor 77 is grounded. The gate of the transistor 77 is connected to the node SEN.

One end of the transistor 78 is connected to the other end of the transistor 77. The other end of the transistor 78 is connected to a bus LBUS.

The gate of the transistor 78 is supplied with a control signal STB. One end of the capacitor 79 is connected to the node SEN and the other end thereof is supplied with a clock CLK.

The input node of the inverter 80 is connected to a node LAT and the output node thereof is connected to a node INV. The input node of the inverter 81 is connected to the node INV and the output node thereof is connected to the node LAT.

One end of the transistor 82 is connected to the node INV and the other end thereof is connected to the bus LBUS. The gate of the transistor 82 is supplied with a control signal STI. One end of the transistor 83 is connected to the node LAT and the other end thereof is connected to the bus LBUS. The gate of the transistor 83 is supplied with a control signal STL.

The control signals BLX, BLC, BLS, HLL, XXL and STB described above are generated by, e.g. the sequencer 14. The timing with which the sense amplifier SA determines data read in the bit line BL is based on timing with which the control signal STB is asserted.

In the following descriptions, the operation of "asserting the control signal STB" means that the sequencer 14 changes the control signal STB temporarily from "L" level to "H" level. In the configuration of the sense amplifier module 17, the operation of "asserting the control signal STB" may also means that the sequencer 14 changes the control signal STB temporarily from "H" level to "L" level.

The configuration of the sense amplifier module 17 in the first embodiment is not limited to the configuration described above. For example, the number of latch circuits of the sense amplifier unit SAU may be varied appropriately with a write method to be applied.

[1-2] Operation

An operation of the memory system 1 according to the first embodiment will be described below.

In the drawings referred to below, when the ready busy signal RBn is at an "H" level and an "L" level, the semiconductor memory 10 is in a ready state and a busy state, respectively.

In the following descriptions, the selected word line WL will be referred to as a selected word line WLsel. Assume in the following descriptions that a voltage is applied to the selected word line WLsel by the driver circuit 15 and the row decoder module 16.

Assume that the command CMD transmitted to the semiconductor memory 10 by the memory controller 20 is held in the command register 12 and the address information ADD transmitted to the semiconductor memory 10 by the memory controller 20 is held in the address register 13.

[1-2-1] Read Operation

Figure 10:
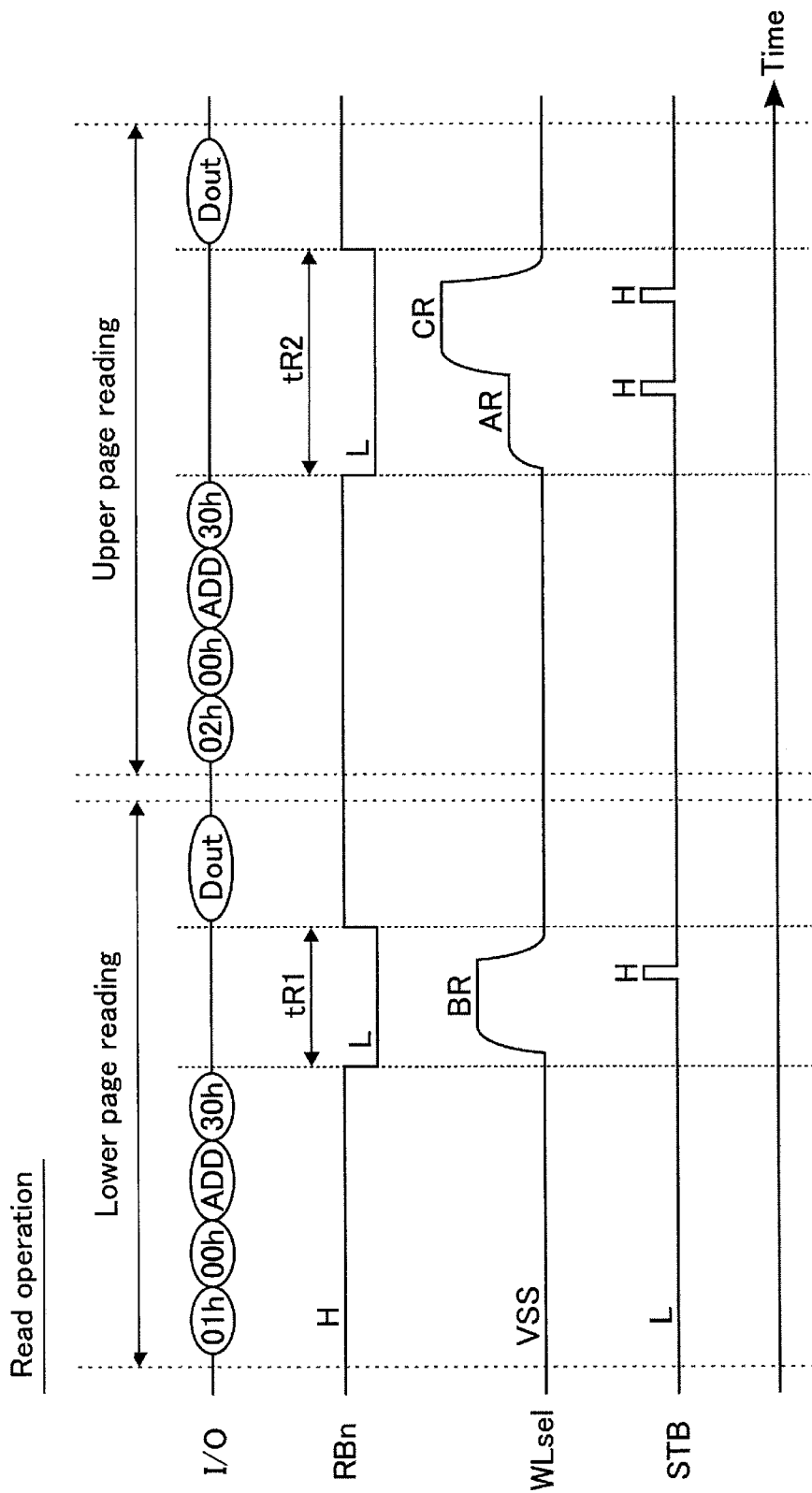
FIG. 10 is a timing chart showing an example of a read operation of the memory system according to the first embodiment.

FIG. 10 is a timing chart showing an example of a read operation of the memory system 1, in which the memory system 1 reads lower page data and upper page data, which are stored in a cell unit CU, in sequence.

As shown in FIG. 10, first, the memory controller 20 transmits a command "01h," a command "00h," address information ADD and a command "30h" to the semiconductor memory 10 in sequence.

The command "01h" is a command to provide the semiconductor memory 10 with an instruction about operation regarding the lower page. The command "00h" is a command to provide the semiconductor memory 10 with an instruction about a read operation. The command "30h" is a command to instruct the semiconductor memory 10 to perform the read operation.

Upon receipt of the command "30h," the semiconductor memory 10 makes the transition from a ready state to a busy state. Then, the sequencer 14 performs a read operation of lower page data (lower page reading) based on the received command CMD and address information ADD.

In the lower page reading, a read voltage BR is applied to the selected word line WLsel. Accordingly, a memory cell transistor MT connected to the selected word line WLsel, namely the selected memory cell transistor MT is turned on or turned off in accordance with data to be stored.

Thus, the voltage of each bit line BL varies with the status of the selected memory cell transistor MT and then the sequencer 14 asserts the control signal STB. When the control signal STB is asserted, each sense amplifier unit SAU determines data held in the memory cell transistor MT based on the voltage of a corresponding bit line BL.

A result of the determination is held in, for example, the latch circuit XDL of the sense amplifier unit SAU. In the lower page reading, the determination result corresponds to the lower page data, and the sequencer 14 causes the semiconductor memory 10 to make the transition from a busy state to a ready state in accordance with the determination of the lower page data.

Then, in response to an instruction from the memory controller 20, the semiconductor memory 10 outputs the lower page data, which is held in the latch circuit in the sense amplifier module 17, to the memory controller 20 (Dout).

The operation described above corresponds to the lower page reading. In FIG. 10, a time period during which the semiconductor memory 10 performs the lower page reading and is brought into a busy state, is represented as tR1. The memory system 1 then performs a read operation of upper page data (upper page reading).

Specifically, the memory controller 20 transmits a command "02h," a command "00h," address information ADD and a command "30h" to the semiconductor memory 10 in sequence. The command "02h" is a command to provide the semiconductor memory 10 with an instruction about operation regarding the upper page.

Upon receipt of the command "30h," the semiconductor memory 10 makes the transition from a ready state to a busy state. Then, the sequencer 14 performs the upper page reading based on the received command CMD and address information ADD.

In the upper page reading, read voltages AR and CR are applied in sequence to the selected word line WLsel. Like in the lower page reading, the voltage of each bit line BL varies with data stored in the selected memory cell transistor MT. The sequencer 14 asserts the control signal STB while the read voltage AR is being applied and while the read voltage CR is being applied.

A determination result corresponding to the read voltage AR is held in, for example, the latch circuit XDL. The sequencer 14 determines the upper page data based on the determination result corresponding to the read voltage AR and held in the latch circuit XDL and a determination result corresponding to the read voltage CR and holds the determined upper page data in the latch circuit XDL.

The sequencer 14 causes the semiconductor memory 10 to make the transition from a busy state to a ready state in accordance with the determination of the upper page data. Then, in response to an instruction from the memory controller 20, the semiconductor memory 10 outputs the upper page data, which is held in the latch circuit in the sense amplifier module 17, to the memory controller 20 (Dout).

The operation described above corresponds to the upper page reading.

In FIG. 10, a time period during which the semiconductor memory 10 performs the upper page reading and is brought into a busy state, is represented as tR2. Since the number of types of read voltages to be used is large, tR2 is longer than tR1.

As described above, the memory system 1 can read the lower page data and the upper page data. The type and number of voltages to be applied in the read operation can be varied appropriately with the number of bits of data stored in the memory cell transistor MT and the allocation of data.

Even when each cell unit CU stores data of one page or data of three or more pages, the semiconductor memory 10 can perform a similar read operation by varying the read voltage, arithmetic processing and the like appropriately.

[1-2-2] Write Operation

The memory system according to the first embodiment can perform normal writing and divide writing as a method of performing a write operation in which a cell unit CU is selected. Hereinafter, the normal writing and divide writing of the memory system 1 will be described in order.

(Normal Writing)

Figure 11:
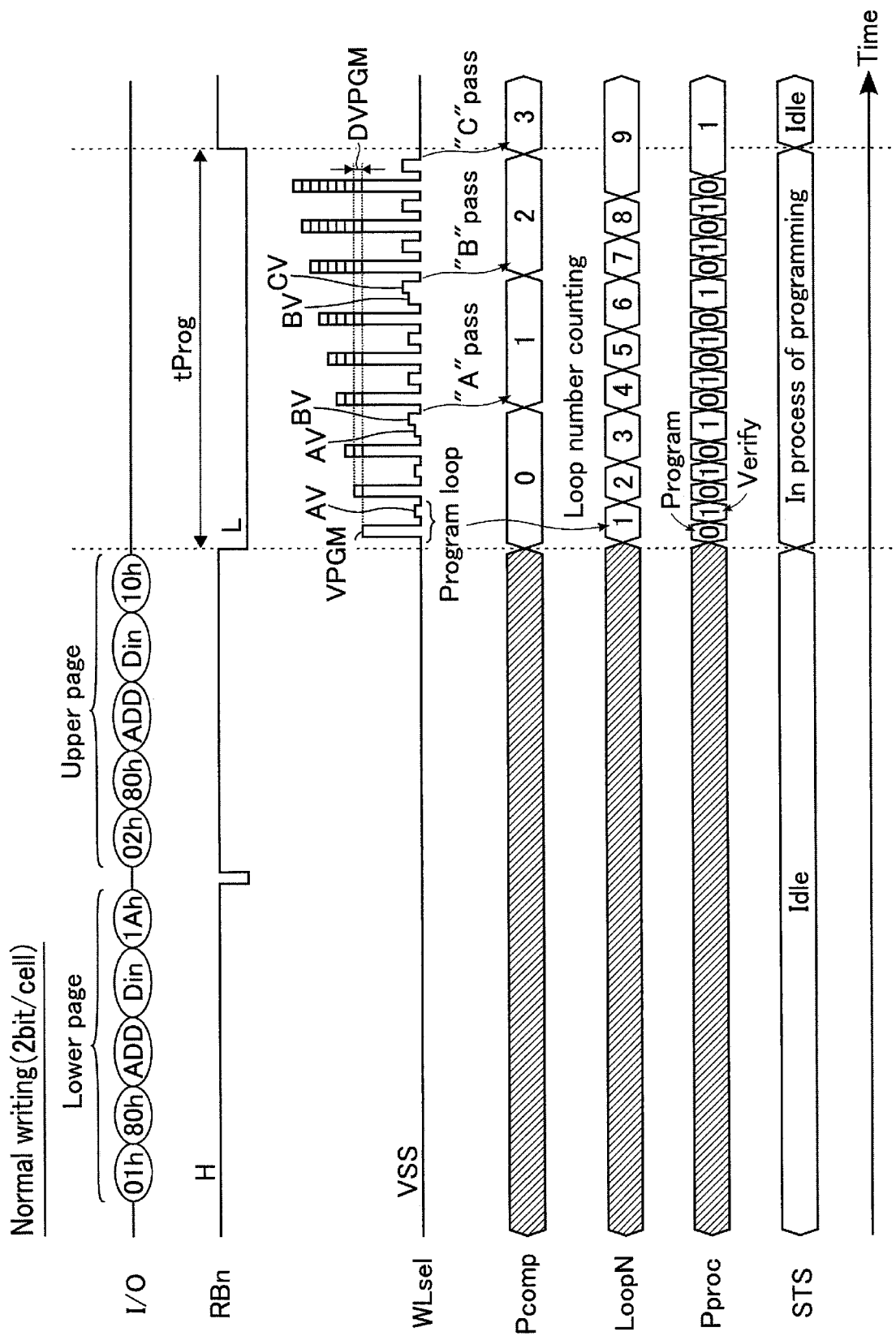
FIG. 11 is a timing chart showing an example of normal writing of the memory system according to the first embodiment.

When normal writing is performed as a write operation, write data is written to the cell unit CU by one normal writing. FIG. 11 is a timing chart showing an example of normal writing of the memory system 1, in which the semiconductor memory 10 writes data of two pages to the cell unit CU and in other words it causes each memory cell transistor to store two-bit data (2 bit/cell).

In the drawings referred to below, "Pcomp," "LoopN" and "Pproc" correspond to their respective examples of numerical values held in the progress recording register 60, loop number register 61 and operation determination register 62. "STS" represents an example of an operating status of the semiconductor memory 10.

As shown in FIG. 11, first, the memory controller 20 transmits a command "01h," a command "80h," address information ADD, lower page write data (Din) and a command "1Ah" to the semiconductor memory 10 in sequence.

The command "80h" is a command to provide the semiconductor memory 10 with an instruction about a write operation. The lower page write data received by the semiconductor memory 10 is transferred to the latch circuit XDL of the sense amplifier unit SAU in the sense amplifier module 17.

Upon receipt of the command "1Ah," the semiconductor memory 10 makes the transition temporarily from a ready state to a busy state. Then, the sequencer 14 transfers the lower page write data from the latch circuit XDL to, for example, the latch circuit LDL for each sense amplifier unit SAU.

Then, the memory controller 20 transmits a command "02h," a command "80h," address information ADD, upper page write data (Din) and a command "10h" to the semiconductor memory 10 in sequence. The command "10h" is a command to instruct the semiconductor memory 10 to perform a write operation.

The upper page write data received by the semiconductor memory 10 is transferred to the latch circuit XDL of the sense amplifier unit SAU in the sense amplifier module 17. Upon receipt of the command "10h," the semiconductor memory 10 makes the transition from a ready state to a busy state.

Thus, the sequencer 14 performs normal writing based on the received command CMD, address information ADD, lower page write data and upper page write data.

Upon start of the normal writing, the sequencer 14 first resets the numerical value "Pcomp" of the progress recording register 60 to, e.g. "0." "Pcomp=0" represents that there are no threshold levels at which data has passed in verification in the write operation.

In the write operation, the sequencer 14 repeats a program loop. Each program loop includes a program operation and a verify operation. The program operation and verify operation will be described below using the voltage of the selected word line WLsel in the first program loop.

The program operation increases the threshold voltage of the memory cell transistors MT.

In the program operation, each sense amplifier unit SAU sets a corresponding bit line BL to a target for writing or a target for inhibition of writing based on the data held in the internal latch circuit. For example, the bit line BL connected to the sense amplifier unit SAU that holds data corresponding to the "ER" level is configured to a target for inhibition of writing.

In the program operation, a program voltage VPGM is applied to the selected word line WLsel. The program voltage VPGM is a high voltage capable of increasing the threshold voltage of the memory cell transistors MT.

When the program voltage VPGM is applied to the selected word line WLsel, electrons are injected into the charge storage layer (e.g. insulation film 54) due to a difference in voltage between a channel and a selected gate in a memory cell transistor MT connected to the selected word line WLsel and the bit line BL for writing, thus increasing the threshold voltage of the memory cell transistor MT.

The channel of a NAND string NS connected to the bit line BL for inhibition of writing is brought into a floating state, and the voltage of the channel is boosted in accordance with a voltage applied to each word line WL. This suppresses an increase in the threshold voltage of a memory cell transistor MT connected to the selected word line WLsel and the bit line BL for inhibition of writing.

A series of operations described above corresponds to the program operation. When the program operation is completed, the sequencer 14 performs the subsequent verify operation.

The verify operation is a read operation of determining whether a memory cell transistor MT has reached a desired threshold voltage.

In the verify operation, a write level (threshold level) at which data is verified for each sense amplifier unit SAU is set based on the write data held by the sense amplifier unit SAU. When it is confirmed that a memory cell transistor MT has reached a desired threshold voltage, it is determined that the memory cell transistor MT has passed in the verification of the level.

For example, in the first verify operation, a read operation is performed using a verify voltage AV. Specifically, a verify voltage AV is applied to the selected word line WLsel and the control signal STB is asserted during the application of the verify voltage AV.

Then, each sense amplifier unit SAU determines whether the threshold voltage of the memory cell transistor connected to the selected word line WLsel exceeds the verify voltage AV.

When the threshold voltage of a memory cell transistor MT to which "A"-level data is written is higher than the verify voltage AV, the sequencer 14 determines that the "A"-level data has passed in verification. When the threshold voltage is equal to or lower than the verify voltage AV, the sequencer 14 determines that the "A"-level data has failed in verification. When this determination is completed, the sequencer 14 terminates the verify operation.

A pair of program and verify operations as described above corresponds to one program loop.

In the first program loop, the sequencer 14 sets the numerical value of LoopN to, e.g. "1." LoopN=1 represents a first program loop. In other words, LoopN corresponds to the number of times the program loop is executed (the program loop number).

Furthermore, the sequencer 14 sets the numerical value of Pproc during the execution of the program operation to, e.g. "0" and sets it during the execution of the verify operation to, e.g. "1." This is true of the subsequent program loops.

When a program loop is terminated, the sequencer 14 increments the numerical value of LoopN and executes the next program loop.

In the program operation in the next program loop, the program voltage VPGM is stepped up. The step-up width DVPGM of the program voltage VPGM is set to an optional value.

Furthermore, the sequencer 14 sets a bit line BL corresponding to the memory cell transistor MT that has passed in verification, to a target for inhibition of writing and sets a bit line BL corresponding to the memory cell transistor MT that has failed in verification, to a target for writing.

In the verify operation in the next program loop, a verify operation for the memory cell transistor MT that has passed in verification is omitted. In the verify operation in the next program loop, furthermore, the sequencer 14 changes a level of the verification appropriately. Specifically, the sequencer 14 appropriately changes the type and number of verify voltages to be used in accordance with the progress of the program loop.

In the example shown in FIG. 11, the sequencer 14 performs "A"-level verification in the verify operations in the first and second program loops and performs "A"-level verification and "B"-level verification consecutively in the verify operation in the third program loop. The sequencer 14 changes a verify voltage to be used appropriately even in the subsequent program loops.

When the sequencer 14 detects that the number of memory cell transistors MT, which are included in the memory cell transistors MT to which data is written at a threshold level and which do not pass in verification of the threshold level, is lower than a predetermined number in each program loop, it is considered that data has passed in the verification of the threshold level in the write operation, or data corresponding to the threshold level has been written. In the example shown in FIG. 11, data passes in the "A"-level verification in the third program loop.

When data passes in the "A"-level verification, the sequencer 14 increments the numerical value of, e.g. Pcomp. Specifically, the sequencer 14 sets the numerical value of Pcomp to "1" after data has passed in the "A"-level verification.

Similarly, the sequencer 14 sets the numerical value of Pcomp to "2" after data has passed in the "B"-level verification and sets the numerical value of Pcomp to "3" after data has passed in the "C"-level verification. The invention is not limited to these settings, but the numerical value of Pcomp representing that data has passed in each verification may be set to an optional one.

The sequencer 14 repeats the program loop described above and completes the normal writing when it detects that data has passed in the verification of all threshold levels. Alternatively, the sequencer 14 completes the normal writing based on that the numerical value of Pcomp is set to "3."

In the normal writing described above, the status of the semiconductor memory 10 indicates an "idle state" before the semiconductor memory 10 receives, e.g. the command "10h" to make the transition to the busy state and after it completes the normal writing to make the transition to the ready state.

The status of the semiconductor memory 10 represents "in the process of programming" in a time period during which the semiconductor memory 10 executes the normal writing and is brought into a busy state, or in a period during which the sequencer 14 is executing the normal writing.

In FIG. 11, a time period during which the semiconductor memory 10 is rendered in a busy state by performing the upper page reading is represented as tProg. For example, a time period tProg in the normal writing is substantially the same as a time period during which the status of the semiconductor memory 10 represents "in the process of programming."

(Divide Writing)

When divide writing is performed as a write operation, write data is written to a cell unit CU by performing the divide writing two or more times. Like in the normal writing, in the divide writing, a program loop is repeatedly executed. The divide writing is terminated based on that data has passed in, for example, the verification of a certain threshold level.

Figure 12:
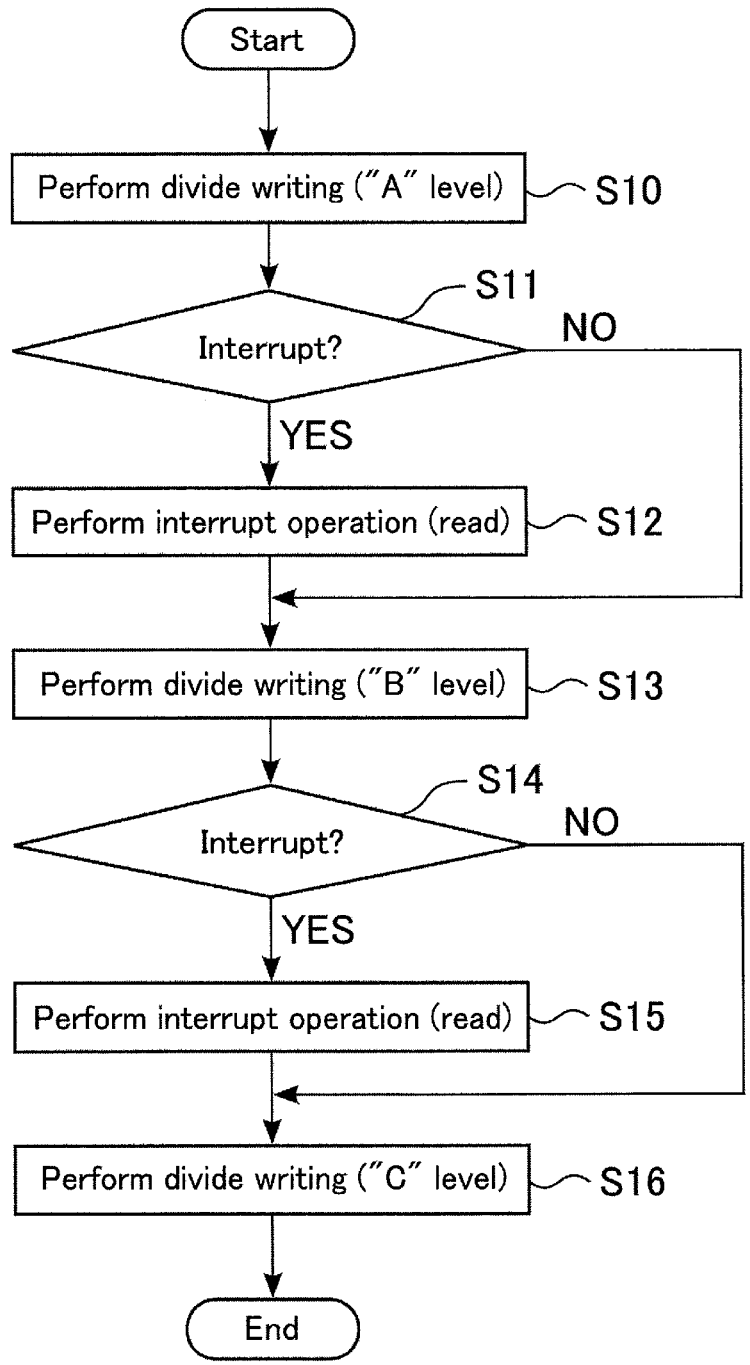
FIG. 12 is a flowchart showing an example of divide writing based on a threshold level in the memory system according to the first embodiment.

First, an outline of divide writing (level dividing) based on a threshold level in the memory system 1 according to the first embodiment will be described with reference to FIG. 12. FIG. 12 is a flowchart showing an example of the divide writing based on the threshold level in the memory system 1.

As shown in FIG. 12, first, the memory system 1 performs "A"-level divide writing (step S10). In the "A"-level divide writing, the sequencer 14 repeats a program loop until data passes in the "A"-level verification.

When the "A"-level divide writing is terminated, the memory system 1 confirms whether the host device 30 provides an instruction about an interrupt operation (step S11).

When an instruction about an interrupt operation is provided (Yes in step S11), the memory system 1 performs the interrupt operation (step S12). In the interrupt operation in the first embodiment, the memory system 1 can perform, e.g. the read operation only. In the interruption operation, two or more read operations can be performed consecutively.

When no instruction about an interrupt operation is provided (No in step S11) or when the interrupt operation is terminated in step S12, the sequencer 14 performs "B"-level divide writing (step S13). In the "B"-level divide writing, the sequencer 14 repeats a program loop until data passes in the "B"-level verification.

When the "B"-level divide writing is terminated, the memory system 1 confirms whether the host device 30 provides an instruction about an interrupt operation (step S14).

When an instruction about an interrupt operation is provided (Yes in step S14), the memory system 1 perform an interrupt operation (step S15). The interrupt operation in step S14 is the same as the interruption operation described using step S11.

When no instruction about an interrupt operation is provided (No in step S14) or when the interrupt operation is terminated in step S15, the sequencer 14 performs "C"-level divide writing (step S16). In the "C"-level divide writing, the sequencer 14 repeats a program loop until data passes in the "C"-level verification.

Figure 13:
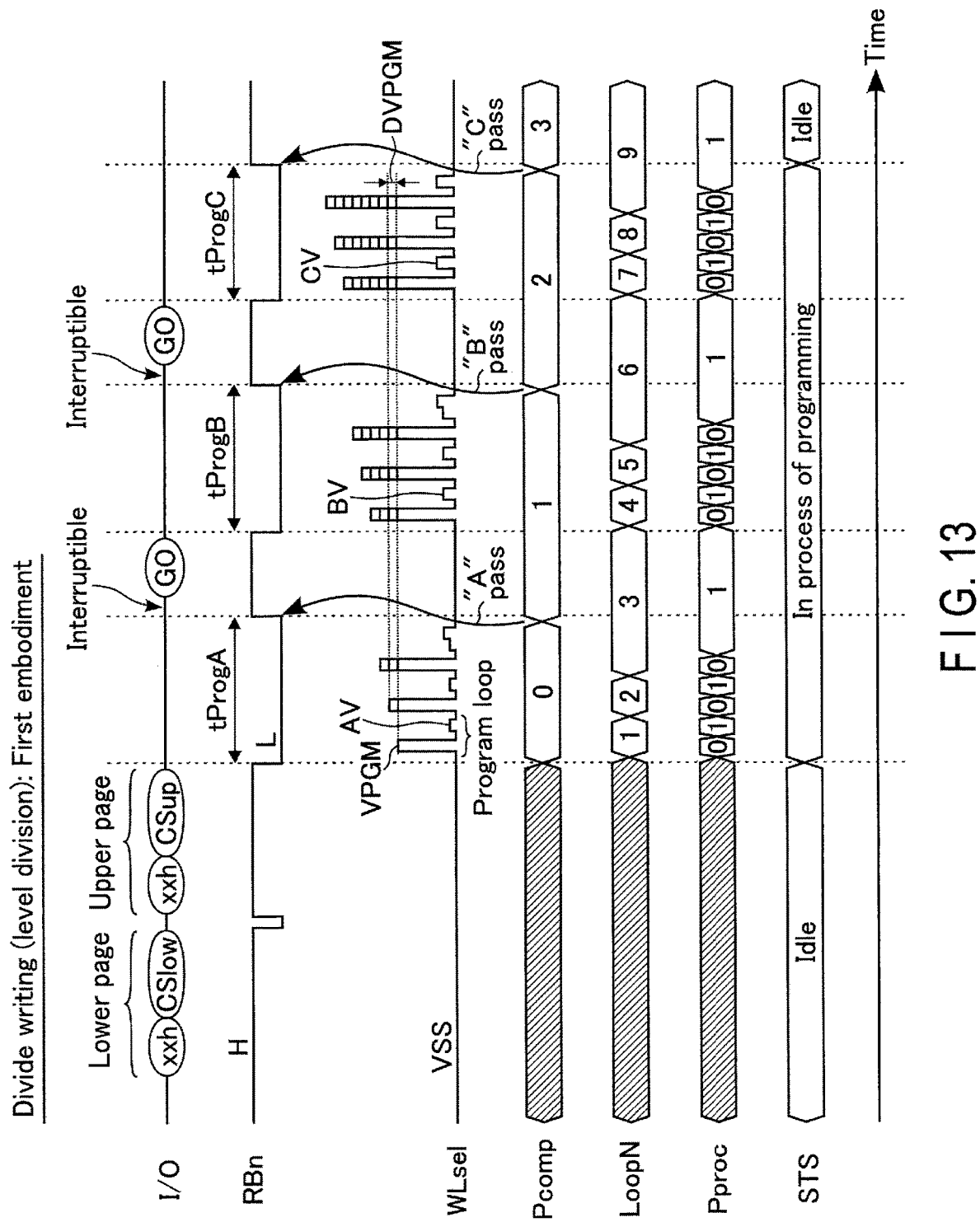
FIG. 13 is a timing chart showing an example of divide writing based on a threshold level in the memory system according to the first embodiment.

Then, divide writing based on the threshold level in the memory system 1 according to the first embodiment will be described in detail with reference to FIG. 13. FIG. 13 is a timing chart showing an example of the divide writing based on the threshold level in the memory system 1. Like FIG. 11 showing the normal writing, FIG. 13 shows an example in which the semiconductor memory 10 writes two-page data to a cell unit CU.

As shown in FIG. 13, first, the memory controller 20 transmits a command "xxh" and a command set CSlow to the semiconductor memory 10 in sequence. The command "xxh" is a command to provide the semiconductor memory 10 with an instruction about divide writing. The command set CSlow corresponds to, for example, a set of the command "80h," address information ADD, lower page write data (Din) and command "1Ah", which have been described with reference to FIG. 11.

The lower page write data received by the semiconductor memory 10 is transferred to the latch circuit XDL of the sense amplifier unit SAU in the sense amplifier module 17. Upon receipt of the command "1Ah" in the command set CSlow, the semiconductor memory 10 makes the transition temporarily from a ready state to a busy state. Then, the sequencer 14 transfers the lower page write data from the latch circuit XDL to, for example, the latch circuit LDL for each sense amplifier unit SAU.

Then, the memory controller 20 transmits a command "xxh," and a command set CSup to the semiconductor memory 10 in sequence. The command set CSup corresponds to, for example, a set of the command "80h," address information ADD, upper page write data (Din) and command "10h", which have been described with reference to FIG. 11.

The upper page write data received by the semiconductor memory 10 is transferred to the latch circuit XDL of the sense amplifier unit SAU in the sense amplifier module 17.

Upon receipt of the command "10h" in the command set CSup, the semiconductor memory 10 makes the transition temporarily from a ready state to a busy state. The sequencer 14 first transfers the upper page write data from the latch circuit XDL to, for example, the latch circuit UDL for each sense amplifier unit SAU.

Then, the sequencer 14 performs "A"-level divide writing based on the received command CMD, address information ADD, lower page write data and upper page write data. The status of the semiconductor memory 10 is shifted to "in the process of programming" based on that the "A"-level divide writing has started.

Upon start of the "A"-level divide writing, the sequencer 14 resets the numerical value Pcomp to, e.g. "0" and repeats a program loop as in the normal writing. The sequencer 14 also changes the numerical values of Pcomp, LoopN and Pproc in accordance with the progress of the program loop as in the normal writing.

When the sequencer 14 detects that the number of memory cell transistors MT, which are included in the memory cell transistors MT to which data is written at "A" level and which do not pass in the "A"-level verification, is lower than a predetermined number in the program loop to be repeated, it is considered that data has passed in the "A"-level verification.

Based on that data has passed in the "A"-level verification, the sequencer 14 increments the numerical value of Pcomp (e.g. Pcomp="1") and makes the transition from a busy state to a ready state. In other words, the sequencer 14 terminates the divide writing before data passes in the verification of a threshold level (e.g. "B" level and "C" level) which is higher than the "A" level.

The operation described above corresponds to the "A"-level divide writing. The timing with which the "A"-level divide writing is terminated and the semiconductor memory 10 is rendered in a ready state, corresponds to the timing with which an interrupt operation can be performed.

Assuming here that the interrupt operation has been performed, the memory controller transmits a command CMD and address information ADD regarding a read operation as described with reference to FIG. 10, to the semiconductor memory 10 and the semiconductor memory 10 performs a read operation based on the received command CMD and address information ADD (not shown).

In the read operation performed by the interrupt operation, the lower page data and upper page data held in the latch circuits LDL and UDL in the sense amplifier module 17 are not overwritten but held. In other words, the read data in the interrupt operation is held using, e.g. the latch circuit XDL only.

In the interrupt operation in the first embodiment, the numerical values of Pcomp, LoopN and Pproc set by the "A"-level divide writing are also maintained in a register adapted to the case where the interrupt operation is performed.

When no interrupt operation is performed or when the interrupt operation is terminated, the memory system 1 performs divide writing of a threshold level.

Specifically, the memory controller 20 transmits, e.g. a command "GO" to the semiconductor memory 10. The command "GO" is a command to instruct the semiconductor memory 10 to perform divide writing that has taken over the status of the last-performed divide writing.

Upon receipt of the command "GO," the semiconductor memory 10 makes the transition from a ready state to a busy state. Then, the sequencer 14 performs divide writing that has taken over the status of the last-performed divide writing.

In the divide writing, the sequencer 14 first refers to Pcomp and LoopN. Since the numerical value of Pcomp is, e.g. "1," the sequencer 14 recognizes that this divide writing is "B"-level divide writing after the "A"-level verification is completed.

Since, furthermore, the numerical value of LoopN is, e.g. "3," the sequencer 14 estimates a step-up amount applied to a program voltage for use in the first program operation in the "B"-level divide writing.

Specifically, the program voltage in the divide writing is calculated by the numerical expression of VPGM=VPGMinit+(LoopN−1)×DVPGM. VPGMinit corresponds to the program voltage VPGM applied first in the "A"-level divide writing.

In the "B"-level divide writing, the sequencer 14 starts a program loop using the program voltage so estimated. In the "B"-level divide writing, as the numerical values of Pcomp and LoopN, the numerical values in the "A"-level divide writing are taken over as they are.

Since, therefore, the numerical value of LoopN before the "B"-level divide writing is "3," the sequencer 14 sets the numerical value of LoopN in the first program loop in the "B"-level divide writing to "4." The sequencer 14 increments the numerical value of LoopN each time it repeats the program loop.

When the sequencer 14 detects that the number of memory cell transistors MT, which are included in the memory cell transistors MT to which data is written at "B" level and which do not pass in the "B"-level verification, is lower than a predetermined number in the program loop to be repeated, it is considered that data has passed in the "B"-level verification.

Then, the sequencer 14 increments the numerical value of Pcomp (e.g. Pcomp="2") based on that data has passed in the "B"-level verification to cause the semiconductor memory 10 to make the transition from a busy state to a ready state.

The operation described above corresponds to the "B"-level divide writing. The timing with which the "B"-level divide writing is terminated and the semiconductor memory 10 is rendered in a ready state, corresponds to the timing with which an interrupt operation can be performed.

Note that the numerical values of Pcomp, LoopN and Pproc set by the "B"-level divide writing are held in their corresponding registers even though an interrupt operation is performed as in the process after the "A"-level divide writing is terminated.

As in the process after the "B"-level divide writing is terminated, the memory system 1 performs divide writing of a threshold level when no interrupt operation is performed or when the interrupt operation is terminated.

Specifically, the memory controller 20 transmits a command "GO" to the semiconductor memory 10 as in the case where it performs the "B"-level divide writing. Upon receipt of the command "GO," the semiconductor memory 10 makes the transition from a ready state to a busy state. Then, the sequencer 14 performs divide writing that has taken over the status of the last-performed divide writing.

In this divide writing, too, the sequencer 14 first refers to Pcomp and LoopN. Since the numerical value of Pcomp is, e.g. "2," the sequencer 14 recognizes that this divide writing is "C"-level divide writing.

Since, furthermore, the numerical value of LoopN is, e.g. "6," the sequencer 14 estimates a step-up amount applied to a program voltage for use in the first program operation in the "C"-level divide writing.

In the "C"-level divide writing, the sequencer 14 starts a program loop using a program voltage based on the numerical value of LoopN. In the "C"-level divide writing, as the numerical values of Pcomp and LoopN, the numerical values in the "B"-level divide writing are taken over as they are.

Since, therefore, the numerical value of LoopN before the "C"-level divide writing is "6," the sequencer 14 sets the numerical value of LoopN in the first program loop in the "C"-level divide writing to "7." The sequencer 14 increments the numerical value of LoopN each time it repeats the program loop.

When the sequencer 14 detects that the number of memory cell transistors MT, which are included in the memory cell transistors MT to which data is written at "C" level and which do not pass in the "C"-level verification, is lower than a predetermined number in the program loop to be repeated, it is considered that data has passed in the "C"-level verification.

Then, the sequencer 14 increments the numerical value of Pcomp (e.g. Pcomp="3") based on that data has passed in the "C"-level verification to cause the semiconductor memory 10 to make the transition from a busy state to a ready state.

The status of the semiconductor memory 10 makes the transition to an "idle state" based on that the "C"-level divide writing is terminated.

In FIG. 13, the time periods during which the semiconductor memory 10 is rendered in a busy state by performing the "A"-, "B"- and "C"-level divide writing are shown as tProgA, tProgB and tProgC, respectively. The total length of tProgA, tProgB and tProgC is greater than tProg in the normal writing described with reference to FIG. 11.

In the foregoing descriptions, the sequencer 14 changes the numerical values of the progress recording register 60, loop number register 61 and operation determination register 62 in accordance with the progress of the program loop. The invention is not limited to this operation.

For example, when information held in the registers 60, 61 and 62 is managed by another circuit, the sequencer 14 may update the numerical values of these registers 60, 61 and 62 when the divide writing is terminated.

Specifically, for example, the sequencer 14 resets the numerical values of the registers 60, 61 and 62 at the start of the "A"-level divide writing and performs a program loop. Then, the sequencer 14 stores information about the divide writing at that point in time in the registers 60, 61 and 62 at the end of the "A"-level divide writing.

In the subsequent divide writing, the sequencer 14 refers to the registers 60, 61 and 62 and executes a program loop at the beginning and updates information of the registers 60, 61 and 62 at the end.

[1-3] Advantages of First Embodiment

As described above, in the memory system 1 according to the first embodiment, write data of a plurality of pages can be stored in a cell unit CU by performing divide writing two or more times based on a threshold level.

In the memory system 1 according to the first embodiment, furthermore, an interrupt operation can be performed between two or more divide writing operations in which a cell unit CU is selected. A time period during which the semiconductor memory 10 is rendered in a busy state by the divide writing is shorter than a time period during which the semiconductor memory 10 is rendered in a busy state by the normal writing.

Therefore, in the memory system 1 according to the first embodiment, when an interrupt instruction of read operation is received from the host device 10 during the write operation, a time period required to respond to the instruction can be shortened. In other words, the memory system 1 according to the first embodiment can shorten latency by making use of divide writing.

[1-4] Modification to First Embodiment

In the first embodiment, divide writing is performed based on a threshold level. As a trigger to terminate each divide writing, another method may be applied.

For example, each divide writing may be terminated based on that a program loop is repeated a predetermined number of times (program loop number).

Figure 14:
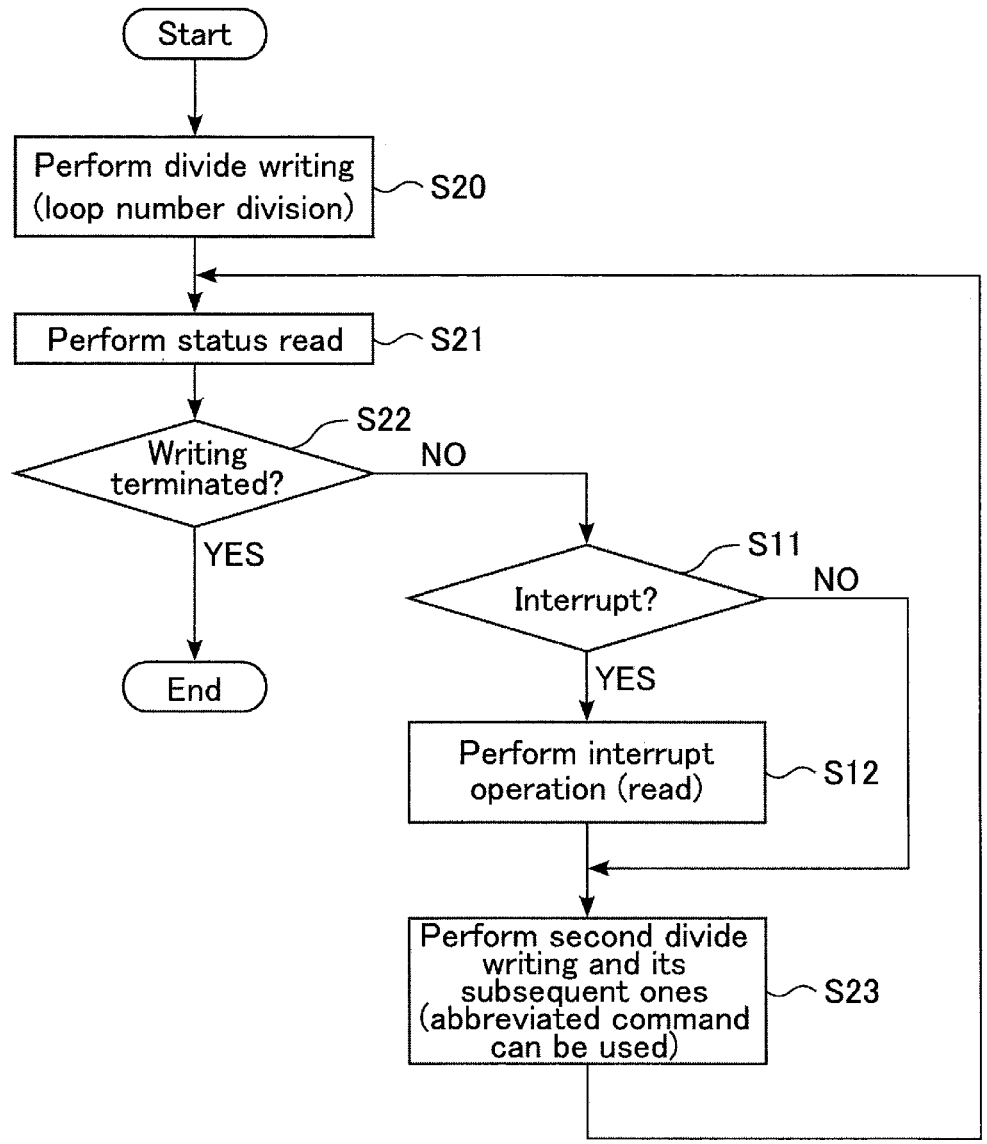
FIG. 14 is a flowchart showing an example of divide writing based on the program loop number in the memory system according to the first embodiment.

First, an outline of divide writing based on program loop number in the first embodiment will be described with reference to FIG. 14. FIG. 14 is a flowchart showing an example of divide writing based on the program loop number in the first embodiment.

As shown in FIG. 14, first, the memory system 1 performs divide writing based on the program loop number (loop number division) (step S20). In step S20, the sequencer 14 terminates the divide writing based on that a program loop is repeated a predetermined number of times.

When the divide writing in step S20 is terminated, the memory system 1 performs status read (step S21). In the status read, the memory controller 20 can know whether the write operation of the semiconductor memory 10 is completed, or whether data has passed in the "A"-, "B"- and "C"-level verification.

If the write operation is not completed (NO in step S22), the memory controller 20 confirms whether the host device 30 provides an instruction about an interrupt operation (step S11).

If an instruction about an interrupt operation is provided (YES in step S11), the memory system 1 performs the interrupt operation (step S12).

If no instruction about an interrupt operation is provided (NO in step S11) or if the interrupt operation in step S12 is terminated, the memory system 1 performs the continuance of the divide writing based on the program loop number (step S23).

Of the two or more divide writings based on the program loop number directed to a certain cell unit CU, the second divide writing and its subsequent ones may employ an abbreviated command (e.g. command "GO").

In step S23, the sequencer 14 terminates the divide writing based on that the program loop is repeated a predetermined number of times.

When the divide writing in step S23 is terminated, the flow returns to step S21, in which the memory system 1 performs status read. When the memory system 1 confirms that the write operation is not completed by the status read, it performs an interrupt operation when necessary and then performs the continuance of the divide writing.

As described above, when the divide writing is repeated and it is confirmed in step S22 that the write operation of the semiconductor memory 10 is completed, the memory system 1 terminates the write operation (YES in step S22).

Figure 15:
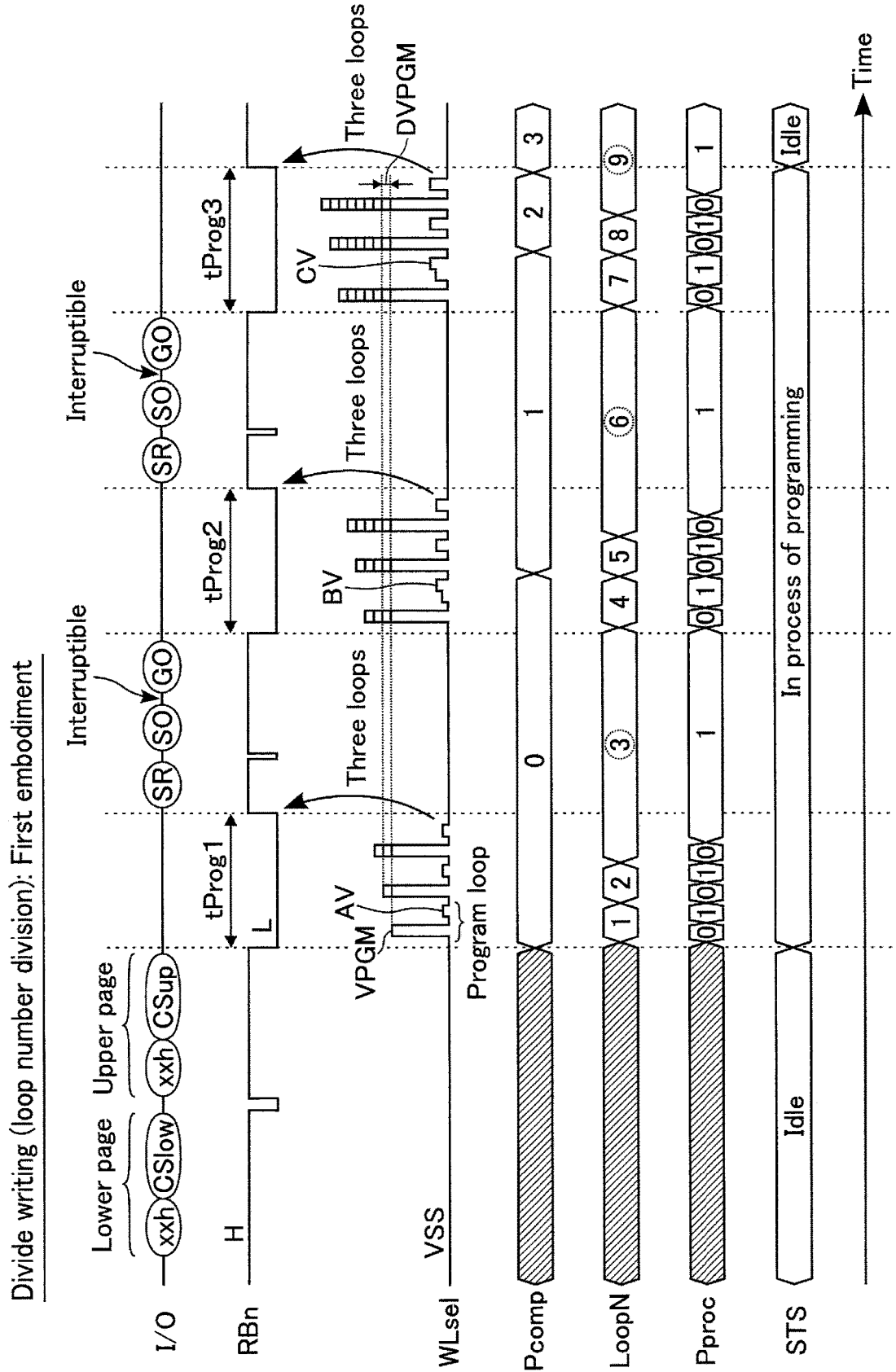
FIG. 15 is a timing chart showing an example of divide writing based on the program loop number in the memory system according to the first embodiment.

Then, divide writing based on the program loop number in the memory system 1 according to the first embodiment will be described in detail with reference to FIG. 15. FIG. 15 is a timing chart showing an example of the divide writing based on the program loop number in the memory system 1.

The divide writing shown in FIG. 15 differs from that shown in FIG. 13 in the timing with which the divide writing is terminated and the insertion of status read.

Specifically, a command sequence to perform the first divide writing based on the program loop number is similar to a command sequence to perform the "A"-level divide writing described with reference to FIG. 13.

Upon start of the first divide writing based on the program loop number, the sequencer 14 resets the numerical value. Pcomp to, e.g. "0" and repeats a program loop as in the normal writing. The sequencer 14 also changes the numerical values of Pcomp, LoopN and Pproc in accordance with the progress of the program loop as in the normal writing.

In the program loop to be repeated, the sequencer 14 causes the semiconductor memory 10 to make the transition from a busy state to a ready state based on that the program loop is executed, e.g. three times (3 loops), namely a program loop corresponding to LoopN whose numerical value is "3" is terminated. In other words, according to this modification, the sequencer 14 causes the semiconductor memory 10 to make the transition from a busy state to a ready state based on that a program loop corresponding to LoopN whose numerical value is "3×M (M is an integer of one or more)" is terminated. Note that the program loop number, which serves as a trigger to terminate the divide writing, can be set to an optional numerical value.

As described above, the sequencer 14 terminates the divide writing based on the number of times the program loop is executed, before data passes in the verification of the highest threshold level (e.g. "C" level).

When the memory controller 20 detects that the semiconductor memory 10 is rendered in a ready state from a busy state after the semiconductor memory 10 is instructed to perform the divide writing, it performs status read.

Specifically, the memory controller 20 transmits a status read command "SR" to the semiconductor memory 10. Upon receipt of the status read command "SR," the semiconductor memory 10 supplies the memory controller 20 with status information STS held in, e.g. the status register 18 ("SO" in FIG. 15).

In the example shown in FIG. 15, since the status of the semiconductor memory 10 represents "in the process of programming" after the termination of the first divide writing, if the memory controller 20 receives an instruction about an interrupt operation from the host device 30, it performs the interrupt operation with this timing ("Interruptible" in FIG. 15).

If no interrupt operation is performed or after the interrupt operation is terminated, the memory system 1 performs the continuance of the divide writing based on the program loop number.

Specifically, the memory controller 20 transmits, e.g. a command "GO" to the semiconductor memory 10. The divide writing based on the command "GO" in this example is similar to the divide writing in that the first program loop is set based on a threshold level. In the divide writing in this example, the condition for terminating the program loop is changed to the program loop number.

In other words, the sequencer 14 causes the semiconductor memory 10 to make the transition from a busy state to a ready state based on that the program loop is executed, e.g. three times (3 loops), or a program loop corresponding to LoopN whose numerical value is "6" is terminated, as in the foregoing first divide writing.

Then, the memory controller 20 performs status read and confirms whether the write operation of the semiconductor memory 10 is completed. When the status of the semiconductor memory 10 represent "in the process of programming," the continuance of the divide writing based on the program loop number is performed as described above. When the semiconductor memory 10 is rendered in "idle state," the write operation is terminated.

In the example shown in FIG. 15, when the divide writing is performed three times, the write operation of the semiconductor memory 10 is completed, or data passes in the "C"-level verification.

In FIG. 15, the time periods during which the semiconductor memory 10 is rendered in a busy state by performing the first, second and third divide writings are shown as tProg1, tProg2 and tProg3, respectively. The total length of tProg1, tProg2 and tProg3 is greater than tProg in the normal writing described with reference to FIG. 11.

Note that when a program loop is not executed the number of times that is set when data has passed in the verification of the highest threshold level, the semiconductor memory 10 may make the transition from a busy state to a ready state when the verification is terminated.

A series of operations described above corresponds to the divide writing based on the program loop number. In the memory system 1 according to the first embodiment, the divide writing based on the program loop number can bring about the same advantages as those of the divide writing based on a threshold level.

As another trigger to terminate each divide writing, there is processing time of the write operation. The processing time is managed by the sequencer 14 based on the number of counts of the timer 63.

Figure 16:
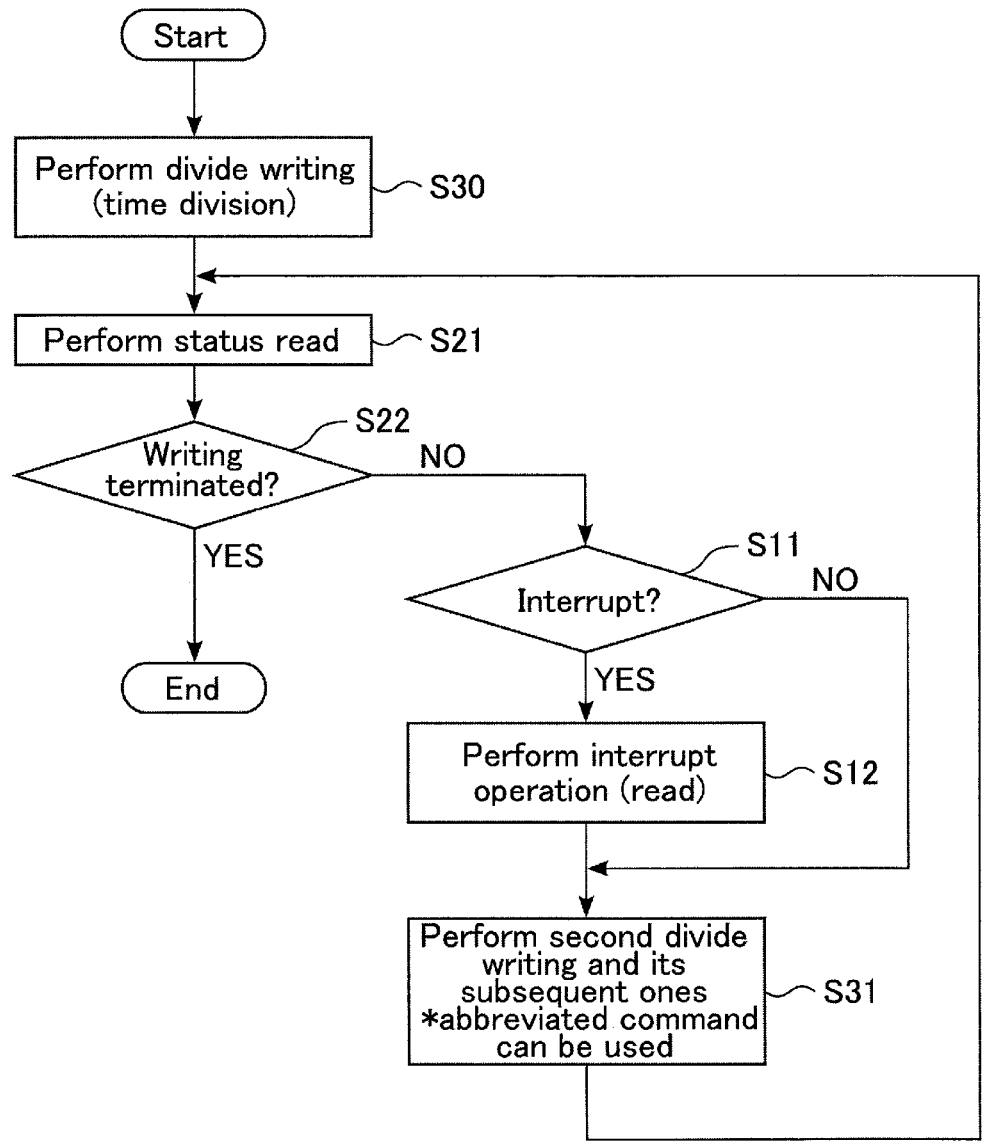
FIG. 16 is a flowchart showing an example of divide writing based on processing time in the memory system according to the first embodiment.

First, an outline of divide writing based on processing time in the first embodiment will be described with reference to FIG. 16. FIG. 16 is a flowchart showing an example of the divide writing based on processing time in the first embodiment.

As shown in FIG. 16, the divide writing based on processing time is similar to the divide writing based on the program loop number described with reference to FIG. 14, except that a trigger to terminate the divide writing is changed. Specifically, step S20 in FIG. 14 is replaced with step S30 and step S23 therein is replaced with step S31.

The memory system 1 performs the first divide writing (time division) based on processing time in step S30 and performs the second divide writing and its subsequent ones based on processing time in step S31.

Then, the divide writing based on processing time in the memory system 1 according to the first embodiment will be described in detail with reference to FIG. 17. FIG. 17 is a timing chart showing an example of divide writing based on processing time in the memory system 1. The divide writing shown in FIG. 17 differs from the drive writing based on the program loop number shown in FIG. 15 in the timing with which the divide writing is terminated and the display of count ("Timer") of the timer 63.

Specifically, as shown in FIG. 17, the numerical values of the timer 63 are counted in sequence from, e.g. "1" after the semiconductor memory 10 makes the transition from a ready state to a busy state to start divide writing.

Then, in the divide writing based on processing time, the sequencer 14 makes the transition from a busy state to a ready state based on that the count of the timer 63 becomes, e.g. "8." The invention is not limited to this operation. The number of counts of the timer 62, which serves as a trigger, namely the processing time of the divide writing can be set to an optional numerical value.

As described above, the sequencer 14 terminates the divide writing based on the processing time of the divide writing.

When the count of the timer 63 becomes a desired numerical value, if one of the program and verify operations is performed, the sequencer 14 terminates the operation and then causes the semiconductor memory 10 to make the transition from a busy state to a ready state.

When the divide writing based on the processing time has been performed, the semiconductor memory 10 may make the transition from a busy state to a ready state halfway through a program loop. Specifically, the operation performed before the termination of the divide writing is not always a verify operation but may be a program operation. In other words, the numerical value of Pproc after the termination of the divide writing may be "0" that indicates that a program operation has been performed.

In the divide writing based on processing time, for example, the sequencer 14 refers to Pproc, too when the semiconductor memory 10 receives a command "GO" and the sequencer 14 performs the continuance of the divide writing based on processing time. Then, the sequencer 14 determines which of the program and verify operations is started first in the first program loop in the divide writing.

Specifically, when the numerical value of Pproc prior to the start of the divide writing is "0" that indicates a program operation, the sequencer 14 first starts the verify operation based on the numerical values of Pcomp and LoopN at the end of the last divide writing.

When the numerical value of Pproc prior to the start of the divide writing is "1" that indicates a verify operation, the sequencer 14 first starts the program operation based on the numerical value of Pcomp at the end of the last divide writing and the numerical value obtained by incrementing the numerical value of LoopN at the end of the last divide writing.

Thus, even though the divide writing is terminated halfway through a program loop, the semiconductor memory 10 can appropriately select an operation to be performed first in the continuance of the divide writing. Since the other operations of the divide writing based on processing time are similar to the divide writing based on the program loop number described with reference to FIGS. 14 and 15, their descriptions will be omitted.

In the memory system 1 according to the first embodiment, the divide writing based on processing time in the write operation can also bring about the same advantages as those of the divide writing based on a threshold level.

When the divide writings are controlled to terminate using a program loop number or processing time as described above, their processing times are substantially the same.

In the present specification, the phrase "processing time of divide writing" means a time period during which the semiconductor memory 10 is rendered in a busy state, namely a time period during which the sequencer 14 is performing divide writing.

The sentence "processing times are substantially the same" means that in a plurality of divide writings to be performed when data is written to a cell unit CU in which write data is selected, a difference in processing time between the divide writings falls within the maximum processing time in one program loop.

The phrase "the maximum processing time in one program loop" means processing time in a program loop including a program operation and a verify operation in which all verify voltages (e.g. AV, BV and CV) are applied in sequence.

[2] SECOND EMBODIMENT

A memory system 1 according to a second embodiment has a configuration similar to that of the memory system 1 according to the first embodiment. In the memory system 1 according to the second embodiment, write data is input again in the second divide writing and its subsequent ones described in the first embodiment. Below are descriptions of different points of the memory system 1 according to the second embodiment from the memory system 1 according to the first embodiment.

[2-1] Write Operation

[2-1-1] Setting Output Operation and Setting Input Operation

In the memory system 1 according to the second embodiment, when divide writing is used in the write operation, a setting output operation and a setting input operation could be performed. The setting output operation and setting input operation will be each described below in detail.

Figure 18:
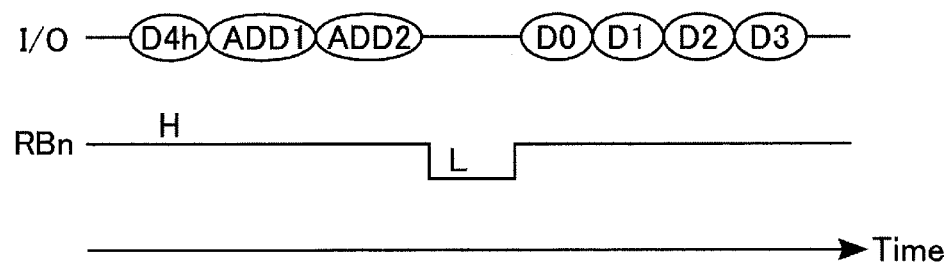
FIG. 18 is a timing chart showing an example of a setting output operation of a memory system according to a second embodiment.

FIG. 18 is a timing chart showing an example of a setting output operation of the memory system 1 according to the second embodiment, in which a command sequence and a ready busy signal RBn in the setting output operation are each exemplified.

As shown in FIG. 18, when the memory controller 20 provides the semiconductor memory 10 with an instruction about a setting output operation, it transmits, e.g. a command "D4h," address information "ADD1" and address information "ADD2" in sequence to the semiconductor memory 10.

The command "D4h" is a command to provide the semiconductor memory 10 with an instruction about a setting output operation. The address information "ADD1" and address information "ADD2" in FIG. 18 are each an address corresponding to the setting which the memory controller 20 requests the semiconductor memory 10 to output.

Upon receipt of the foregoing command and address information, the semiconductor memory 10 makes the transition from a ready state to a busy state and the sequencer 14 renders the setting information required by the memory controller 20 in an outputtable state. Then, the sequencer 14 causes the semiconductor memory 10 to make the transition from a busy state to a ready state.

Detecting that the semiconductor memory 10 has made the transition from a busy state to a ready state, the memory controller 20 causes the semiconductor memory 10 to output the setting information. In FIG. 18, data "D0," "D1," "D2" and "D3" are shown as the setting information output from the semiconductor memory 10. The data "D0" to "D3" includes the setting information of the semiconductor memory 10 based on the address information "ADD1" and "ADD2."

Figure 19:
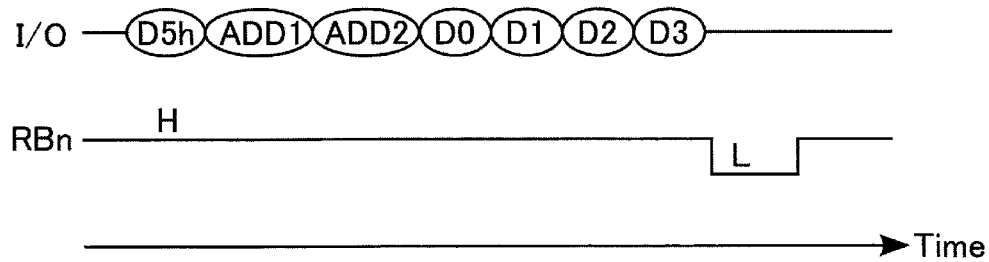
FIG. 19 is a timing chart showing an example of a setting input operation of the memory system according to the second embodiment.

FIG. 19 is a timing chart showing an example of a setting input operation of the memory system 1 according to the second embodiment, in which a command sequence and a ready busy signal RBn in the setting input operation are each exemplified.

As shown in FIG. 19, when the memory controller 20 provides the semiconductor memory 10 with an instruction about a setting input operation, it transmits, e.g. a command "D5h," address information "ADD1," address information "ADD2" and data "D0" to "D3" in sequence to the semiconductor memory 10.

The command "D5h" is a command to provide the semiconductor memory 10 with an instruction about a setting input operation. The address information "ADD1"

and address information "ADD2" in FIG. 19 are each an address corresponding to a setting which the memory controller 20 requests the semiconductor memory 10 to change. The data "D0" to "D3" in FIG. 18 each include setting information corresponding to a setting corresponding to the address information "ADD1" and "ADD2."

Upon receipt of the foregoing command, address information and data, the semiconductor memory 10 makes the transition from a ready state to a busy state and the sequencer 14 rewrites the setting information required by the memory controller 20.

Specifically, the setting information included in the data "D0" to "D3" is applied to the setting corresponding to the address information "ADD1" and "ADD2." The sequencer 14 applies the input setting information, namely changes the setting and then causes the semiconductor memory 10 to make the transition from a busy state to a ready state.

As data (setting information) in the setting output operation and setting input operation described above, data as shown in, e.g. FIGS. 20-22 is used.

FIG. 20 shows an example of setting information on the program loop number (loop number count) in the memory system 1 according to the second embodiment. The program loop number is allocated to, e.g. data "D0" in the setting output operation and setting input operation.

As shown in FIG. 20, when an input/output signal is 8 bits ([7] to [0] bits), for example, the binary numerical value represented by 8-bit data indicates the program loop number. Specifically, when the [7] to [0] bits are all "0," the program loop number is "0." When the [7] to [0] bits are all "1," the program loop number is "255."

In the setting output operation, the numerical value of LoopN held in the loop number register 61 is supplied to the memory controller 20 as setting information of the program loop number. In the setting input operation, the numerical value representing the setting information of the program loop number is set as the numerical value of LoopN held in the loop number register 61.

FIG. 21 shows an example of setting information on a write completion flag in the memory system 1 according to the second embodiment. The write completion flag is allocated to data, e.g. data "D1" in the setting output operation and setting input operation.

As shown in FIG. 21, when an input/output signal is 8 bits ([7] to [0] bits), for example, "A"-level, "B"-level and "C"-level write completion flags are allocated to [0] to [2] bits, and [3] to [7] bits are unused.

When the write completion flag is "0," the verification of a threshold level corresponding to the flag is not completed. In other words, the threshold level represents the process of writing. When the write completion flag is "1," the verification of a threshold level corresponding to the flag is completed. In other words, the writing of the threshold level is completed.

In the setting output operation, when the numerical value of Pcomp held in the progress recording register 60 is "0," the [0] to [2] bits are each set to "0." When the numerical value of Pcomp is "1," the [0] bit is set to "1" and the [1] and [2] bits are each set to "0." When the numerical value of Pcomp is "2," the [0] and [1] bits are set to "1" and the [2] bit is set to "0." When the numerical value of Pcomp is "3," the [0] to [2] bits are each set to "1."

The setting input operation is opposite to the setting output operation described above. Specifically, in the setting input operation, when the [0] to [2] bits are each "0," the numerical value of Pcomp held in the progress recording register 60 is set to "0." When the "0" bit is "1" and the [1] and [2] bits are each "0," the numerical value of Pcomp held in the progress recording register 60 is set to "1." When the "0" and "1" bits are each "1" and the [2] bit is "0," the numerical value of Pcomp held in the progress recording register 60 is set to "2."

FIG. 22 shows an example of setting information on an operation distinction parameter in the memory system 1 according to the second embodiment. The operation distinction parameter is allocated to, e.g. the data "D2" in the setting out operation and the setting input operation.

As shown in FIG. 22, when an input/output signal is 8 bits ([7] to [0] bits), for example, operation information at the end of the divide writing (referred to as operation information hereinafter) is allocated to [0] bit, and [1] to [7] bits are unused.

When the operation information is "0," it indicates that the operation at the end of the divide writing is a program operation. When the operation information is "1," it indicates that the operation at the end of the divide writing is a verify operation.

In the setting output operation, the numerical value of Pproc held in the operation determination register 62 is supplied to the memory controller 20 as setting information of the program loop number. In the setting input operation, the numerical value representing an operation distinction parameter is set as the numerical value of Pproc held in the operation determination register 62.

Note that the setting input operation and the setting output operation are not limited to the use described above. For example, the semiconductor memory 10 may be operated to perform divide writing even though the command "xxh" is not input by the setting input operation. The memory controller 20 may change the setting of the default operation of the semiconductor memory 10 to various settings by making the use of the setting input operation.

[2-1-2] Divide Writing

The memory system 1 according to the second embodiment performs divide writing as in the first embodiment and can perform an operation other than the read operation in an interrupt operation between the divide writings.

Figure 23:
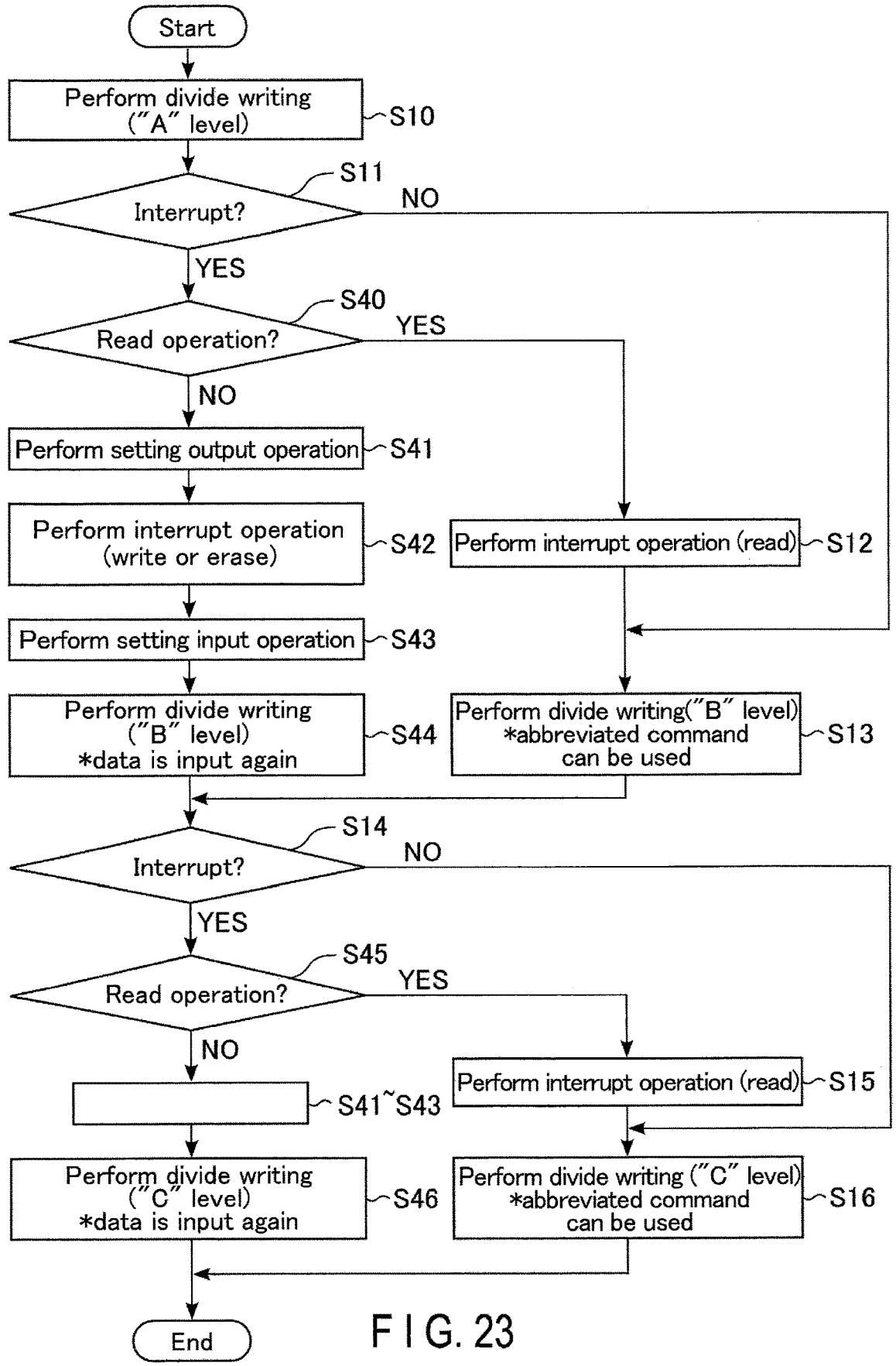
FIG. 23 is a flowchart showing an example of divide writing based on a threshold level in the memory system according to the second embodiment.

First, an outline of divide writing (level division) based on a threshold level in the memory system 1 according to the second embodiment, will be described with reference to FIG. 23. FIG. 23 is a flowchart showing an example of divide writing based on a threshold level in the memory system 1 according to the second embodiment.

As shown in FIG. 23, first, the processes of steps S10 and S11 described in the first embodiment are performed. Specifically, the semiconductor memory 10 performs "A"-level divide writing (step S10) and the memory controller 20 confirms the presence or absence of an interrupt operation after the termination of the divide writing.

When an instruction about an interrupt operation is provided (YES in step S11), the memory controller 20 confirms whether the interrupt operation is a read operation (step S40).

When the interrupt operation is a read operation (YES in step S40), the memory controller 20 instructs the semiconductor memory 10 to perform the read operation (step S12).

When the interrupt operation is not a read operation (NO in step S40), the memory controller 20 performs a setting output operation as described with reference to FIG. 18 and causes the semiconductor memory 10 to output setting information for divide writing (step S41).

The memory controller 20 holds the setting information, which is output from the semiconductor memory 10, in, e.g. the RAM 23. In other words, in this operation, the setting information for divide writing that the semiconductor memory 10 performs after the interrupt operation, is saved in an external storage area of the semiconductor memory 10. Note that the area in which the setting information is stored is not limited to the RAM 23. The memory controller 20 may hold the setting information in another storage area.

Then, the memory controller 20 and the semiconductor memory 10 perform an interrupt operation (step S42). In this interrupt operation, for example, a write operation and an erase operation are performed. When these operations are performed, write data corresponding to the divide writing in step S10, which is held in each latch circuit in the sense amplifier module 17, is erased.

As the write operation performed in the interrupt operation in step S42, there is, for example, the normal writing described with reference to FIG. 11. In step S42, two or more write operations may consecutively be performed or two or more erase operations may be performed. Alternatively, both the write and erase operations may be performed.

When the interrupt operation in step S42 is terminated, the memory controller 20 performs a setting input operation as described with reference to FIG. 19 and causes the semiconductor memory 10 to restore the setting information corresponding to the divide writing in step S10 (step S43).

Then, the memory controller 20 instructs the semiconductor memory 10 to perform "B"-level divide writing (step S44). The memory controller 20 inputs the write data, which is input to the semiconductor memory 10 in step S10, to the semiconductor memory 10 again.

In each of the case where there is no interrupt operation in step S11 (NO in step S11) and the case where the interrupt operation is terminated in step S12, the process of step S13 described in the first embodiment is performed. In other words, the memory system 1 performs the "B"-level divide writing in which, e.g. an abbreviated command is used.

When the process in step S44 or S13 is terminated, namely when the "B"-level divide writing is terminated, the memory controller 20 confirms the presence or absence of an interrupt operation again (step S14).

When an interrupt operation is present (YES in step S14), the memory controller 20 confirms whether the interrupt operation is a read operation (step S45) like the process of step S40.

When the interrupt operation is a read operation (YES in step S45), the memory controller 20 instructs the semiconductor memory 10 to perform the read operation (step S15).

When the interrupt operation is not a read operation (NO in step S45), the memory system 1 performs operations similar to those in steps S41 to S43 described above. Specifically, when the setting information for divide writing is saved in the memory controller 20, an interrupt operation such as a write operation and an erase operation is performed. When the interrupt operation is terminated, the setting information for divide writing saved in the memory controller 20 is restored in the semiconductor memory 10.

Then, the memory controller 20 instructs the semiconductor memory 10 to perform "C"-level divide writing (step S46). The memory controller 20 inputs the write data, which is input to the semiconductor memory 10 in step S10, to the semiconductor memory 10 again.

In each of the case where there is no interrupt operation in step S14 (NO in step S14) and the case where the interrupt operation is terminated in step S15, the process of step S16 described in the first embodiment is performed. In other words, the memory system 1 performs the "C"-level divide writing in which, e.g. an abbreviated command is used.

Figure 24:
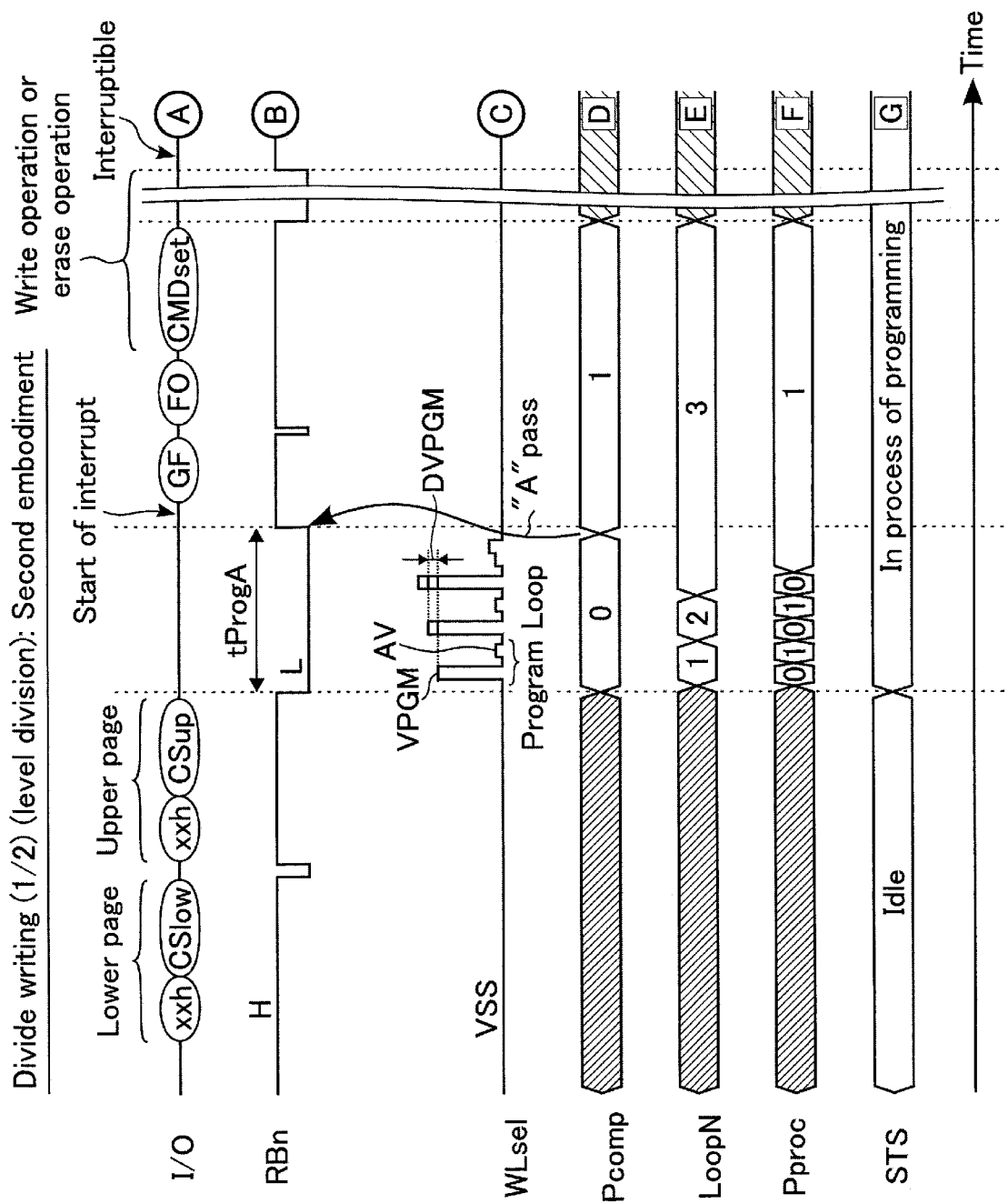
FIG. 24 is a timing chart showing an example of divide writing based on a threshold level in the memory system according to the second embodiment.

Divide writing based on a threshold level in the second embodiment will be described in detail with reference to FIGS. 24 and 25. FIGS. 24 and 25 are each a timing chart showing an example of divide writing based on a threshold level in the memory system 1.

FIG. 25 (divide writing (2/2)) shows an operation subsequent to the operation shown in FIG. 24 (divide writing (1/2)). FIGS. 24 and 25 show a write operation or an erase operation performed as an interrupt operation in the divide writing based on a threshold level described with reference to FIG. 13. In FIG. 25, an operation corresponding to the "C"-level divide writing is omitted.

As shown in FIG. 24, the "A"-level divide writing and a command sequence to perform the "A"-level divide writing are similar to those described with reference to FIG. 13 and thus their detailed descriptions will be omitted.

In this embodiment, when the semiconductor memory 10 makes the transition from a busy state to a ready state after the "A"-level divide writing is terminated, an interrupt operation including a write operation and an erase operation is performed. In other words, the memory controller 20 receives an instruction about the interrupt operation including a write operation and an erase operation from the host device 30.

In this case, the memory controller 20 performs the setting output operation described with reference to FIG. 18. Specifically, the memory controller 20 transmits, e.g. a command "D4h," address information "ADD1" and address information "ADD2" in sequence to the semiconductor memory 10. FIG. 24 shows a command set "GF" from which a detailed command sequence to perform the setting output operation is omitted.

The semiconductor memory 10 that has received the command set "GF" makes transition to a busy state temporarily and brings the setting information based on the address information "ADD1" and address information "ADD2" into an outputtable state. Then, the memory controller 20 outputs the setting information when the semiconductor memory 10 is brought into a ready state.

FIG. 24 shows the setting information "FO" from which the setting information to be output is omitted. The setting information "FO" includes the numerical values of, e.g. Pcomp, LoopN and Pproc. The setting information "FO" is held (saved) in the storage area (e.g. RAM 23) in the memory controller 20.

Then, the memory controller 20 transmits a command set ("CMDset") about an interrupt operation to the semiconductor memory 10. Upon receipt of the command set, the semiconductor memory 10 makes the transition from a ready state to a busy state to perform a write operation or an erase operation. Note that FIG. 24 does not show the interrupt operation in detail.

When the interrupt operation is terminated, the semiconductor memory 10 is brought into a ready state and the memory controller 20 confirms the presence or absence of the interrupt operation again. When the interrupt operation is absent, the memory controller 20 restarts the write operation as shown in FIG. 25.

Specifically, first, the memory controller 20 performs the setting input operation described with reference to FIG. 19. The memory controller 20 transmits, e.g. a command "D5h," address information "ADD1," address information "ADD2" and data "D0" to "D3" in sequence to the semiconductor memory 10. FIG. 24 shows a command set "SF" from which a detailed command sequence to perform the setting input operation is omitted. The data "D0" to "D3" included in the command set "SF" includes setting information "FO" that is saved in the storage area in the memory controller 20.

The semiconductor memory 10 that has received the command set "SF" makes the transition to a busy state temporarily and restore the setting information about divide writing based on the address information "ADD1" and "ADD2" and the data "D0" to "D3."

Specifically, since, in one example shown in FIGS. 24 and 25, the numerical values of Pcomp, LoopN and Pproc after the termination of the "A"-level divide writing are "1," "3" and "1," respectively, they are set in the progress recording register 60, loop number register 61 and operation determination register 62, respectively.

After that, the memory controller 20 transmits a command set corresponding to the subsequent divide writing to the semiconductor memory 10.

Specifically, the memory controller 20 transmits a command "xxh," a command "01h," a command "80h," address information ADD, lower page write data (Din) and a command "1Ah" in sequence to the semiconductor memory 10.

The lower page write data is the same as that included in the command set CSlow shown in FIG. 24. The lower page write data is transferred from the semiconductor memory 10 to the latch circuit XDL of the sense amplifier unit SAU in the sense amplifier module 17.

Upon receipt of the command "1Ah," the semiconductor memory 10 makes the transition temporarily from a ready state to a busy state. Then, the sequencer 14 transfers the lower page write data from the latch circuit XDL to the latch circuit LDL in the sense amplifier unit SAU.

Then, the memory controller 20 transmits a command "xxh," a command "02h," a command "80h," address information ADD, upper page write data (Din) and a command "GO" in sequence to the semiconductor memory 10.

The upper page write data is the same as that included in the command set CSup shown in FIG. 24. The upper page write data is transferred from the semiconductor memory 10 to the latch circuit XDL of the sense amplifier unit SAU in the sense amplifier module 17.

Upon receipt of the command "GO," the semiconductor memory 10 makes the transition from a ready state to a busy state. Then, the sequencer 14 transfers the upper page write data from the latch circuit XDL to the latch circuit UDL in the sense amplifier unit SAU.

Then, the sequencer 14 performs "B"-level divide writing based on the received command CMD, address information ADD, lower page write data and upper page write data.

Specifically, first, the sequencer 14 restores the state of a latch circuit in the sense amplifier module 17 to a state in which the "A"-level divide writing has been terminated. This operation is shown in detail in FIG. 26. FIG. 26 shows an example of a method of restoring information in the latch circuits based on the numerical value of Pcomp, in which upper bit data and lower bit data are held in the latch circuits LDL and UDL, respectively.

As shown in FIG. 26, when the numerical value of Pcomp is "0," the sequencer 14 maintains the write data in the latch circuits as it is ((1) in FIG. 26).

When the numerical value of Pcomp is "1," the sequencer 14 changes the data held in the latch circuits LDL and UDL to become similar to the write data corresponding to the "ER" level for the sense amplifier unit SAU that holds the write data corresponding to the "A" level ((2) in FIG. 26).

When the numerical value of Pcomp is "2," the sequencer 14 changes the data held in the latch circuits LDL and UDL to become similar to the write data corresponding to the "ER" level for each of the sense amplifier unit SAU that holds the write data corresponding to the "A" level and the sense amplifier unit SAU that holds the write data corresponding to the "B" level ((3) in FIG. 26).

Restoring the state of the latch circuits based on the numerical value of Pcomp as described above, the sequencer 14 prevents a program operation from being performed again for a memory cell transistor MT that has passed in verification in the already-performed divide writing (e.g. "A"-level divide writing).

Like in the first embodiment, the sequencer 14 sets a program voltage VPGM based on the numerical value of LoopN. Specifically, the program voltage is set at a value calculated by the following equation:

$$VPGM = VPGM\text{init} + (LoopN-1)*DVPGM$$

Since the other operation of the divide writing based on a threshold level in the memory system 1 according to the second embodiment is similar to the divide writing based on a threshold level in the memory system 1 according to the first embodiment, its description will be omitted.

Note that the command "GO" used in the second embodiment may be the same as or different from the command "GO" used in the first embodiment. In the memory system 1 according to the second embodiment, the command "GO" is used, irrespective of whether address information and write data are input or not, when the second divide writing and its subsequent ones are performed.

In the second divide writing and its subsequent ones that do not involve data input, the command "GO" can be used alone or a command set can be used along with address input. With the address input, for example, a command set including a set of commands "xxh" and "01h" and address information ADD and "1Ah" corresponding to the lower page and a set of a command "02h" and address information ADD and "10h" corresponding to the upper page, is used.

In the second divide writing and its subsequent ones that involves data input, address input can be omitted. In this case, for example, a command set including a set of commands "xxh" and "01h," lower page data and "1Ah" and a set of a command "02h," upper page data and "10h" is used.

[2-2] Advantages of Second Embodiment

Unlike in the first embodiment, the memory system 1 according to the second embodiment is allowed to perform a write operation and an erase operation as an interrupt operation between divide writings, as described above.

In the memory system 1 according to the second embodiment, when a write operation and an erase operation are performed as an interrupt operation, a setting output operation and a setting input operation are respectively inserted before and after the interrupt operation.

The memory system 1 according to the second embodiment can thus restore the parameters of different registers in the last divide writing. Since the memory controller 20 inputs write data to the semiconductor memory 10 again, the semiconductor memory 10 can continuously perform divide writing similar to that of the first embodiment.

Therefore, the memory system 1 according to the second embodiment makes it possible to increase the number of types of interrupt operation that can be performed and thus shorten latency, irrespective of the type of interrupt operation to be performed.

[2-3] Modification to Second Embodiment

In the second embodiment, divide writing is performed based on a threshold level. The invention is not limited to this operation. For example, as a trigger to terminate divide writing in the second embodiment, the program loop number and the processing time may be used as in the first embodiment.

Figure 27:
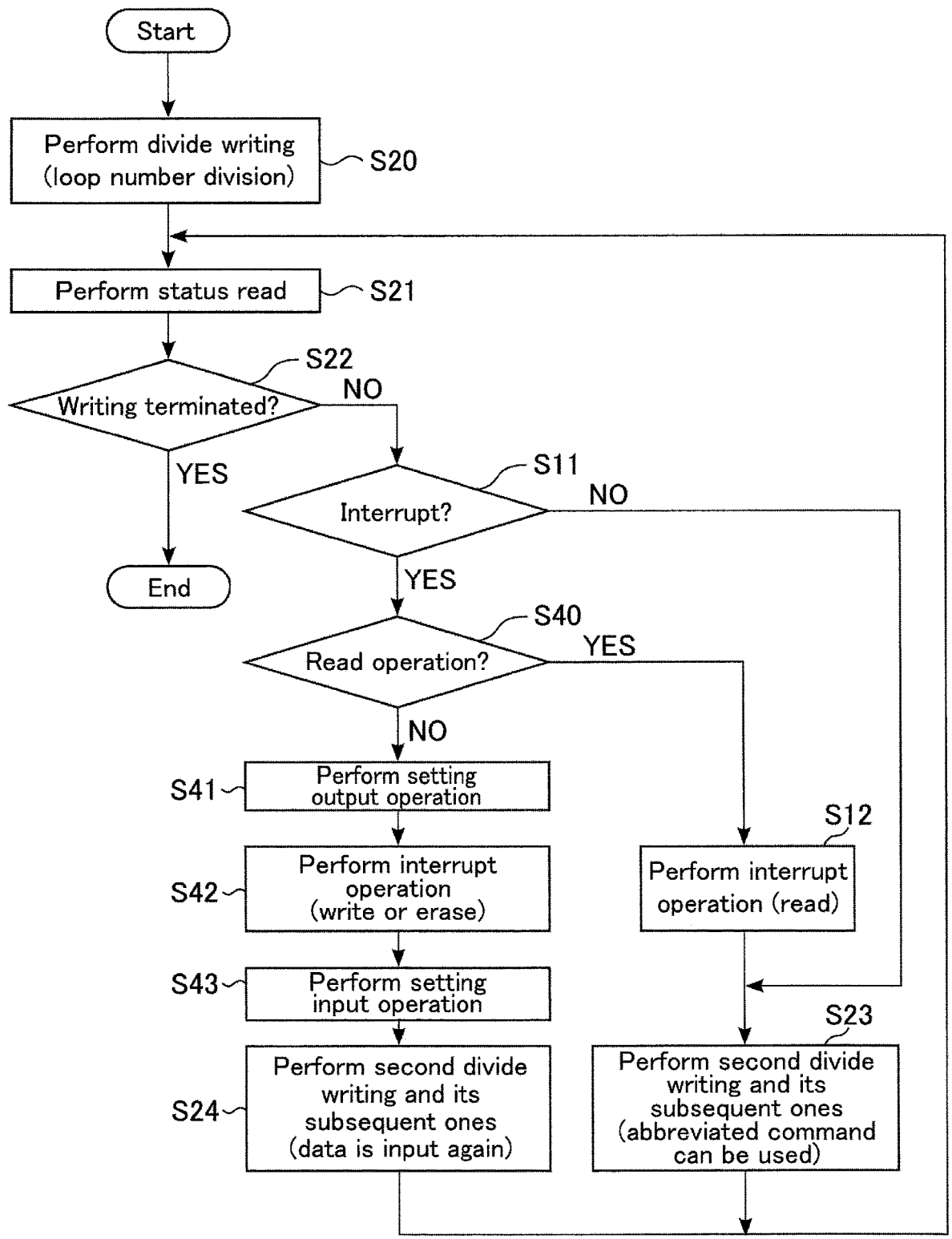
FIG. 27 is a flowchart showing an example of divide writing based on the program loop number in the memory system according to the second embodiment.

FIG. 27 is a flowchart showing an example of divide writing based on the program loop number in the memory system 1 according to the second embodiment. As shown in FIG. 27, the divide writing based on the program loop number in the second embodiment differs from that in the first embodiment shown in FIG. 14 in the operations after step S11.

Specifically, when an instruction about an interrupt operation is provided (YES in step S11), the sequencer 14 performs the process of step S40 described with reference to FIG. 23.

When the interrupt operation is a read operation (YES in step S40), the memory controller 20 instructs the semiconductor memory 10 to perform the read operation (step S12).

When the interrupt operation is not a read operation (NO in step S40), the memory controller 20 performs the process of step S41 and causes the semiconductor memory 10 to output setting information for divide writing. The memory controller 20 holds the setting information in, e.g. the RAM 23.

Then, the memory controller 20 and the semiconductor memory 10 perform the process of step S42 and perform an interrupt operation including at least one of the write and erase operations. When the interrupt operation of step S42 is terminated, the memory controller 20 performs the process of step S43 to cause the semiconductor memory 10 to restore the setting information for divide writing.

After that, the memory controller 20 instructs the semiconductor memory 10 to perform the continuance of the divide writing based on the program loop number, namely the second divide writing and its subsequent ones (step S24). In the divide writing in step S24, write data used in step S20 is input again.

In each of the case where there is no interrupt operation in step S11 and the case where the process is terminated in step S12, the sequencer 14 performs the process of step S23 described with reference to FIG. 14. In other words, the sequencer 14 performs the continuance of the divide writing based on the program loop number.

When the process of step S23 or S24 is terminated, the memory system 1 returns to step S21 to perform status read. Since the other detailed operation of the divide writing based on the program loop number in the second embodiment is similar to the operation in the first embodiment described with reference to FIGS. 14 and 15, its description will be omitted.

FIG. 28 is a flowchart showing an example of divide writing based on the processing time in the memory system 1 according to the second embodiment. As shown in FIG. 28, the divide writing based on the processing time in the second embodiment is similar to the divide writing based on the program loop number in the second embodiment described with reference to FIG. 27 in which the processing time is used in place of a trigger to terminate each divide writing.

Specifically, step S20 in FIG. 27 is replaced with step S30, step S23 in FIG. 27 is replaced with step S31, and step S24 in FIG. 27 is replaced with step S32.

In step S32, the memory system 1 performs divide writing that involves inputting write data again as in step S24. Since the other detailed operation of the divide writing based on the processing time in the second embodiment is similar to the combination of the operation described with reference to FIG. 27 and the operation in the first embodiment described with reference to FIGS. 14 and 15, its description will be omitted.

[3] THIRD EMBODIMENT

The memory system 1 according to a third embodiment has a configuration similar to that of the memory system 1 according to the first embodiment. The memory system 1 according to the third embodiment employs a single-level cell (SLC) cache in divide writing as described in the first and second embodiments. Below are descriptions of different points of the memory system 1 according to the third embodiment from the memory system 1 according to the first embodiment.

[3-1] Write Operation

The memory system 1 according to the third embodiment performs divide writing as a write operation and employs the SLC cache.

The SLC cache corresponds to a cell unit CU that stores data of one page. When data of two or more pages is stored in a cell unit CU of a desired address in the write operation, the SLC cache is used as a cache area that stores data temporarily before the data is written to the cell unit.

Figure 29:
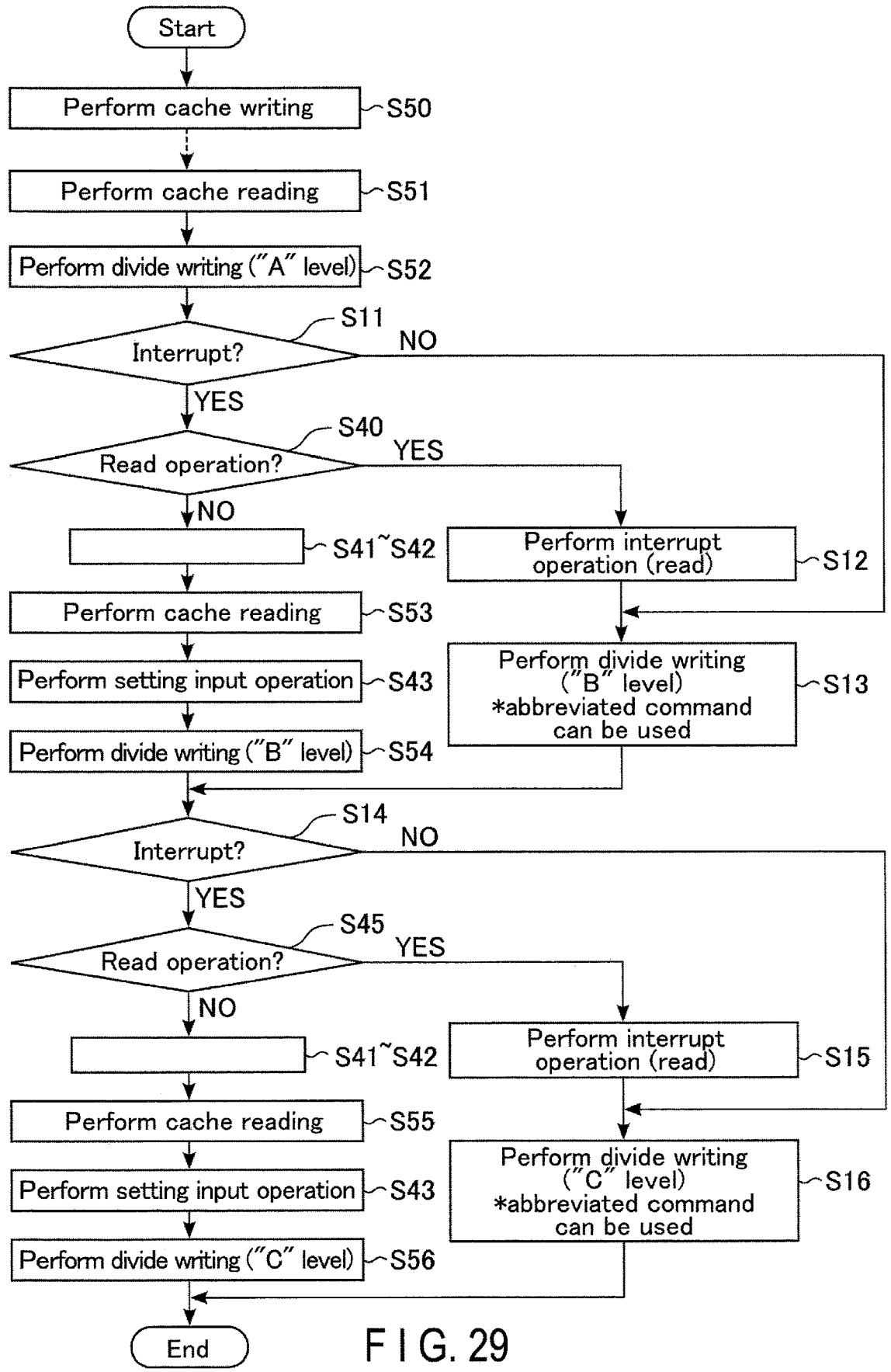
FIG. 29 is a flowchart showing an example of divide writing based on a threshold level in a memory system according to a third embodiment.

First, an outline of divide writing (level dividing) based on a threshold level in the memory system 1 according to the third embodiment will be described with reference to FIG. 29. FIG. 29 is a flowchart showing an example of the divide writing based on a threshold level in the memory system 1 according to the third embodiment.

As shown in FIG. 29, first, the memory system 1 performs cache writing (step S50). In the cache writing, the memory controller 20 designates a storage area used as the SLC cache and instructs the semiconductor memory 10 to perform a one-page data write operation two or more times. In response to the instruction from the memory controller 20, the semiconductor memory 10 performs the one-page data write operation two or more times.

After that, if there is room for the process, the memory controller 20 reads data out of the SLC cache and writes data of two or more pages to a cell unit of a desired address in step S50.

Specifically, the memory system 1 first performs cache reading (step S51). In the cache reading, the memory controller 20 instructs the semiconductor memory 10 to perform a read operation in which an SLC cache is designated.

For example, when data of two pages is written to one cell unit CU, two read operations are performed. By the cache reading, the written data of two page is held in a latch circuit in the sense amplifier module 17.

Then, the memory controller 20 instructs the semiconductor memory 10 to perform "A"-level divide writing using the data read out of the SLC cache (step S52).

When the "A"-level divide writing is terminated, the memory controller 20 performs the process of step S11 to confirm the presence or absence of an interrupt operation.

When an instruction about an interrupt operation is provided (YES in step S11), the memory controller 20 performs the process of step S40 to confirm whether the interrupt operation is a read operation.

When the interrupt operation is a read operation (YES in step S40), the memory controller 20 performs the process of step S12 to instructs the semiconductor memory 10 to perform the read operation.

When the interrupt operation is not a read operation (NO in step S40), the memory system 1 performs a process similar to those of steps S41 and S42 described above. In other words, the memory system 1 saves the setting information for divide writing in the memory controller 20 and then performs an interrupt operation such as a write operation and an erase operation.

Then, the memory controller 20 instructs the semiconductor memory 10 to perform cache reading as in step S51 to restore, e.g. write data of two pages in a latch circuit in the sense amplifier module 17 (step S53).

When the cache reading is terminated, the memory controller 20 performs the setting input operation of step S43 to restore the setting information for divide writing, which is saved in the memory controller 20, in the semiconductor memory 10. After that, the memory controller 20 instructs the semiconductor memory 10 to perform the "B"-level divide writing (step S54).

When there is no interrupt operation in step S11 (NO in step S11) and the case where the interrupt operation is terminated in step S12, the process of step S13 described in the first embodiment is performed. In other words, the memory system 1 performs the "B"-level divide writing in which, e.g. an abbreviated command is used.

When the process is terminated in step S53 or S13, namely when the "B"-level divide writing is terminated, the memory controller 20 confirms the presence or absence of an interrupt operation again (step S14).

When there is an interrupt operation (YES in step S14), the memory controller 20 confirms whether the interrupt operation is a read operation (step S45) like the process of step S40.

When the interrupt operation is a read operation (YES in step S45), the memory controller 20 instructs the semiconductor memory 10 to perform the read operation (step S15).

When the interrupt operation is not a read operation (NO in step S45), the memory system 1 performs operations similar to those in steps S41 and S42 described above. Specifically, when the setting information for divide writing is saved in the memory controller 20, an interrupt operation such as a write operation and an erase operation is performed.

The memory controller 20 instructs the semiconductor memory 10 to perform cache reading as in step S51 to restore, e.g. write data of two pages in a latch circuit in the sense amplifier module 17 (step S55).

When the cache reading is terminated in step S54, the memory controller 20 performs the setting input operation of step S43 to restore the setting information for divide writing, which is saved in the memory controller 20, in the semiconductor memory 10.

After that, the memory controller 20 instructs the semiconductor memory 10 to perform the "C"-level divide writing (step S56).

When there is no interrupt operation in step S14 (NO in step S14) and the case where the interrupt operation is terminated in step S15, the process of step S16 described in the first embodiment is performed. In other words, the memory system 1 performs the "C"-level divide writing in which, e.g. an abbreviated command is used.

Figure 30:
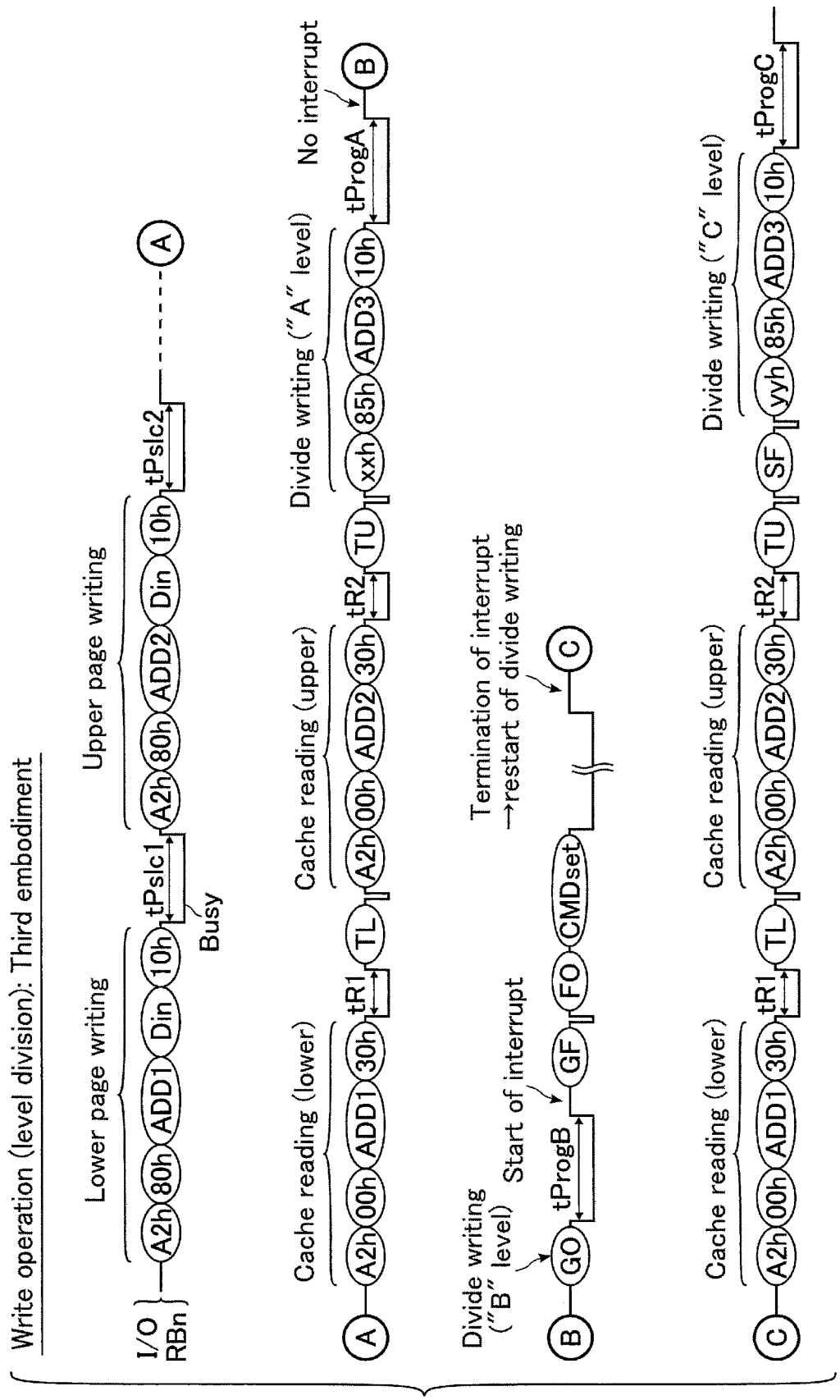
FIG. 30 is a timing chart showing an example of a command sequence of divide writing based on a threshold level in the memory system according to the third embodiment.

The divide writing based on a threshold level in the memory system 1 according to the third embodiment will be described in detail with reference to FIG. 30. FIG. 30 is a timing chart showing an example of the divide writing based on a threshold level in the memory system 1 according to the third embodiment, in which a command sequence and a ready busy signal RBn in the divide writing are exemplified.

As shown in FIG. 30, first, the memory controller 20 transmits a command "A2h," a command "80h," address information ADD1, lower page write data (Din) and a command "10h" in sequence to the semiconductor memory 10. The command "A2h" is a command to instruct the semiconductor memory 10 to perform an operation about an SLC. The address information ADD1 includes an address to designate a cell unit CU of a cache area.

The lower page write data received by the semiconductor memory 10 is transferred to the latch circuit XDL of the sense amplifier unit SAU in the sense amplifier module 17. Upon receipt of the command "10h," the semiconductor memory 10 makes the transition from a ready state to a busy state.

Accordingly, the sequencer 14 performs an SLC write operation (lower page data cache writing) based on the received command CMD, address information ADD1 and lower page write data.

Since a program loop executed in the SLC write operation is similar to that in the MLC write operation (2 bit/cell) described with reference to FIG. 11 in which the type of verify voltage to be used is one, its description will be omitted.

Note that the SLC write operation and the MLC write operation may differ from each other in program voltage VPGM, step-up width DVPGM and verify voltage Av which are to be used.

When the lower page data cache writing is terminated, the semiconductor memory 10 makes the transition from a busy state to a ready state. Subsequently, the memory controller 20 instructs the semiconductor memory 10 to perform cache writing for upper page data.

The upper page data cache writing corresponds to the lower page data cache writing in which address information to be designated and write data to be input are changed. The address information ADD2 designated by the upper page data cache writing differs from the address information ADD1. Since the other operations of the upper page data cache writing are similar to the lower page data cache writing, their descriptions will be omitted.

In FIG. 30, the time for which the semiconductor memory 10 has performed the foregoing lower page data cache writing and the time for which the semiconductor memory 10 has performed the foregoing upper page data cache writing are represented as tPslc1 and tPslc2, respectively.

After that, if there is room for the process, the memory controller 20 performs divide writing of two or more pages using data written to the cache. The memory controller 20 instructs the semiconductor memory 10 to read lower page data and upper page data.

Specifically, first, the memory controller 20 transmits a command "A2h," a command "00h," address information ADD1 and a command "30h" in sequence to the semiconductor memory 10.

Upon receipt of the command "30h," the semiconductor memory 10 makes the transition from a ready state to a busy state. Accordingly, the sequencer 14 performs an SLC read operation (lower page data cache reading) based on the received command CMD and address information ADD1.

Since the SLC read operation is similar to the read operation (2 bit/cell lower page reading) described with reference to FIG. 10 in which a read voltage to be used is changed, its detailed description will be omitted.

The data read out by the lower page data cache reading is transferred to, e.g. the latch circuit XDL. When the lower page data cache reading is terminated, the semiconductor memory 10 makes the transition from a busy state to a ready state.

Subsequently, the memory controller 20 transmits a command "TL" to the semiconductor memory 10. The command "TL" is a command to instruct the semiconductor memory 10 to transfer data between latch circuits.

Upon receipt of the command "TL," the semiconductor memory 10 is temporarily rendered in a busy state and the sequencer 14 transfers, e.g. the lower page data from the latch circuit XDL to the latch circuit LDL in the sense amplifier module 17.

Then, the memory controller 20 transmits a command "A2h," a command "00h," address information ADD1 and a command "30h" in sequence to the semiconductor memory 10.

Upon receipt of the command "30h," the semiconductor memory 10 makes the transition from a ready state to a busy state. Accordingly, the sequencer 14 performs an SLC read operation (upper page data cache reading) based on the received command CMD and address information ADD1.

The data read out by the upper page data cache reading is transferred to, e.g. the latch circuit XDL. When the lower page data cache reading is terminated, the semiconductor memory 10 makes the transition from a busy state to a ready state.

Subsequently, the memory controller 20 transmits a command "TU" to the semiconductor memory 10. The command "TU" is a command to instruct the semiconductor memory 10 to transfer data between latch circuits.

Upon receipt of the command "TL," the semiconductor memory 10 is temporarily rendered in a busy state and the sequencer 14 transfers, e.g. the upper page data from the latch circuit XDL to the latch circuit UDL in the sense amplifier module 17.

In FIG. 30, the time for which the semiconductor memory 10 has performed the foregoing lower page data cache writing and the time for which the semiconductor memory 10 has performed the foregoing upper page data cache writing are represented as tR1 and tR2, respectively.

Then, the memory controller 20 instructs the semiconductor memory 10 to perform "A"-level divide writing that maintains the state of a latch circuit in the sense amplifier module 17.

Specifically, the memory controller 20 transmits a command "xxh," a command "85h," address information ADD3 and a command "10h" in sequence to the semiconductor memory 10. The command "85h" is a command to instruct the semiconductor memory 10 to perform a write operation that maintains the state of a latch circuit in the sense amplifier module 17. The address information ADD3 includes an address to designate a cell unit CU that stores data of two or more pages.

Upon receipt of the command "10h," the semiconductor memory 10 makes the transition from a ready state to a busy state. Thus, the sequencer 14 performs the "A"-level divide writing based on the received command CMD, address information ADD3 and upper and lower page data held in the latch circuits in the sense amplifier module 17.

Since the "A"-level divide writing is similar to the "A"-level divide writing described in the first embodiment, its detailed description will be omitted.

When the "A"-level divide writing is terminated, the semiconductor memory 10 makes the transition from a busy state to a ready state. For example, when the host device 30 provides no instruction about an interrupt operation, the memory controller 20 performs the following divide writing.

Specifically, the memory controller 20 transmits, e.g. a command "GO" to the semiconductor memory 10, and the semiconductor memory 10 performs the "B"-level divide writing based on the command "GO."

When the subsequent divide writing is performed using the command "GO" alone, the address information ADD, which is held in the address register 13 between divide writings, needs to be continuously held. In place of using the command "GO" alone, a command sequence that involves address input can be used and, in this case, the address information ADD, which is held in the address register 13 between divide writings, can be canceled.

If the memory controller 20 receives an instruction to perform an interrupt operation from the host device 30 when the "B"-level divide writing is terminated, the memory controller 20 performs a setting output operation as in the second embodiment.

Specifically, the memory controller 20 transmits the command set "GF" to the semiconductor memory 10 and the semiconductor memory 10 temporarily makes the transition to a busy state. Then, the semiconductor memory 10 supplies the memory controller 20 with setting information "FO" based on the command set "GF" and the memory controller 20 holds the setting information "FO" in its storage area.

After that, the memory controller 20 performs an interrupt operation. Specifically, the memory controller 20 transmits a command set CMDset corresponding to the interrupt operation to the semiconductor memory 10 and performs an interrupt operation (e.g. write operation) based on, e.g. a command received by the semiconductor memory 10.

In this third embodiment, the lower page data and the upper page data held in the latch circuits in the sense amplifier module 17 are erased by the interrupt operation. When the interrupt operation is terminated, if there is no instruction about an interrupt operation from the host device 30, the memory controller 20 restarts the divide writing.

Then, the memory controller 20 performs cache writing, which corresponds to data to be written to the cell unit CU, again. Since the operation of cache reading for each of the lower page data and the upper page data in the third embodiment is similar to the foregoing operation for each of the lower page data and the upper page data, its description will be omitted.

When the upper page data cache reading is terminated and the semiconductor memory 10 makes the transition from a busy state to a ready state, the memory controller 20 performs a setting input operation as in the second embodiment.

Specifically, the memory controller 20 transmits a command set "SF" to the semiconductor memory 10 and the semiconductor memory 10 temporarily makes the transition to a busy state. The command set "SF" includes the setting information saved in the storage area of the memory controller 20. The sequencer 14 reflects the setting information in the progress recording register 60, loop number register 61 and operation determination register 62.

Subsequently, the memory controller 20 transmits a command "yyh," a command "85h," address information ADD3 and a command "10h" in sequence to the semiconductor memory 10. The command "yyh" is a command to instruct the semiconductor memory 10 to perform divide writing based, on the numerical values held in the progress recording register 60, loop number register 61 and operation determination register 62.

Upon receipt of the command "10h," the semiconductor memory 10 makes the transition from a ready state to a busy state. Thus, the sequencer 14 performs "C"-level divide writing based on the received command CMD, address information ADD3 and upper and lower page data held in the latch circuits in the sense amplifier module 17.

As described above, in the memory system 1 according to the third embodiment, a command to be used may vary according to whether an interrupt operation has been performed before the second divide writing and its subsequent ones are performed. When a write operation and an erase operation are performed in the interrupt operation, the memory system 1 performs cache reading and the subsequent cache reading using a command set including a command "h" and address information.

In the foregoing descriptions, as a command to provide an instruction about divide writing, the command "xxh" is used in the first divide writing and the command "yyh" is used in the second divide writing and its subsequent ones. The present invention is not limited to this. For example, in the write operation of the memory system 1 according to the third embodiment, the same command (e.g. "xxh") may be used in both the first divide writing and the second divide writing and its subsequent ones.

[3-2] Advantages of Third Embodiment

As described above, the memory system 1 according to the third embodiment makes it possible to perform divide writing using an SLC cache. Like in the second embodiment, in the memory system 1 according to the third embodiment, the setting information for divide writing is saved temporarily in the memory controller 20 when a write operation and an erase operation are performed in the interrupt operation.

Consequently, the memory system 1 according to the third embodiment allows the write operation and erase operation to be performed as an interrupt operation between two or more divide writings in the write operation, as in the second embodiment.

In the memory system 1 according to the third embodiment, furthermore, an SLC cache is used and thus the continuance of the divide writing can be performed without inputting write data again.

In the memory system 1 according to the third embodiment, the memory controller 20 can cancel write data in which cache writing has been performed. Therefore, the capacity of the buffer memory 24 of the memory controller 20 can be saved.

[3-3] Modification to Third Embodiment

The third embodiment is directed to the divide writing based on a threshold level. The present invention is not limited to this writing. For example, as a trigger to terminate each divide writing, the program loop number and the processing time may be used in the third embodiment, like in the first and second embodiments.

Figure 31:
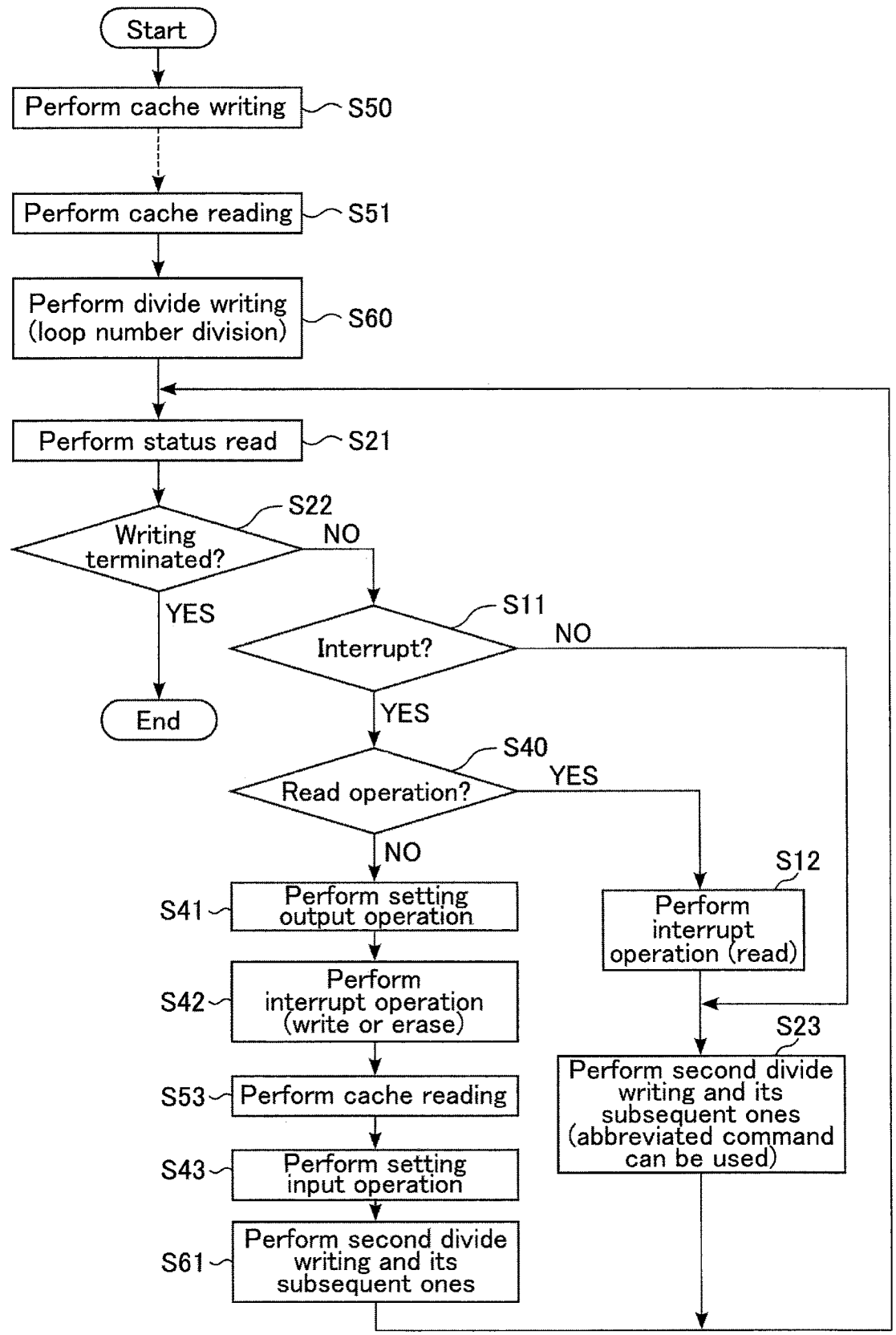
FIG. 31 is a flowchart showing an example of divide writing based on the program loop number in the memory system according to the third embodiment.

FIG. 31 is a flowchart showing an example of divide writing based on the program loop number in the memory system 1 according to the third embodiment.

As shown in FIG. 31, first, the memory system 1 performs cache writing in step S50 and cache reading in step S51 as described with reference to FIG. 27.

After that, the memory system 1 performs the divide writing based on the program loop number (step S60). The command sequence in step S60 is similar to the command sequence for the "A"-level divide writing, which has been described with reference to FIG. 30. The detailed operation in step S60 is similar to the first divide writing based on the program loop number, which has been described with reference to FIG. 15.

When the divide writing of step S60 is terminated, the memory controller 20 performs the status read of step S21.

When the write operation is not terminated (NO in step S22), the memory controller 20 confirms whether an instruction about an interrupt operation is provided from the host device 30 (step S11).

When an instruction about an interrupt operation is provided (YES in step S11), the sequencer 14 performs the process of step S40 described with reference to FIG. 23.

When the interrupt operation is a read operation (YES in step S40), the memory controller 20 instructs the semiconductor memory 10 to perform the read operation (step S12).

When the interrupt operation is not a read operation (NO in step S40), the memory controller 20 performs the processes of steps S41 to S43 and performs the interrupt operation after the setting information for the divide writing is saved in the memory controller 20 from the semiconductor memory 10.

Then, the memory controller 20 instructs the semiconductor memory 10 to perform cache reading as in step S51 to restore, e.g. write data of two pages in a latch circuit in the sense amplifier module 17 (step S53).

When the cache reading is terminated, the memory controller 20 performs the setting input operation of step S43 to restore the setting information for divide writing, which is saved in the memory controller 20, in the semiconductor memory 10. After that, the memory controller 20 instructs the semiconductor memory 10 to perform the continuance of the divide writing based on the program loop number, namely the second divide writing and its subsequent ones (step S61).

The command sequence in step S61 is similar to the command sequence for the "C"-level divide writing, which has been described with reference to FIG. 30. The detailed operation in step S61 is similar to the second divide writing and its subsequent ones based on the program loop number, which has been described with reference to FIG. 15.

In each of the case where there is no interrupt operation in step S11 and the case where the process is terminated in step S12, the sequencer 14 performs the process of step S23 described with reference to FIG. 14. In other words, the sequencer 14 performs the continuance of the divide writing based on the program loop number.

When the process of step S23 or S61 is terminated, the memory system 1 returns to step S21 to perform status read. Since the other detailed operation of the divide writing based on the program loop number in the third embodiment is similar to the operation in the first embodiment described with reference to FIGS. 14 and 15, its description will be omitted.

FIG. 32 is a flowchart showing an example of divide writing based on the processing time in the memory system 1 according to the third embodiment. As shown in FIG. 32, the divide writing based on the processing time in the third embodiment is similar to the divide writing based on the program loop number in the third embodiment described with reference to FIG. 31 in which the processing time is used in place of a trigger to terminate each divide writing.

Specifically, step S60 in FIG. 32 is replaced with step S70, step S23 in FIG. 32 is replaced with step S31, and step S61 in FIG. 27 is replaced with step S71.

In step S71, the memory system 1 performs the second divide writing and its subsequent ones based on the processing time by a command sequence like that in step S61. Since the other detailed operation of the divide writing based on the processing time in the third embodiment is similar to the combination of the operation described with reference to FIG. 31 and the operation in the first embodiment described with reference to FIGS. 16 and 17, its description will be omitted.

[4] FOURTH EMBODIMENT

In contrast to the memory system 1 of the first embodiment, in the memory system 1 of the fourth embodiment, the semiconductor memory 10 includes a plurality of registers, and the setting output operation and setting input operation in the second and third embodiments are omitted. Below are descriptions of different points of the memory system 1 according to the fourth embodiment from the memory systems 1 according to the first to third embodiments.

[4-1] Configuration of Sequencer 14

FIG. 33 shows an example of a configuration of the sequencer 14 of the semiconductor memory 10 in the memory system 1 according to the fourth embodiment. In the fourth embodiment, as shown in FIG. 33, the sequencer 14 includes progress recording registers 60A and 60B, loop number registers 61A and 61B, operation determination registers 62A and 62B and a timer 63.

In other words, the sequencer 14 includes a plurality of progress recording registers 60, a plurality of loop number registers 61, and a plurality of operation determination registers 62.

For example, the progress recording register 60A, loop number register 61A and operation determination register 62A are used for the current operation. In other words, the progress recording register 60A, loop number register 61A and operation determination register 62A are used in the same manner as the progress recording register 60, loop number register 61 and operation determination register 62 of the first to third embodiments.

On the other hand, the progress recording register 60B, loop number register 61B and operation determination register 62B are used for an interruption of the operation. The registers 60B, 61B and 62B for the interruption are used when a write operation is performed as an interrupt operation. Each of the registers 60B, 61B and 62B may hold a plurality of divide writing settings.

According to the foregoing descriptions, the sequencer 14 includes two progress recording registers 60A and 60B, two loop number registers 61A and 61B and two operation determination register 62A and 62B. The number of registers is not limited to this. The sequencer 14 may include three or more for each of the registers 60, 61 and 62. Since the other configuration of the memory system 1 according to the fourth embodiment is similar to that of the memory system 1 according to the first embodiment, its description will be omitted.

[4-2] Write Operation

The memory system 1 according to the fourth embodiment performs divide writing in which a second cell unit CU is selected, during the divide writing in which a first cell unit CU is selected, using the registers for the current operation and the registers for interruption.

Hereinafter, the operation using only the registers 60A, 61A and 62A for the current operation will be referred to as foreground and the operation using only the registers 60B, 61B and 62B for interruption will be referred to as background.

Figure 34:
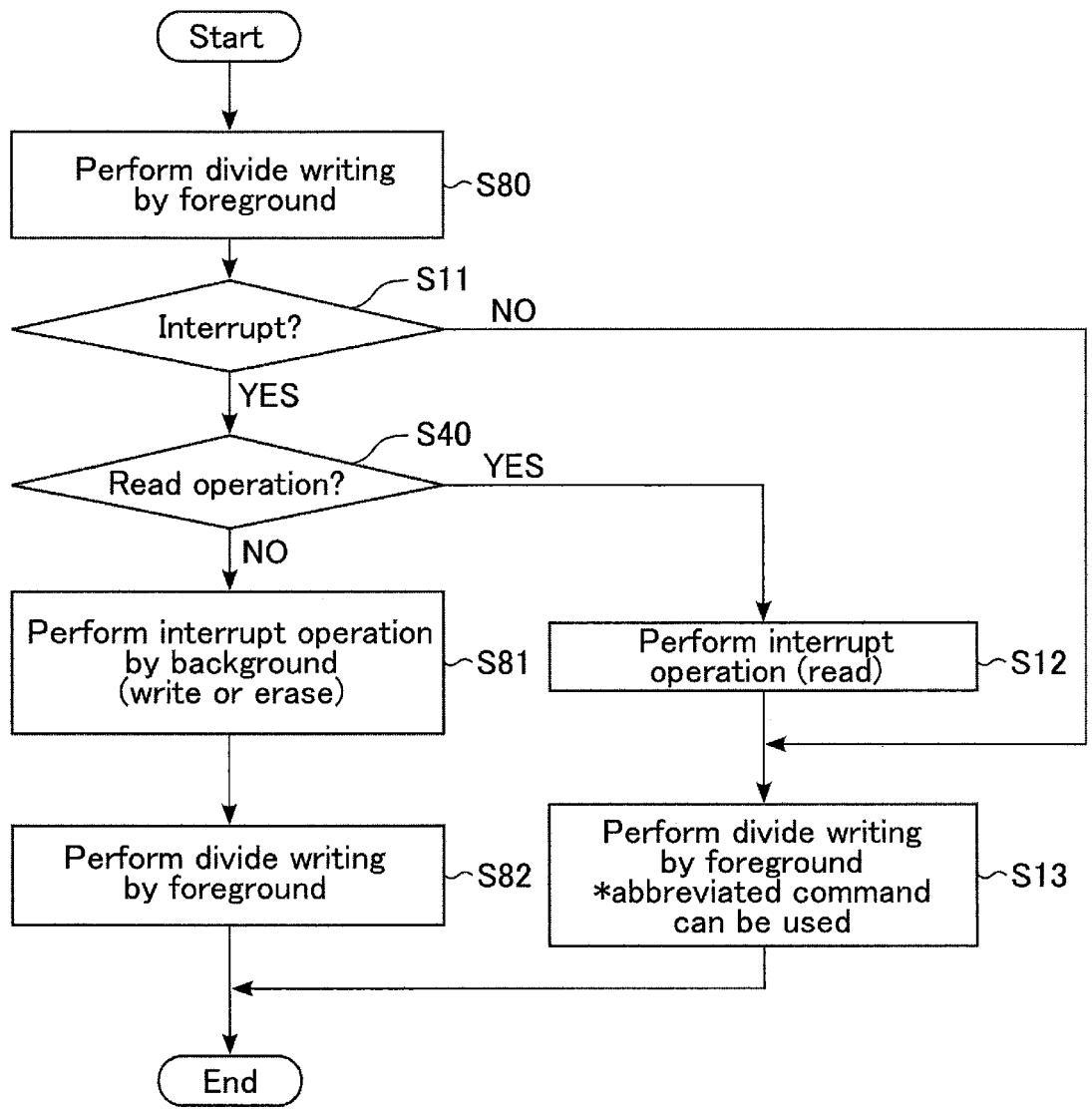
FIG. 34 is a flowchart showing an example of divide writing of the memory system according to the fourth embodiment.

FIG. 34 is a flowchart showing an example of divide writing of the memory system 1 according to the fourth embodiment. In the fourth embodiment, one of the threshold level, the program loop number and the processing time is used as a trigger for the divide writing.

As shown in FIG. 34, first, the memory system 1 performs divide writing by foreground (step S80). When the process of step S80 is terminated, the memory controller 20 performs the process of step S11 to confirm whether an instruction about an interrupt is provided.

When there is an instruction about an interrupt operation (YES in step S11), the memory controller 20 performs the process of step S40 to confirm whether the interrupt operation is a read operation.

When the interrupt operation is a read operation (YES in step S40), the sequencer 14 performs the process of step S12 to perform the read operation.

When the interrupt operation is not a read operation (NO in step S40), the sequencer 14 performs the interrupt operation by background (step S81). In the background interrupt operation, for example, a write operation and an erase operation are performed.

Before the semiconductor memory 10 performs an interrupt operation by background, the setting information for the foreground divide writing is saved in the registers 60B, 61B and 62B for interruption. In other words, the sequencer 14 holds the setting information for the foreground divide writing in the semiconductor memory 10 and performs the background interrupt operation (e.g. divide writing). The background divide writing will be described in detail later.

When the background interrupt operation of step S81 is terminated, the memory controller 20 restores the setting information for the foreground divide writing held in the registers 60B, 61B and 62B for interruption to, e.g. the registers 60A, 61A and 62A for the current operation, respectively. Then, the memory controller 20 performs the continuance of the divide writing of step S80 by foreground (step S82).

When there is no instruction about an interrupt operation (NO in step S11) and when the process of step S12 is terminated, the memory controller 20 performs the process of step S13 and performs the continuance of the divide writing of step S80. The divide writing of step S13 continues to be performed by foreground.

FIG. 35 shows an example of a command sequence for foreground divide writing in the memory system 1 according to the fourth embodiment. In the drawings referred to in the fourth embodiment, the setting is changed to perform divide writing by the normal write command sequence by the semiconductor memory 10.

As shown in FIG. 35, for example, the command sequence for the foreground divide writing is similar to the command sequence for the normal writing. When the command "xxh" is used, it is inserted before each of the commands "01h" and "02h."

When the foreground divide writing is performed, if it is done after the background interrupt operation as in step S82, the setting information ("FGinfo") for the foreground divide writing, which is saved in advance in the registers 60B, 61B and 62B, is called and reflected in the registers 60A, 61A and 62A.

When the foreground divide writing is terminated, the sequencer 14 also reflects the setting information, which is held in the registers 60A, 61A and 62A for the current operation, in the registers 60B, 61B and 62B for interruption. In other words, the sequencer 14 updates the setting information for the foreground divide writing held in the registers 60B, 61B and 623.

FIG. 36 shows an example of a command sequence for background divide writing in the memory system 1 according to the fourth embodiment.

As shown in FIG. 36, a command "BG" is added before each of the commands "01h" and "02h" in the command sequence for the background divide writing, as compared with the command sequence for the foreground divide writing described with reference to FIG. 35.

When the command "xxh" is used, it is inserted between the command "01h" and "BG," between the command "02h" and "BG" or before the command "BG." The order of the commands can be changed as appropriate.

When the background divide writing is performed, the sequencer 14 calls the setting information ("FGinfo") for the background divide writing from the registers 60B, 61B and 62B and reflects it in the registers 60A, 61A and 62A.

When the background divide writing is terminated, the sequencer 14 also reflects the setting information, which is held in the registers 60A, 61A and 62A for the current operation, in the registers 60B, 61B and 62B for interruption. In other words, the sequencer 14 updates the setting information for the background divide writing held in the registers 60B, 61B and 62B.

Figure 37:
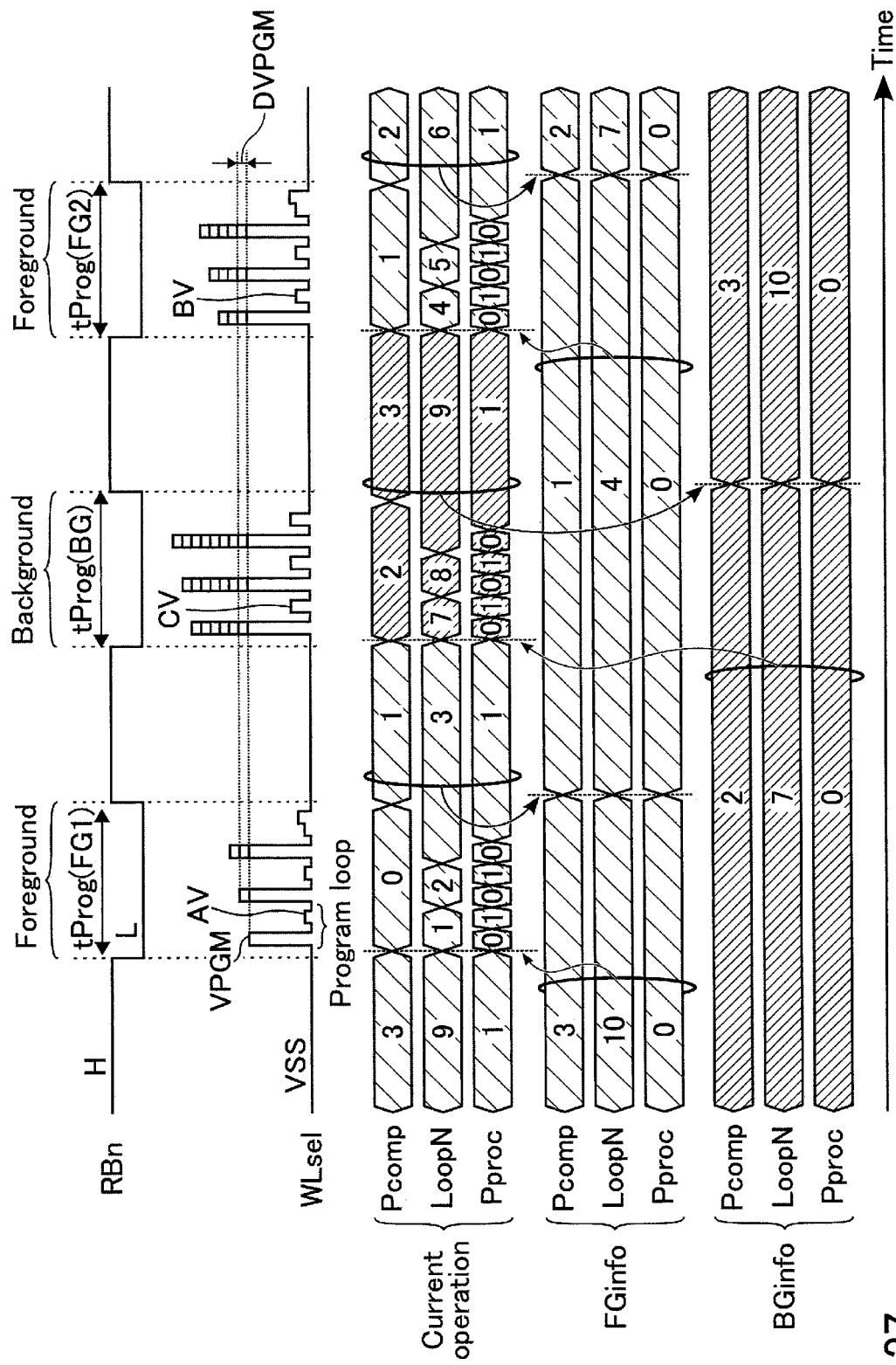
FIG. 37 is a timing chart showing an example of divide writing of the memory system according to the fourth embodiment.

FIG. 37 is a timing chart showing an example of the write operation of the memory system 1 according to the fourth embodiment, in which the background divide writing is inserted between foreground divide writings.

In the example shown in FIG. 37, the sequencer 14 employs a threshold level as a trigger for use in the divide writing. The actual word line WL corresponding to the selected word line WLsel shown in FIG. 37 varies between the foreground operation and the background operation.

FIG. 37 shows Pcomp, LoopN and Pproc corresponding to their respective registers 60A, 61A and 62A for the current operation and Pcomp, LoopN and Pproc corresponding to their respective registers 60B, 61B and 62B for interruption. Each of the registers 60B, 61B and 62B includes "FGinfo" and "BGinfo" and each of the "FGinfo" and "BGinfo" includes Pcomp, LoopN and Pproc.

As shown in FIG. 37, before the first foreground divide writing is performed, "3," "9" and "1" are respectively set to Pcomp, LoopN and Pproc corresponding to the current operation, "3," "10" and "0" are respectively set to Pcomp, LoopN and Pproc corresponding to the interruption and "FGinfo" and "2," "7" and "0" are respectively set to Pcomp, LoopN and Pproc corresponding to the interruption and "BGinfo."

First, the memory controller 20 instructs the semiconductor memory 10 to perform the foreground divide writing. Thus, the semiconductor memory 10 makes the transition from a ready state to a busy state.

When the sequencer 14 performs the foreground divide writing, it first reflects "FGinfo" in Pcomp, LoopN and Pproc for the current operation. At this point in time, when the numerical value of Pcomp is, e.g. "3," or when the progress recording register 60B holds a numerical value indicating the termination of the writing, the sequencer 14 resets the numerical values of Pcomp, LoopN and Pproc and starts a program loop.

In this example, the foreground divide writing is terminated based on a threshold level and the semiconductor memory 10 makes the transition from a busy state to a ready state. The processing time of the foreground divide writing is represented as tProg (FG1).

When the foreground divide writing (FG1) is terminated, the sequencer 14 reflects the numerical values of Pcomp, LoopN and Pproc at the termination of the divide writing in "FGinfo." In the numerical value of LoopN, for example, a value obtained by incrementing the numerical value at the termination of the foreground divide writing is reflected.

Then, the memory controller 20 instructs the semiconductor memory 10 to perform the background divide writing and thus the semiconductor memory 10 is rendered in a busy state.

When the sequencer 14 performs the background divide writing, it first reflects "BGinfo" in Pcomp, LoopN and Pproc for the current operation. At this point in time, when the numerical value of Pcomp is, e.g. "3," the sequencer 14 resets the numerical values of Pcomp, LoopN and Pproc as in the foreground divide writing.

In this example, the numerical value of Pcomp is not "3." Thus, the numerical values of Pcomp, LoopN and Pproc for the current operation are set to "2," "7" and "0."

Then, the sequencer 14 performs the background divide writing based on the updated numerical values of Pcomp, LoopN and Pproc for the current operation.

In this example, the background divide writing is terminated based on a threshold level and the semiconductor memory 10 makes the transition from a busy state to a ready state. The processing time of the background divide writing is represented as tProg (BG).

When the background divide writing (BG) is terminated, the sequencer 14 reflects the numerical values of Pcomp, LoopN and Pproc at the termination of the divide writing in "BGinfo." In the numerical value of LoopN, for example, a value obtained by incrementing the numerical value at the termination of the background divide writing is reflected, as in the foreground operation.

Then, the memory controller 20 instructs the semiconductor memory 10 to perform the background divide writing and thus the semiconductor memory 10 is rendered in a busy state. Similarly to the above, the sequencer 14 first reflects "FGinfo" in Pcomp, LoopN and Pproc for the current operation to perform the foreground divide writing (FG2).

The command "GO" used to perform the second foreground divide writing and its subsequent ones and the command "GO" used to perform the second background divide writing and its subsequent ones are different from each other. In the memory system 1 according to the fourth embodiment, for example, a command "GO (e.g. GO1)" corresponding to the foreground and a command "GO (e.g. GO2)" corresponding to the background are used.

In the fourth embodiment, the semiconductor memory 10 performs a foreground operation using "FGinfo" when it receives the command "GO1" and performs a background operation using "BGinfo" when it receives the command "GO2."

[4-3] Advantages of Fourth Embodiment

As described above, when the memory system according to the fourth embodiment performs a write operation as an interrupt operation, it performs the continuance of the divide writing without performing a setting output operation or a setting input operation.

Since, therefore, the memory system 1 according to the fourth embodiment can reduce the number of exchanges between the memory controller 20 and the semiconductor memory 10 more than in the second and third embodiments, the processing time of the divide writing can be shortened.

FIFTH EMBODIMENT

The memory system 1 according to the fifth embodiment performs a two-stage write operation. Divide writing as described in the first to fourth embodiments is applied to the two-stage write operation. Below are descriptions of different points of the memory system 1 according to the fifth embodiment from the memory systems 1 according to the first to fourth embodiments.

[5-1] Configuration of Memory System 1

FIG. 38 shows an example of a configuration of the memory system 1 according to the fifth embodiment. As shown in FIG. 38, the memory system 1 includes semiconductor memories 10-1, 10-2, 10-3 and 10-4, a memory controller 20 and a dynamic random-access memory (DRAM) 28.

The semiconductor memories 10-1, 10-2, 10-3 and 10-4 each have a configuration similar to that of, e.g. the semiconductor memory 10 in the first embodiment. Each of semiconductor memories 10-1, 10-2, 10-3 and 10-4 is connected to and controlled by the memory controller 20.

The DRAM 28 is used as an external storage area of the memory controller 20. For example, the DRAM 28 temporarily stores write data received from a host device 30. The DRAM 28 may be embedded in the memory controller 20.

Since the other configuration of the memory system 1 according to the fifth embodiment is similar to that of the memory system 1 according to the first embodiment, its description will be omitted.

Note that the number of semiconductor memories of the memory system 1 according to the fifth embodiment is one example and thus may optionally be set.

[5-2] Write Operation

The memory system 1 according to the fifth embodiment performs a two-stage write operation. The two-stage write operation differs from the divide writing that is performed two or more times in the write operation as in the first to fourth embodiments.

Hereinafter, in the fifth embodiment, a first-stage write operation will be referred to as first writing and a second-stage write operation will be referred to as second writing.

In the first writing and the second writing, the same write data is used. For example, when two-page data is written to a cell unit CU, the first writing and the second writing are performed in sequence for the cell unit CU using the two-page data.

For example, in the first writing, verify voltages AV', BV' and CV', which are respectively lower than the verify voltages AV, BV and CV described with reference to FIG. 3, are used. The verify voltages AV', BV' and CV' correspond to "A"-level write data, "B"-level write data and "C"-level write data, respectively. In the second writing, the verify voltages AV, BV and CV are used as in the normal write, for example.

For example, the step-up width DVPGM of the program voltage VPGM in the first writing is set greater than that of the program voltage VPGM in the second writing. The initial value of the program voltage VPGM in the first writing and that of the program voltage VPGM in the second writing may differ from each other and, for example, the initial value of the program voltage VPGM in the second writing is set lower than that of the program voltage VPGM in the first writing.

Figure 39:
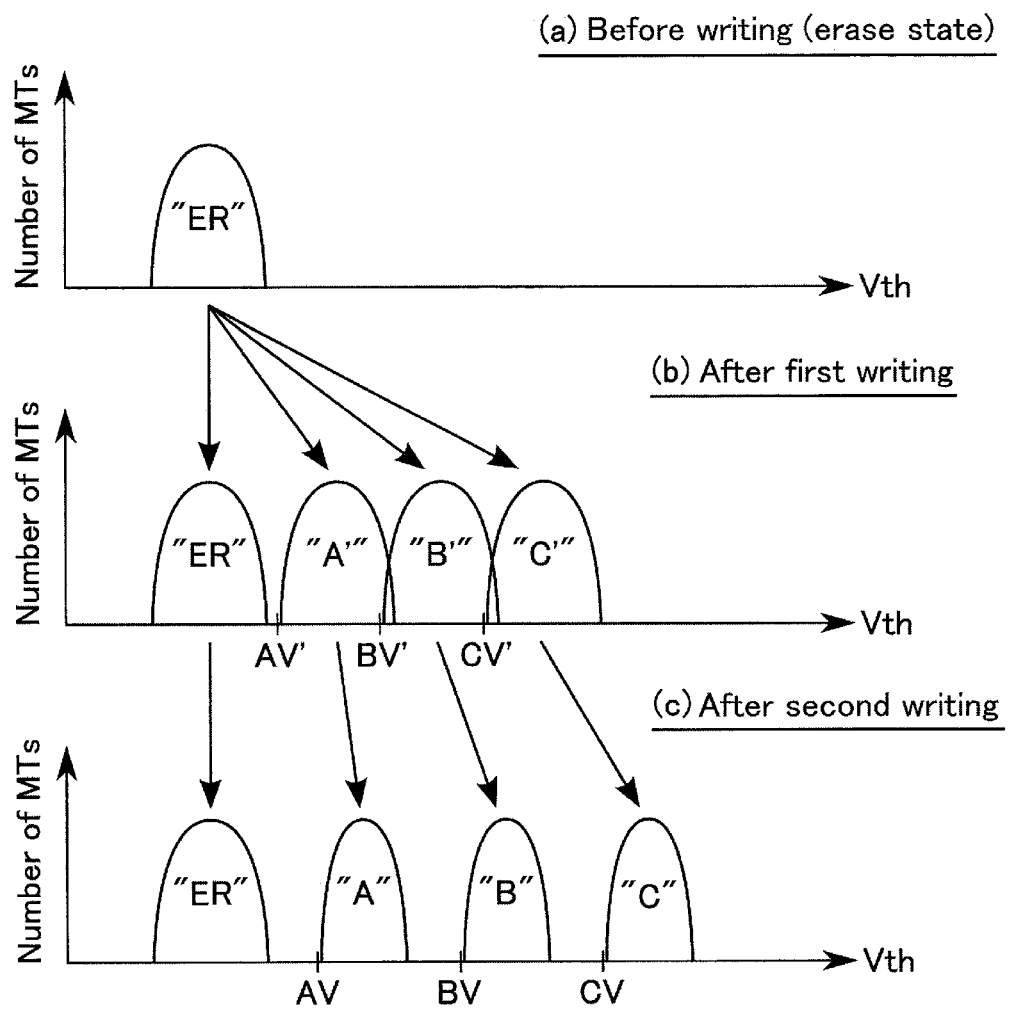
FIG. 39 is a threshold distribution chart showing an example of threshold distribution of each of threshold levels before writing, after first writing and after second writing in the memory system according to the fifth embodiment.

FIG. 39 shows an example of the threshold distribution of each of threshold levels (a) before the writing, (b) after the first writing and (c) after the second writing in the memory system 1 according to the fifth embodiment.

As shown in FIG. 39, (a) before the writing, the threshold voltages of memory cell transistors MT are distributed at the "ER" level corresponding to an erase state.

(b) After the first writing, the threshold voltages of memory cell transistors MT are distributed at the "ER" level, "A'" level, "B'" level and "C'" level. The center voltages of the threshold distributions at the "A'" level, "B'" level and "C'" level are respectively lower than those of the threshold distributions at the "A" level, "B" level and "C" level. Furthermore, the threshold distributions at the "A'" level, "B'" level and "C'" level are respectively broader than the threshold distributions at the "A" level, "B" level and "C" level.

(c) After the second writing, the threshold voltages of memory cell transistors MT are distributed at the "A" level, "B" level and "C" level. Specifically, in the threshold distribution after the second writing, an "ER" level is formed by the memory cell transistors MT included in the "ER" level after the first writing, an "A" level is formed by the memory cell transistors MT included in the "A'" level, a "B" level is formed by the memory cell transistors MT included in the "B'" level, and a "C" level is formed by the memory cell transistors MT included in the "C'" level.

FIG. 40 shows an example of a command sequence of the first writing in the memory system 1 according to the fifth embodiment.

As shown in FIG. 40, the command sequence of the first writing is similar to the command sequence of the normal writing described with reference to FIG. 11 in which a command "zxh" is added before each of the commands "01h" and "02h." The command "zxh" is a command to instruct the semiconductor memory 10 to perform the first-stage write operation (first writing).

When the semiconductor memory 10 receives the command "10h" and makes the transition from a ready state to a busy state, the sequencer 14 performs the first writing based on the received command CMD, address information ADD, lower page write data and upper page write data.

Since the detailed operation in the first writing is similar to that in the normal writing described with referenced to FIG. 11 in which a program voltage and a verify voltage to be used are changed, its description will be omitted. In FIG. 40, the time during which the semiconductor memory 10 performs the first writing to be rendered in a busy state, is represented as tPfoggy.

FIG. 41 shows an example of a command sequence of the second writing in the memory system 1 according to the fifth embodiment.

As shown in FIG. 41, the command sequence of the second writing is similar to the command sequence of the normal writing described with reference to FIG. 11 in which a command "zyh" is added before each of the commands "01h" and "02h." The command "zyh" is a command to instruct the semiconductor memory 10 to perform the second-stage write operation (second writing).

When the semiconductor memory 10 receives the command "10h" and makes the transition from a ready state to a busy state, the sequencer 14 performs the second writing based on the received command CMD, address information ADD, lower page write data and upper page write data.

Since the detailed operation in the second writing is similar to that in the normal writing described with referenced to FIG. 11, its description will be omitted. In FIG. 41, the time during which the semiconductor memory 10 performs the second writing to be rendered in a busy state, is represented as tPfine. The time tPfine is longer than the time tPfoggy.

FIG. 42 shows an example of the writing sequence of the first writing and the second writing in the memory system 1 according to the fifth embodiment. In this example, a write operation in which one block BLK is selected is performed in sequence from the word line WL0 in each of the semiconductor memories 10-1, 10-2, 10-3 and 10-4. In FIG. 42, "Foggy" corresponds to the first writing and "Fine" corresponds to the second writing.

As shown in FIG. 42, first, the memory controller 20 performs the first writing ("1" to "4"), in which the word line WL0 of each of the semiconductor memories 10-1, 10-2, 10-3 and 10-4 is selected.

Then, the memory controller 20 performs the first writing ("5" to "8"), in which the word line WL1 of each of the semiconductor memories 10-1, 10-2, 10-3 and 10-4 is selected.

Then, the memory controller 20 performs the second writing ("9" to "12"), in which the word line WL0 of each of the semiconductor memories 10-1, 10-2, 10-3 and 10-4 is selected.

Then, the memory controller 20 performs the first writing ("13" to "16"), in which the word line WL2 of each of the semiconductor memories 10-1, 10-2, 10-3 and 10-4 is selected.

Then, the memory controller 20 performs the second writing ("17" to "20"), in which the word line WL1 of each of the semiconductor memories 10-1, 10-2, 10-3 and 10-4 is selected.

Similarly to the above, the first writing and the second writing are performed alternately. Note that the foregoing sequence of the first writing and the second writing is one example and the present invention is not limited to the sequence.

Divide writing as described in the first to fourth embodiments may be applied to the foregoing first writing and second writing. In the memory system 1 according to the fifth embodiment, divide writing is applied to, e.g. the second writing.

FIG. 43 shows an example of processing time (writing time) of the first writing and the second writing in the memory system 1 according to the fifth embodiment.

As shown in FIG. 43, the processing time for the first writing and that for the second writing are, for example, 3 ms and 5 ms, respectively. When divide writing is applied to the second writing and the second writing is divided into two divide writings, the processing time for the second writing becomes, for example, 6 ms (3 ms+3 ms).

The command sequence used when divide writing is applied to the first writing, becomes similar to that of the first writing, described with reference to FIG. 40, if the operation setting of the semiconductor memory 10 is changed by the setting input operation.

When the command "xxh" is used in the first writing, it is inserted between the commands "01h" and "zxh" and between the commands "02h" and "zxh" or it is inserted before the command "zxh."

Furthermore, the command sequence used when divide writing is applied to the second writing, becomes similar to that of the second writing, described with reference to FIG. 41, if the operation setting of the semiconductor memory 10 is changed by the setting input operation.

When the command "xxh" is used in the second writing, it is inserted between the commands "01h" and "zyh" and between the commands "02h" and "zyh" or it is inserted before the command "zyh."

[5-3] Advantages of Fifth Embodiment

As described above, the memory system 1 according to the fifth embodiment can perform the two-stage write operation and apply the divide writing of the first to fourth embodiments to, e.g. the second-stage write operation.

FIG. 44 shows a comparison example of the write operation in the fifth embodiment and illustrates an operation of the memory controller 20 in the write operation of the memory system 1 including N chips of the semiconductor memory 10. In FIG. 44, "tCMD" represents a time period during which the memory controller 20 transmits a command to the semiconductor memory 10, "1stProg" represents the processing time of the first writing, and "2ndProg" represents the processing time of the second writing.

For example, when no divide writing is applied to the two-stage write operation, the processing time of the second-stage write operation (second writing) is longer than that of the first-stage write operation (first writing).

In this case, as shown in FIG. 44, if the memory controller 20 instructs the N chips ("1" to "N") of the semiconductor memory 10 in sequence to perform the second writing and then instructs the chip "1" to perform the first writing, the second writing may not be terminated for the chip "1" ("incompletion of second writing").

At this point, the memory controller 20 provides an instruction to perform the first writing for the chip "1" after the second writing is terminated for chip "1." Thus, a delay time to wait for the termination of the second writing may be caused.

In contrast, in the memory system 1 according to the fifth embodiment, since divide writing is applied to the second writing when the two-stage write operation is performed, the processing time for the first writing and that for the second writing can be equalized to some extent.

Therefore, the memory system according to the fifth embodiment can inhibit a delay from being caused when the first writing and the second writing are switched to each other and thus inhibit the speed of the entire write operation from decreasing.

[6] OTHERS

The memory system according to each of the embodiments includes a semiconductor memory and a memory controller. The memory controller is configured to control the semiconductor memory. The semiconductor memory includes a plurality of memory cells, a word line and a sequencer. The memory cells each stores data of a plurality of bits based on a plurality of threshold voltages including a first threshold voltage for first data as the data of a plurality of bits and a second threshold voltage that is higher than the first threshold voltage for second data as the data of a plurality of bits. The word line is connected to the memory cells. The sequencer is configured to execute a program loop that includes a program operation and a verify operation in a write operation. The memory controller transmits a write command and write data to the semiconductor memory, and the sequencer performs a first write operation for the write data on a word line selected based on the write command. In the first write operation, the sequencer executes the program loop repeatedly and terminates the first write operation, when the verify operation for the first data has passed and the verify operation for the second data has not passed. The memory controller transmits a first command to the semiconductor memory after the first write operation is terminated and the sequencer performs a second write operation for the write data based on the first command.

Thus, the memory system according to each embodiment can be decreased in wait time.

The foregoing embodiments are directed to the case where the second divide writing and its subsequent ones using the same write data are performed by incrementing the program loop number. However, the present invention is not limited to this case.

For example, in the first program loop of the second divide writing and its subsequent ones, the program loop number need not be incremented and the program loop number may be returned to a numerical value that is smaller than the final program loop number in the last-performed divide writing.

Figure 45:
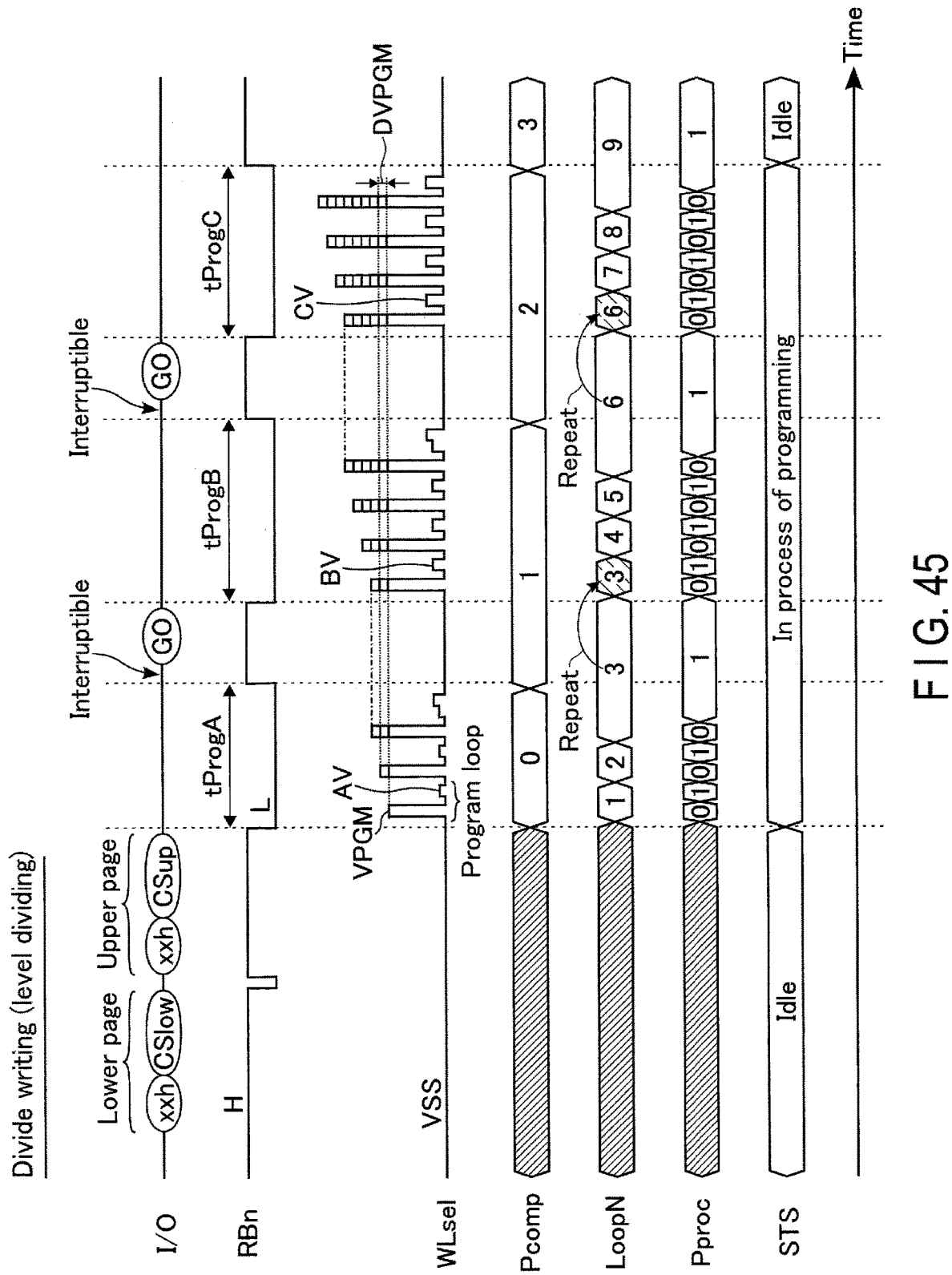
FIG. 45 is a timing chart showing an example of divide writing based on a threshold level in a modification to the first embodiment.

FIG. 45 is a timing chart of the divide writing described with reference to FIG. 13, in which the first program loop number in the second divide writing and its subsequent ones is not incremented.

As shown in FIG. 45, "3" is set to the numerical value of LoopN after the "A"-level divide writing. In contrast, in the "B"-level divide writing, the sequencer 14 starts a program loop without incrementing the first LoopN but by maintaining the same numerical value of "3." In other words, the program voltage of the final program loop in the "A"-level divide writing and that of the first program loop in the "B"-level divide writing are the same.

Similarly, "6" is set to the numerical value of LoopN after the "B"-level divide writing. In contrast, in the "C"-level divide writing, the sequencer 14 starts a program loop without incrementing the first LoopN but by maintaining the same numerical value of "6." In other words, the program voltage of the final program loop in the "B"-level divide writing and that of the first program loop in the "C"-level divide writing are the same.

FIG. 46 is a timing chart of the divide writing described with reference to FIG. 13, in which the first program loop number in the second divide writing and its subsequent ones is returned.

As shown in FIG. 46, "3" is set to the numerical value of LoopN after the "A"-level divide writing. In contrast, in the "B"-level divide writing, the sequencer 14 starts a program loop without incrementing the first LoopN but using the numerical value of "2" to which the program loop number is returned from "3." In other words, the program voltage of the first program loop in the "B"-level divide writing is lower than that of the final program loop in the "A"-level divide writing.

Similarly, "5" is set to the numerical value of LoopN after the "B"-level divide writing. In contrast, in the "C"-level divide writing, the sequencer 14 starts a program loop without incrementing the first LoopN but using the numerical value of "4" to which the program loop number is returned from "5." In other words, the program voltage of the first program loop in the "C"-level divide writing is lower than that of the final program loop in the "B"-level divide writing.

The operations described with reference to FIGS. 45 and 46 may be applied to the divide writing based on the program loop number and the divide writing based on the processing time. FIG. 46 illustrates the case where the numerical value of LoopN in the subsequent divide writing is returned by only "1" but the numerical value of LoopN may be returned to an optional one.

In the operations described with reference to FIGS. 45 and 46, the program voltage in the second divide writing and its subsequent ones is adjusted based on the numerical value of LoopN; however, the present invention is not limited to this. For example, the sequencer 14 may vary LoopN as in the foregoing embodiments and change the computational expression of the program voltage in the second divide writing and its subsequent ones.

In the foregoing embodiments, in the second divide writing and its subsequent ones using the same write data, the sequencer 14 decides whether to perform a program operation or a verify operation first, based on the numerical value (Pproc) of the operation determination register 62; however, the present invention is not limited to this.

For example, in the second divide writing and its subsequent ones, the sequencer 14 may forcibly start a verify operation first.

FIG. 47 is a timing chart of the divide writing described with reference to FIG. 13, in which a verify operation is performed first by the first program loop in the second divide writing and its subsequent ones.

As shown in FIG. 47, "1" is set to the numerical value of Pproc by the final program loop in the "A"-level divide writing. In contrast, the sequencer 14 changes the numerical value of Pproc to "0" with the timing when the "A"-level divide writing is terminated. When the numerical value of Pproc is changed to "0" with this timing, the sequencer 14 performs a pre-verify operation in the first program loop in the "B"-level divide writing. In other words, the sequencer 14 can perform the verify operation forcibly at the beginning of the divide writing, using Pproc as a flag.

Note that the sequencer 14 may perform the pre-verify operation on an optical condition. For example, the sequencer may perform the pre-verify operation in all of the second divide writing and its subsequent ones or perform the pre-verify operation in specific divide writing.

For example, when the pre-verify operation is performed in the "B"-level divide writing, a memory cell transistor MT that has passed in the "B"-level verification is inhibited from being overprogrammed. In other words, the memory system 1 can inhibit the threshold distribution from expanding by performing the pre-verify operation at the beginning of the divide writing.

The operation described with reference to FIG. 47 may be applied to the divide writing based on the program loop number and the divide writing based on the processing time.

In the second to fourth embodiments, a write operation and an erase operation are performed as one example of the interrupt operation to be performed in, e.g. step S42 in FIG. 23 and step S81 in FIG. 34; however, the present invention is not limited to these operations.

For example, in the process of each of steps S42 and S81, a read operation may be performed using the latch circuits LDL and UDL. In this case, the sequencer 14 confirms whether it is a read operation using only the latch circuit XDL in each of the process of, e.g. steps S40 and S45.

In the write operations of the second and third embodiments, before an interrupt operation is performed, it is confirmed whether the interrupt operation is a read operation, but this confirmation may be omitted. Specifically, the processes of steps S40 and S45 can be omitted from, e.g. the write operation described with reference to FIG. 23 in the second embodiment.

In the interrupt operation in step S42, a read operation as well as the write and erase operations may be performed. The memory system 1 can control the sequencer 14 more simply by omitting the processes of steps S40 and S45. Furthermore, in the read operation to be performed as an interrupt operation in step S42, the latch circuits LDL and UDL can be used.

Similarly, in the write operations described with reference to FIGS. 27 and 28 in the second embodiment and the write operations described with reference to FIGS. 29, 31 and 32 in the third embodiment, too, the processes of steps S40 and S45 may be omitted.

The commands "xxh," "yyh," "BG," "zxh," "zyh," etc. in the command sequences in the foregoing embodiments may be omitted by changing the setting of the semiconductor memory 10 through the setting input operation and when these commands are used at the same time, the order thereof may be changed appropriately. Furthermore, an optical numerical value (command) may be allocated to each of the commands "xxh," "yyh," "BG," etc.

In the foregoing embodiments, the progress recording register 60, loop number register 61 and operation determination register 62 are used in each of the normal writing and divide writing. The present invention is not limited to this. For example, these registers may be omitted if they are irrelevant to a trigger to divide the write operation.

In the foregoing embodiments, the multi-level cell (MLC) system in which data of two pages is stored in one cell unit CU is used in the write operation. The present invention is not limited to this system. For example, even though data of three or more pages is stored in one cell unit, the operations of the foregoing embodiments may be performed.

In the foregoing embodiments, the read operation and the write operation of the semiconductor memory 10 are exemplified. The voltage applied to a selected word line WLsel at the time of these operations may be estimated based on the voltage of a signal line between the driver circuit 15 and the row decoder module 16.

In the present specification, the term "connected" means that one element is electrically connected to another one and does not exclude another element interposed between the electrically-connected elements. Furthermore, the phrase "turned off" means applying to the gate of a transistor a voltage that is lower than the threshold voltage of the transistor and does not exclude the flow of a minute current such as a leak current of a transistor.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a semiconductor memory including:
a plurality of memory cells, each of the memory cells being configured to store data of a plurality of bits based on a plurality of threshold voltages including a first threshold voltage for first data as the data of the plurality of bits and a second threshold voltage that is higher than the first threshold voltage for second data as the data of the plurality of bits;
word lines connected to the memory cells; and
a sequencer configured to execute a program loop that includes a program operation and a verify operation in a write operation; and
a memory controller configured to control the semiconductor memory,
wherein:
the memory controller transmits a write command and write data to the semiconductor memory, and the sequencer performs a first write operation for the write data on a word line selected based on the write command;
the sequencer executes the program loop repeatedly in the first write operation and terminates the first write operation, when the verify operation for the first data has passed and the verify operation for the second data has not passed;
the memory controller transmits a first command to the semiconductor memory after the first write operation is terminated, and the sequencer performs a second write operation for the write data based on the first command;
the sequencer performs the second write operation without receiving the write data after the first write operation is terminated; and
the memory controller further instructs the semiconductor memory to perform a read operation between the first write operation and the second write operation.

2. The memory system of claim 1, wherein:
the memory controller includes a first memory;
the memory controller causes the semiconductor memory to output setting information of the first write operation, and stores the setting information in the first memory before the memory controller instructs the semiconductor memory to perform another write operation after the first write operation;
the memory controller inputs the setting information stored in the first memory to the semiconductor memory after the memory controller instructs the semiconductor memory to perform said another write operation; and
the semiconductor memory performs the second write operation based on the setting information input by the memory controller.

3. The memory system of claim 2, wherein the semiconductor memory receives the write data after the setting information is input by the memory controller and before the second write operation.

4. The memory system of claim 1, wherein a program voltage applied to a word line in a first program loop of the second write operation is not lower than a program voltage applied to the word line in a last program loop of the first write operation.

5. The memory system of claim 1, wherein a program voltage applied to a word line in a first program loop of the second write operation is lower than a program voltage applied to the word line in a last program loop of the first write operation.

6. A memory system comprising:
a semiconductor memory including:
a plurality of memory cells, each of the memory cells being configured to store first data based on a first threshold voltage;
word lines connected to the memory cells; and
a sequencer configured to execute a program loop that includes a program operation and a verify operation in a write operation; and
a memory controller which controls the semiconductor memory,
wherein:
the memory controller transmits a write command and write data to the semiconductor memory, and the sequencer performs a first write operation for the write data based on the write command;
the sequencer executes the program loop repeatedly in the first write operation and terminates the first write operation, when the program loop has executed a first number of times and the verify operation for the first data has not passed;
the memory controller transmits a first command to the semiconductor memory after the first write operation is terminated, and the sequencer performs a second write operation for the write data based on the first command;

the sequencer performs the second write operation without receiving the write data after the first write operation is terminated; and the memory controller further instructs the semiconductor memory to perform a read operation between the first write operation and the second write operation.

7. The memory system of claim 6, wherein:

the memory controller includes a first memory;

the memory controller causes the semiconductor memory to output setting information of the first write operation, and stores the setting information in the first memory before the memory controller instructs the semiconductor memory to perform another write operation after the first write operation;

the memory controller inputs the setting information stored in the first memory to the semiconductor memory after the memory controller instructs the semiconductor memory to perform said another write operation; and the semiconductor memory performs the second write operation based on the setting information input by the memory controller.

8. The memory system of claim 7, wherein the semiconductor memory receives the write data after the setting information is input by the memory controller and before the second write operation.

9. The memory system of claim 6, wherein a program voltage applied to a word line in a first program loop of the second write operation is not lower than a program voltage applied to the word line in a last program loop of the first write operation.

10. The memory system of claim 6, wherein a program voltage applied to a word line in a first program loop of the second write operation is lower than a program voltage applied to the word line in a last program loop of the first write operation.

11. The memory system of claim 6, wherein the number of times the sequencer executes the program loop in the first write operation is equal to the number of times the sequencer executes the program loop in the second write operation.

12. A memory system comprising:

a semiconductor memory including:

a plurality of memory cells, each of the memory cells being configured to store first data based on a first threshold voltage;

word lines connected to the memory cells;

a sequencer configured to execute a program loop that includes a program operation and a verify operation in a write operation; and a timer configured to measure execution time of the write operation; and a memory controller configured to control the semiconductor memory, wherein:

the memory controller transmits a write command and write data to the semiconductor memory, and the sequencer performs a first write operation for the write data based on the write command;

the sequencer executes the program loop repeatedly in the first write operation and terminates the first write operation, when the timer measures a predetermined time and the verify operation for the first data has not passed;

the memory controller transmits a first command to the semiconductor memory after the first write operation is terminated, and the sequencer performs a second write operation for the write data based on the first command;

the sequencer performs the second write operation without receiving the write data after the first write operation is terminated; and the memory controller further instructs the semiconductor memory to perform a read operation between the first write operation and the second write operation.

13. The memory system of claim 12, wherein:

the memory controller includes a first memory;

the memory controller causes the semiconductor memory to output setting information of the first write operation and stores the setting information in the first memory before the memory controller instructs the semiconductor memory to perform another write operation after the first write operation;

the memory controller inputs the setting information stored in the first memory to the semiconductor memory after the memory controller instructs the semiconductor memory to perform said another write operation; and the semiconductor memory performs the second write operation based on the setting information input by the memory controller.

14. The memory system of claim 13, wherein the semiconductor memory receives the write data after the setting information is input by the memory controller and before the second write operation.

15. The memory system of claim 12, wherein a program voltage applied to a word line in a first program loop of the second write operation is not lower than a program voltage applied to the word line in a last program loop of the first write operation.

16. The memory system of claim 12, wherein a program voltage applied to a word line in a first program loop of the second write operation is lower than a program voltage applied to the word line in a last program loop of the first write operation.

17. The memory system of claim 12, wherein processing time of the first write operation and processing time of the second write operation are substantially equal to each other.

18. A memory system comprising:

a semiconductor memory including:

a plurality of memory cells, each of the memory cells being configured to store data of a plurality of bits based on a plurality of threshold voltages including a first threshold voltage and a second threshold voltage that is higher than the first threshold voltage;

word lines connected to the memory cells; and a sequencer configured to execute a program loop that includes a program operation and a verify operation in a write operation; and a memory controller configured to control the semiconductor memory, wherein:

the memory controller transmits a write command and write data to the semiconductor memory, and the sequencer performs a first write operation for the write data on a word line selected based on the write command;

the sequencer executes the program loop repeatedly in the first write operation and terminates the first write operation, when verify operation for the first threshold voltage has passed and the verify operation for the second threshold voltage has not passes; and the memory controller transmits a first command to the semiconductor memory after the first write operation is terminated, and the sequencer performs a second write operation for the write data based on the first command;
the sequencer performs the second write operation without receiving the write data after the first write operation is terminated; and
the memory controller further instructs the semiconductor memory to perform a read operation between the first write operation and the second write operation.

* * * * *